US012300528B2

(12) United States Patent
Caveney et al.

(10) Patent No.: US 12,300,528 B2
(45) Date of Patent: May 13, 2025

(54) SUBSTRATE TRANSPORT APPARATUS

(71) Applicant: Brooks Automation US, LLC, Chelmsford, MA (US)

(72) Inventors: Robert T. Caveney, Windham, NH (US); Ulysses Gilchrist, Reading, MA (US); Alexander Krupyshev, Chelmsford, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 18/434,329

(22) Filed: Feb. 6, 2024

(65) Prior Publication Data
US 2024/0178032 A1 May 30, 2024

Related U.S. Application Data

(60) Continuation of application No. 18/172,128, filed on Feb. 21, 2023, now Pat. No. 11,894,252, which is a
(Continued)

(51) Int. Cl.
*H01L 21/677* (2006.01)
*B25J 9/04* (2006.01)
*B25J 11/00* (2006.01)

(52) U.S. Cl.
CPC .. *H01L 21/67742* (2013.01); *H01L 21/67745* (2013.01); *H01L 21/67748* (2013.01);
(Continued)

(58) Field of Classification Search
CPC ............... B25J 9/041; B25J 11/0095; B65G 2201/0297; H01L 21/67742; H01L 21/67745; H01L 21/67748
See application file for complete search history.

(56) References Cited

U.S. PATENT DOCUMENTS 5,151,008 A 9/1992 Ishida et al.
5,765,444 A 6/1998 Bacchi et al.
(Continued)

FOREIGN PATENT DOCUMENTS

JP 2003203963 7/2003
JP 2006062046 3/2006
(Continued)

OTHER PUBLICATIONS

International Search Report, International Application No. PCT/US2014/070349, dated Mar. 27, 2015.

*Primary Examiner* — Saul Rodriguez
*Assistant Examiner* — Brendan P Tighe
(74) *Attorney, Agent, or Firm* — Perman & Green, LLP

(57) ABSTRACT

A transfer apparatus including a frame, multiple arms connected to the frame, each arm having an end effector and an independent drive axis for extension and retraction of the respective arm with respect to other ones of the multiple arms, a linear rail defining a degree of freedom for the independent drive axis for extension and retraction of at least one arm, and a common drive axis shared by each arm and configured to pivot the multiple arms about a common pivot axis, wherein at least one of the multiple arms having another drive axis defining an independent degree of freedom with respect to other ones of the multiple arms.

18 Claims, 43 Drawing Sheets

Related U.S. Application Data continuation of application No. 16/197,107, filed on Nov. 20, 2018, now Pat. No. 11,587,813, which is a division of application No. 14/568,742, filed on Dec. 12, 2014, now Pat. No. 10,134,621.

(60) Provisional application No. 61/917,056, filed on Dec. 17, 2013.

(52) U.S. Cl.
CPC ............ *B25J 9/041* (2013.01); *B25J 11/0095* (2013.01); *B65G 2201/0297* (2013.01)

(56) References Cited

U.S. PATENT DOCUMENTS

| | | | |
|---|---|---|---|
| 5,899,658 | A | 5/1999 | Hofmeister |
| 6,326,755 | B1 * | 12/2001 | Babbs ............... H01L 21/67766 |
| | | | 901/45 |
| 6,779,651 | B1 | 8/2004 | Linglet et al. |
| 7,955,043 | B2 | 6/2011 | Nakao |
| 8,961,099 | B2 | 2/2015 | Blank et al. |
| 9,623,555 | B2 | 4/2017 | Krupyshev et al. |
| 10,903,104 | B2 | 1/2021 | Pietrantonio et al. |
| 2003/0108415 | A1 | 6/2003 | Hosek et al. |
| 2004/0199287 | A1 | 10/2004 | Hosek et al. |
| 2005/0005847 | A1 | 1/2005 | Hiroki |
| 2006/0047363 | A1 | 3/2006 | Farrelly et al. |
| 2006/0099063 | A1 | 5/2006 | Pietrantonio et al. |
| 2006/0285945 | A1 | 12/2006 | Hofmeister et al. |
| 2007/0020081 | A1 | 1/2007 | Gilchrist et al. |
| 2007/0286710 | A1 | 12/2007 | Van Der Meulen et al. |
| 2008/0124197 | A1 | 5/2008 | Van Der Meulen et al. |
| 2008/0232934 | A1 | 9/2008 | Price et al. |
| 2008/0260499 | A1 | 10/2008 | Van Der Meulen |
| 2008/0260500 | A1 | 10/2008 | Meulen |
| 2008/0298945 | A1 | 12/2008 | Cox et al. |
| 2010/0178147 | A1 | 7/2010 | Kremerman et al. |
| 2012/0141235 | A1 | 6/2012 | Krupyshev et al. |
| 2013/0039726 | A1 * | 2/2013 | Brodine ............ H01L 21/67742 |
| | | | 414/744.5 |
| 2013/0071218 | A1 | 3/2013 | Hosek et al. |
| 2018/0104831 | A1 | 4/2018 | Hosek et al. |

FOREIGN PATENT DOCUMENTS

| | | |
|---|---|---|
| JP | 2008502498 | 1/2008 |
| JP | 2011101912 | 5/2011 |
| JP | 2013197164 | 9/2013 |
| JP | 2013544034 | 12/2013 |
| KR | 20080111036 | 12/2008 |
| KR | 20130083857 | 7/2013 |
| KR | 101308517 | 9/2013 |
| WO | 2013040401 | 3/2013 |
| WO | 2013154863 | 10/2013 |

* cited by examiner

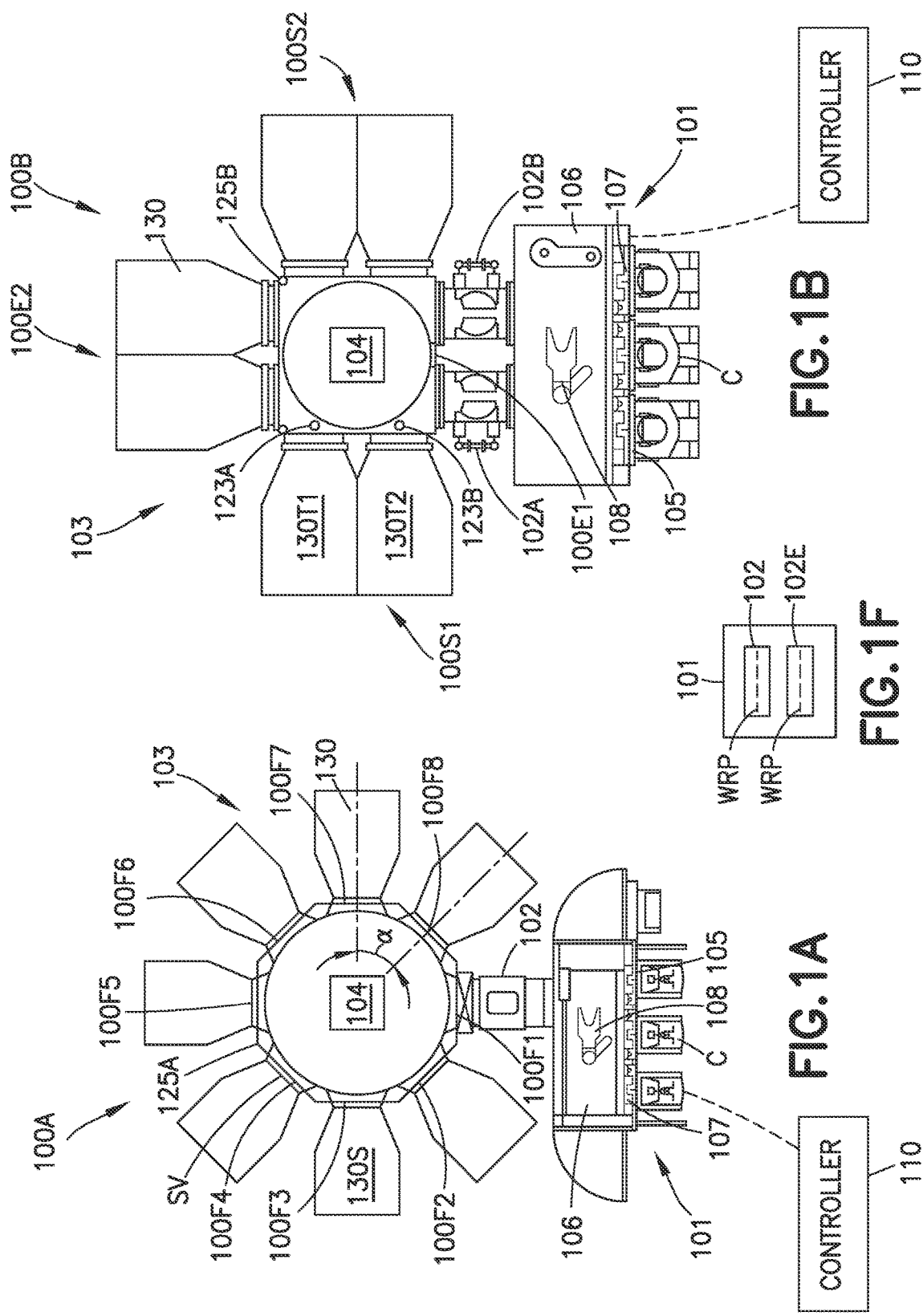

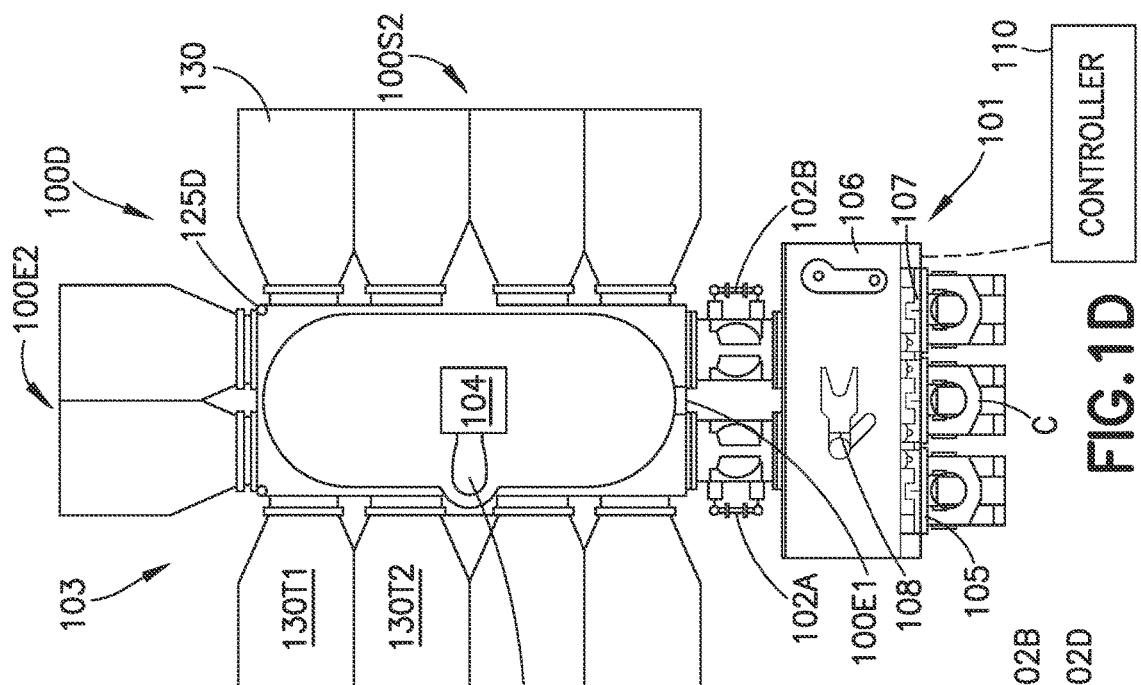
FIG. 1D
FIG. 1E
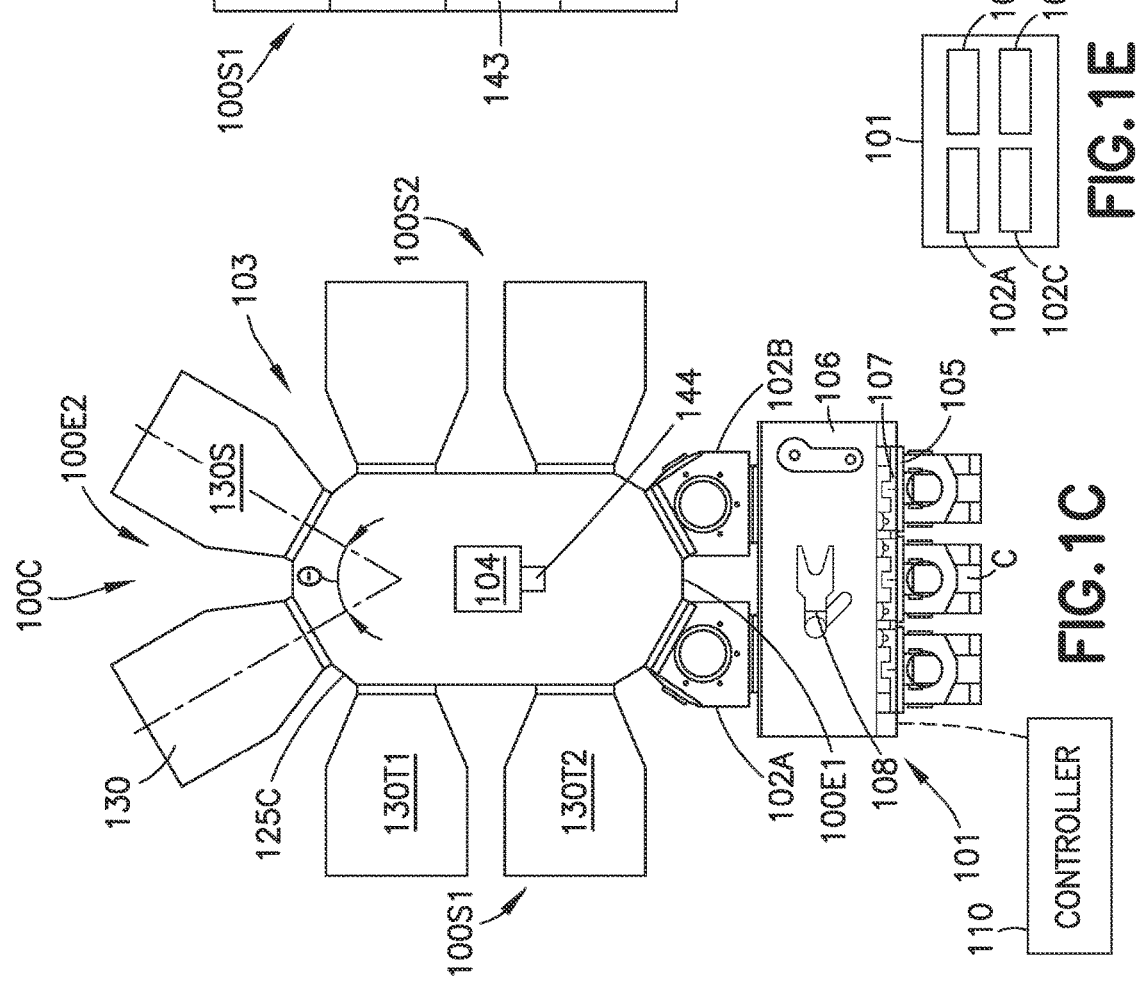
FIG. 1C

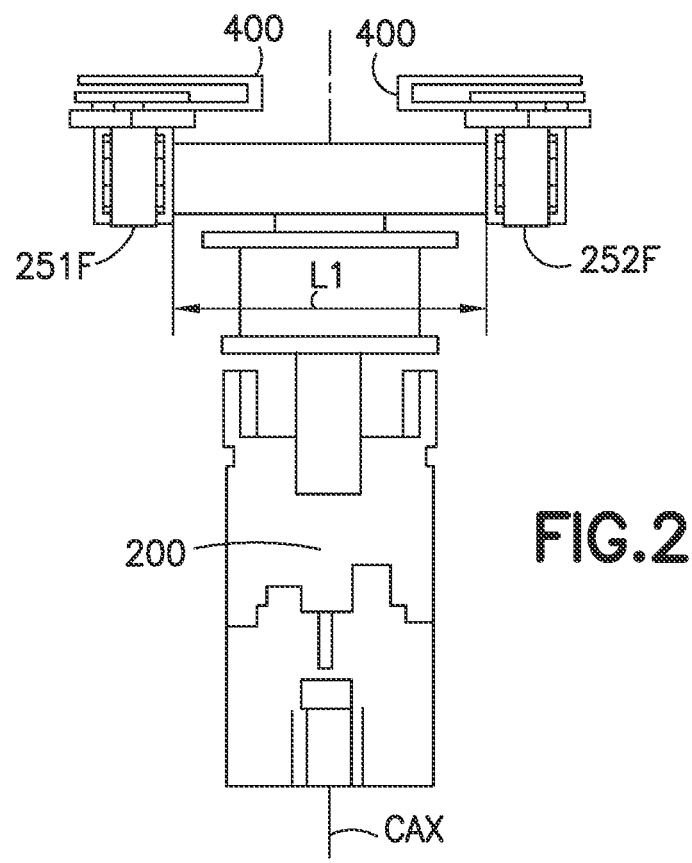
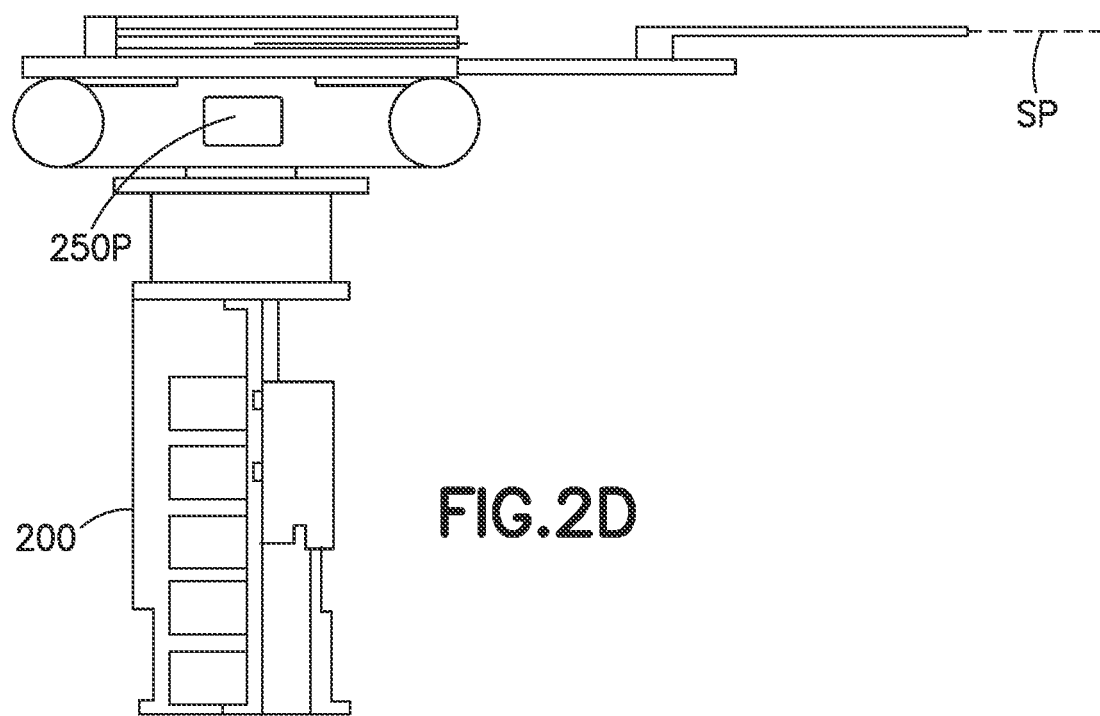

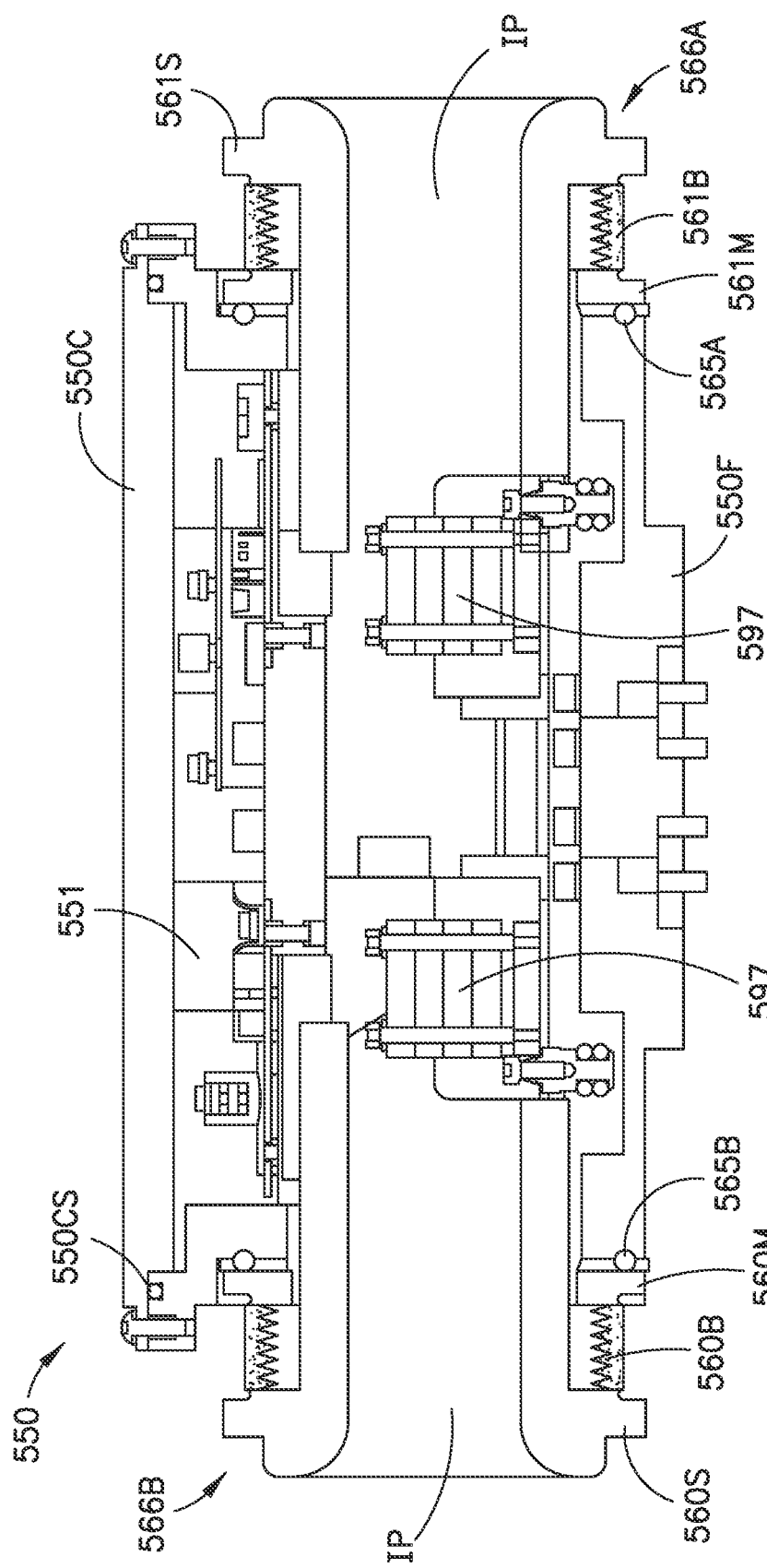

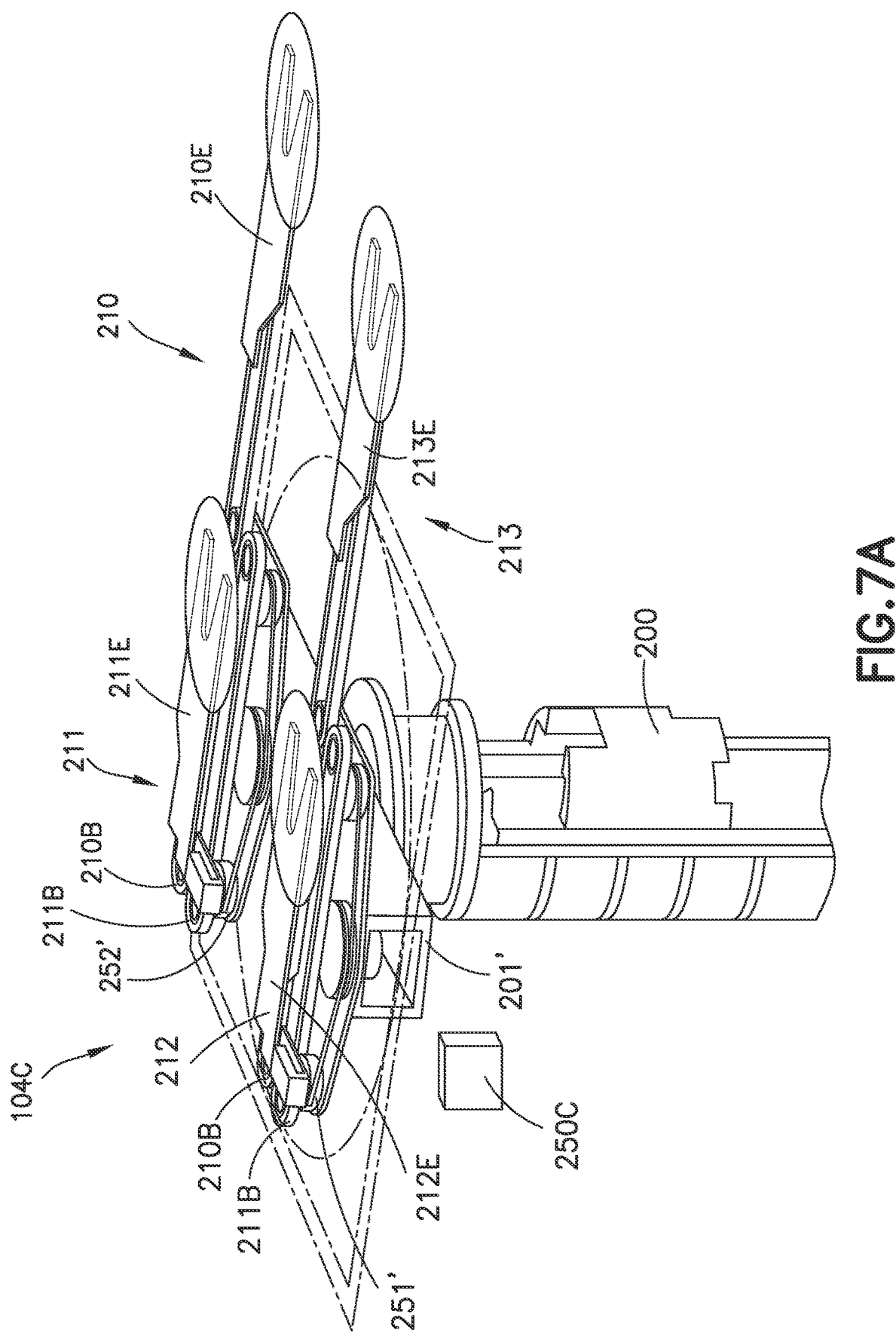

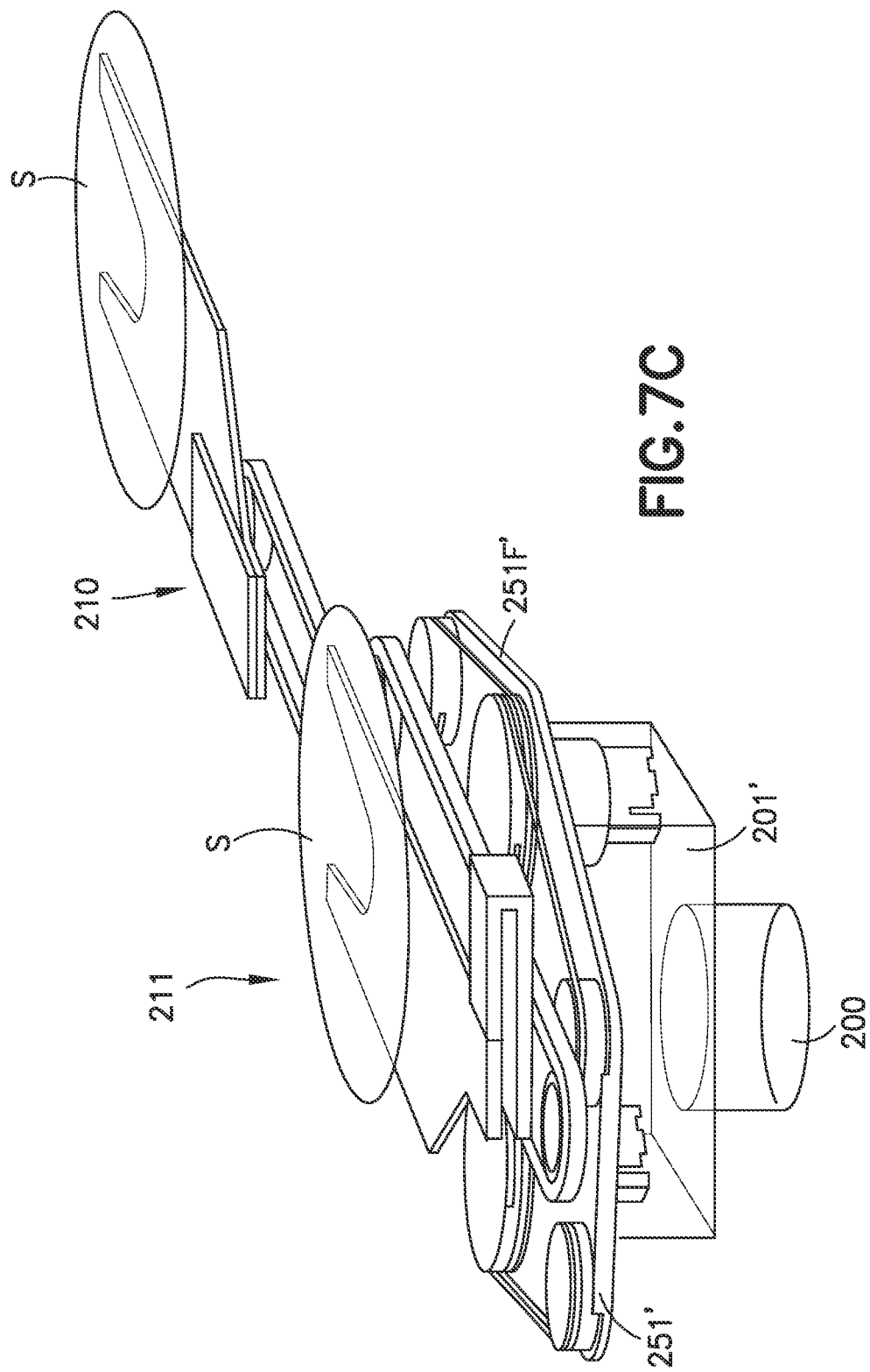

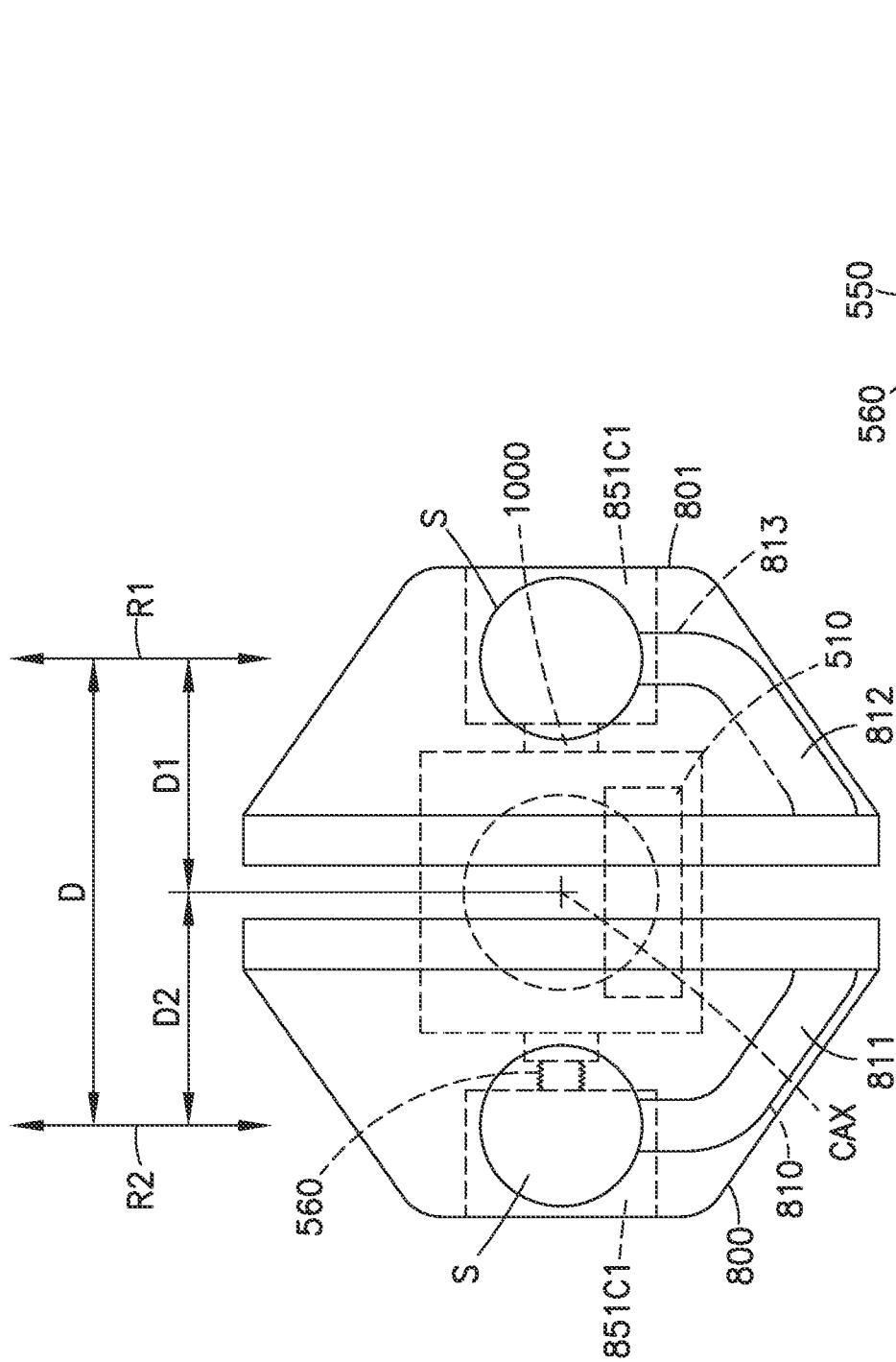
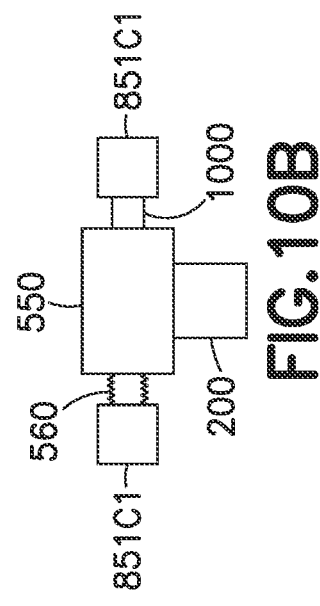
FIG. 10A
FIG. 10B

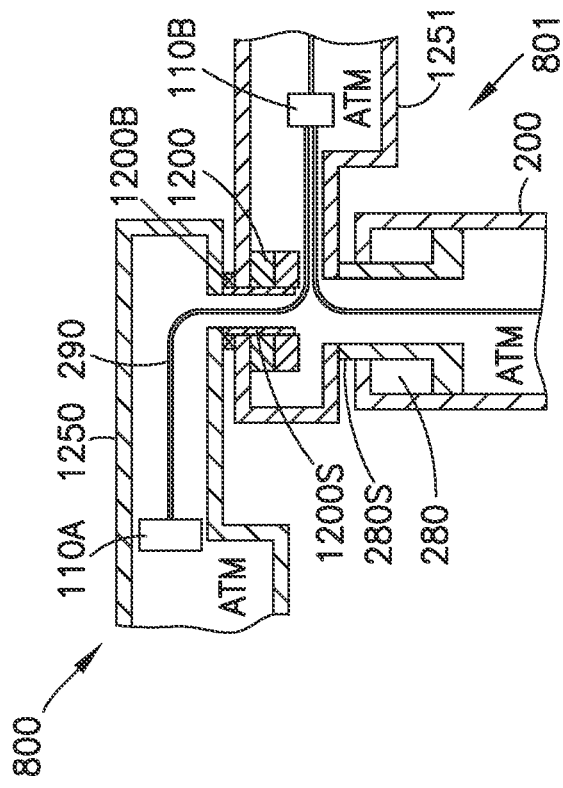
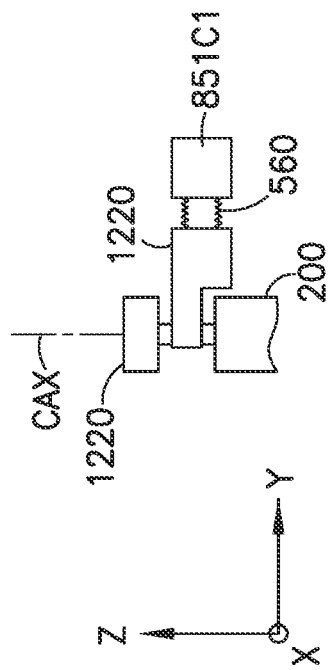
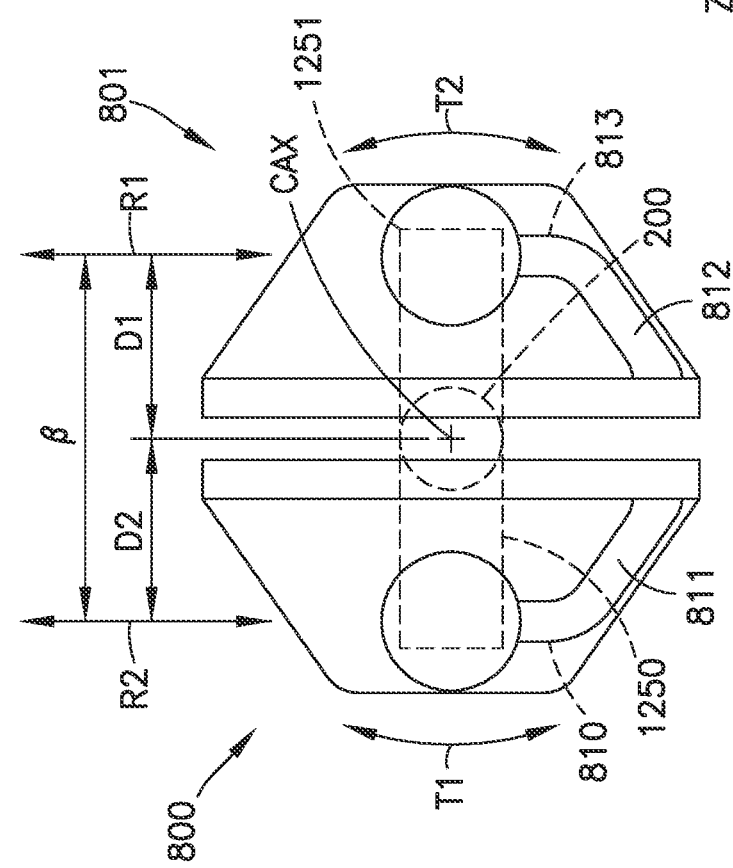
FIG. 12A
FIG. 12B
FIG. 12C

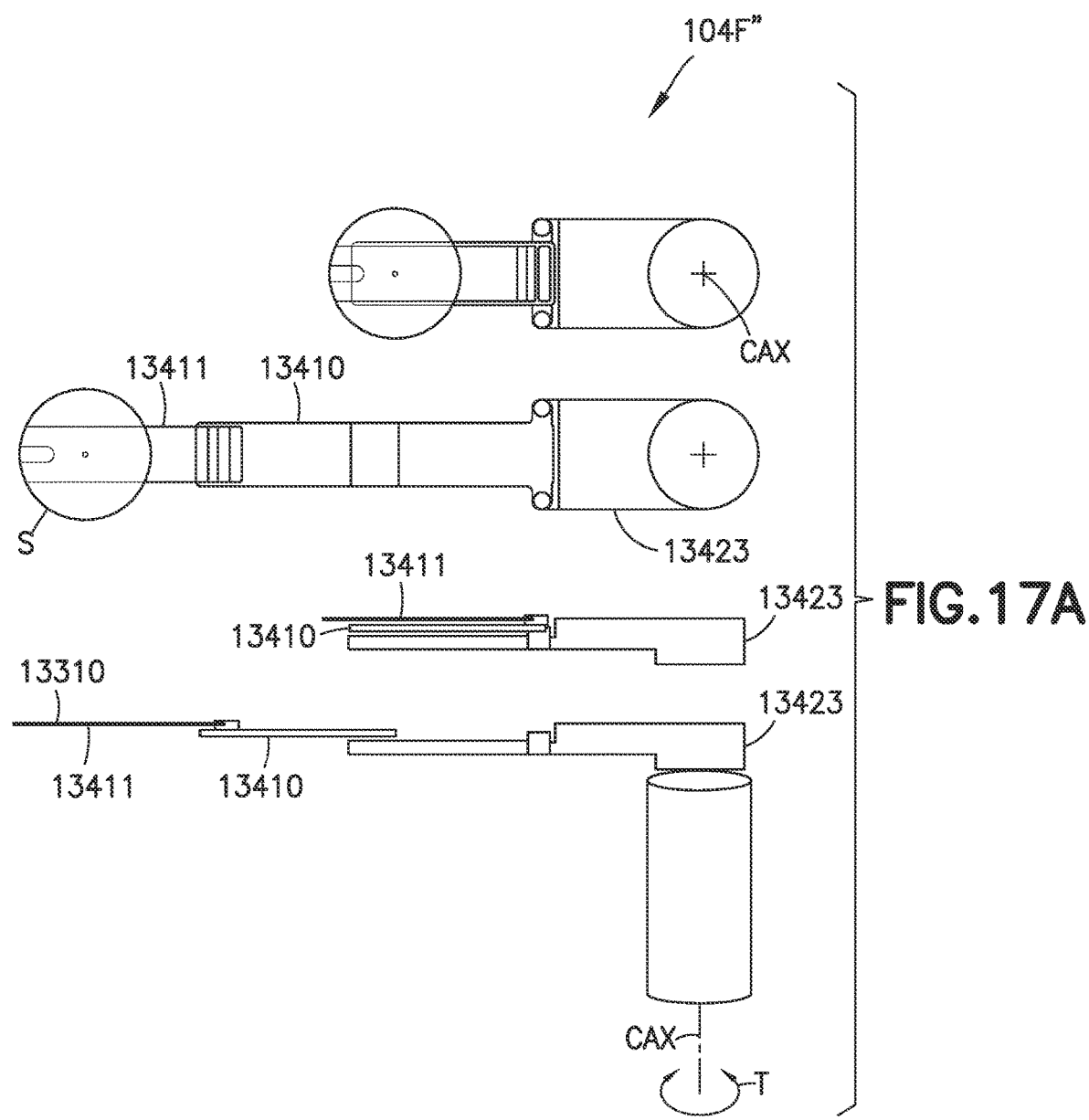

SUBSTRATE TRANSPORT APPARATUS

The present application is a Continuation Application of U.S. patent application Ser. No. 18/172,128, filed Feb. 21, 2023, now U.S. Pat. No. 11,894,252, issued on Feb. 6, 2024, which is a Continuation Application of U.S. patent application Ser. No. 16/197,107, filed Nov. 20, 2018, now U.S. Pat. No. 11,587,813, issued on Feb. 21, 2023, which is a divisional of application Ser. No. 14/568,742, filed on Dec. 12, 2014, now U.S. Pat. No. 10,134,621, issued on Nov. 20, 2018, which application claims the benefit of Provisional Patent Application No. 61/917,056 filed on Dec. 17, 2013 the disclosure of which is incorporated herein by reference in its entirety.

BACKGROUND

1. Field

The aspects of the disclosed embodiment generally relate to robotic systems and, more particularly, to robotic transport apparatus.

2. Brief Description of Related Developments

In, for example, the semiconductor manufacturing industry workpieces or semiconductor substrates may be processed in linear tool system and/or cluster tool system that have side-by-side substrate holding stations. Generally, in these systems having side-by-side substrate holding stations semiconductor manufacturers request independent radial robots capable of transferring the substrates to and from the side-by-side substrate holding stations at substantially the same time or independently. Generally this has been done by providing two transfer arms having spacing between the transfer arms that is substantially the same as the spacing between the side-by-side substrate holding stations. These transfer arms may be mounted on a boom arm or a linear slide. These transfer arms may also employ linear drives for extending and retracting the arms to and from the substrate holding stations.

It would be advantageous to provide a single robot configured with two side-by-side independent arms, each arm being configured to operate on a common axis of rotation while having independent rotary motor actuation along a respective radial axis. It would also be advantageous to provide a single robot configured with two independent arms, each arm being configured to operate on a common axis of rotation while having independent rotary motor actuation along a common radial axis. It would also be advantageous to provide each of the side-by-side independent arms with movement in a direction that is substantially normal to movement of the side-by-side independent arms along the radial axis to effect the ability to correct for system station errors while also effecting the ability to correct wafer placement using on-the-fly technology without using a theta axis of the transfer robot.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of substrate processing apparatus in accordance with aspects of the disclosed embodiment;

FIGS. 1E and 1F are schematic illustrations of portions of the substrate processing apparatus of FIGS. 1A-1D in accordance with aspects of the disclosed embodiment;

FIGS. 2A-2D are schematic illustrations of a substrate transport apparatus in accordance with aspects of the disclosed embodiment;

FIGS. 5D and 5E are schematic illustrations of a portion of the substrate transport apparatus illustrated in FIGS. 5A-5C in accordance with aspects of the disclosed embodiment;

FIGS. 7A-7B are schematic illustrations of a substrate transport apparatus in accordance with aspects of the disclosed embodiment;

FIG. 7C is a schematic illustration of a substrate transport apparatus in accordance with aspects of the disclosed embodiment;

FIGS. 10A-10B are schematic illustrations of a substrate transport apparatus in accordance with aspects of the disclosed embodiment;

FIGS. 12A-12C are schematic illustrations of a substrate transport apparatus in accordance with aspects of the disclosed embodiment;

FIGS. 17A-17C are schematic illustrations of a substrate transport apparatus in accordance with aspects of the disclosed embodiment;

DETAILED DESCRIPTION

Figure 2A:
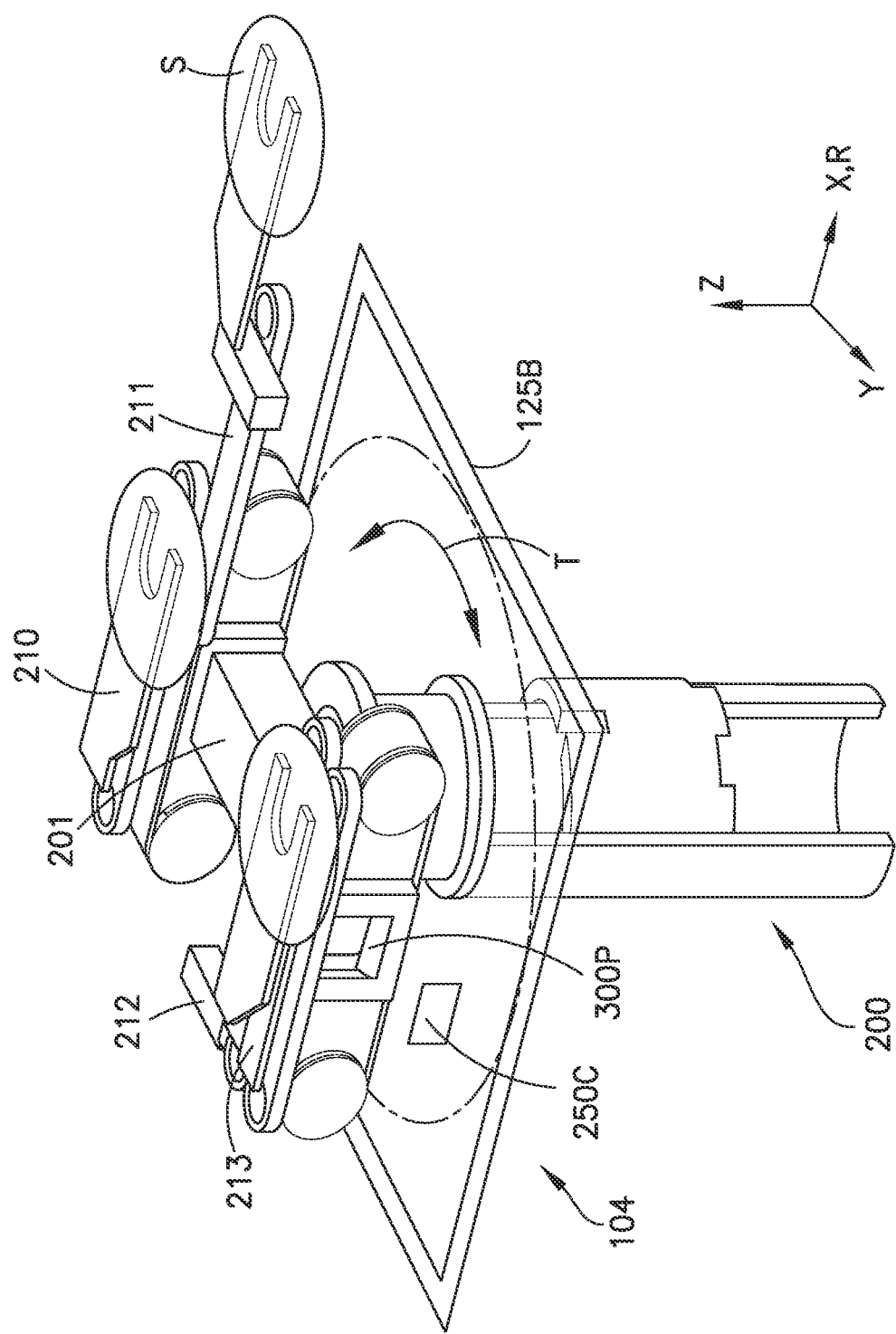

FIGS. 1A-1D are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

The processing apparatus 100A, 100B, 100C, 100D, such as for example a semiconductor tool station, is shown in accordance with an aspect of the disclosed embodiment. Although a semiconductor tool station is shown in the drawings, the aspects of the disclosed embodiment described herein can be applied to any tool station or application employing robotic manipulators. In one aspect the processing apparatus 100A, 100B, 100C, 100D are shown as having cluster tool arrangements (e.g. having substrate holding stations connected to a central chamber) while in other aspects the processing apparatus may be a linearly arranged tool, however the aspects of the disclosed embodiment may be applied to any suitable tool station. The apparatus 100A, 100B, 100C, 100D generally include an atmospheric front end 101, at least one vacuum load lock 102, 102A, 102B and a vacuum back end 103. The at least one vacuum load lock 102, 102A, 102B may be coupled to any suitable port(s) or opening(s) of the front end 101 and/or back end 103 in any suitable arrangement. For example, in one aspect the one or more load locks 102, 102A, 102B may be arranged in a common horizontal plane in a side by side arrangement as can be seen in FIGS. 1B-1C. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 100S1, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B may be located between and connected to the mini-environment 106 and the back end 103. In other aspects the load ports 105 may be coupled substantially directly to the at least one load lock 102, 102A, 102B or the transport chamber 125A, 125B, 125C, 125D where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed. The at least one load lock 102, 102A, 102B generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B coupled to the transport chamber 125A, 125B, 125C, 125D. The at least one load lock 102, 102A, 102B (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, one or more processing station(s) 130 and any suitable number of transfer unit modules 104 that includes one or more transfer robots which may include one or more aspects of the disclosed embodiments described herein. The transport chamber 125A, 125B, 125C, 125D may have any suitable shape and size that, for example, complies with SEMI standard E72 guidelines. The transfer unit module(s) 104 and the one or more transfer robot will be described below and may be located at least partly within the transport chamber 125A, 125B, 125C, 125D to transport substrates between the load lock 102, 102A, 102B (or between a cassette C located at a load port) and the various processing stations 130. In one aspect the transfer unit module 104 may be removable from the transport chamber 125A, 125B, 125C, 125D as modular unit such that the transfer unit module 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D in any suitable manner, such as through slot valves SV, to allow substrates to be passed from the transport chamber 125 to the processing stations 130 and vice versa. The slot valves SV of the transport chamber 125 may be arranged to allow for the connection of twin (e.g. more than one substrate processing chamber located within a common housing) or side-by-side process stations 130T1, 130T2, single process stations 130S and/or stacked process modules/load locks (FIGS. 1E and 1F).

It is noted that the transfer of substrates to and from the processing station 130, load locks 102, 102A, 102B (or cassette C) coupled to the transfer chamber 125A, 125B, 125C, 125D may occur when one or more arms of the transfer unit module 104 are aligned with a predetermined processing station 130. In accordance with aspects of the disclosed embodiment one or more substrates may be transferred to a respective predetermined processing station 130 individually or substantially simultaneously (e.g. such as when substrates are picked/placed from side-by-side or tandem processing stations as shown in FIGS. 1B, 1C and 1D. In one aspect the transfer unit module 104 may be mounted on a boom arm 143 (see e.g. FIG. 1D) or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 2B:
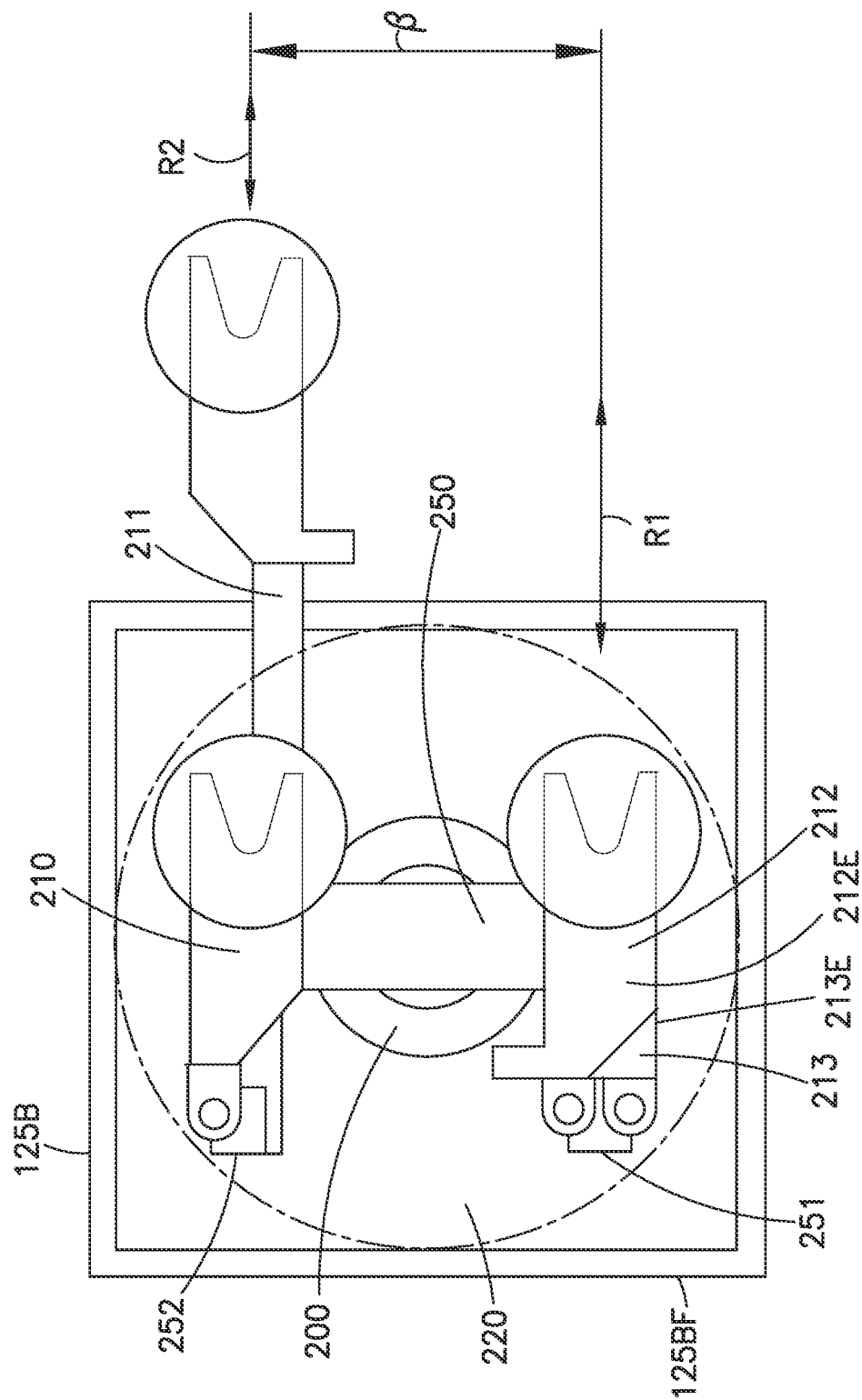
Figure 2E:
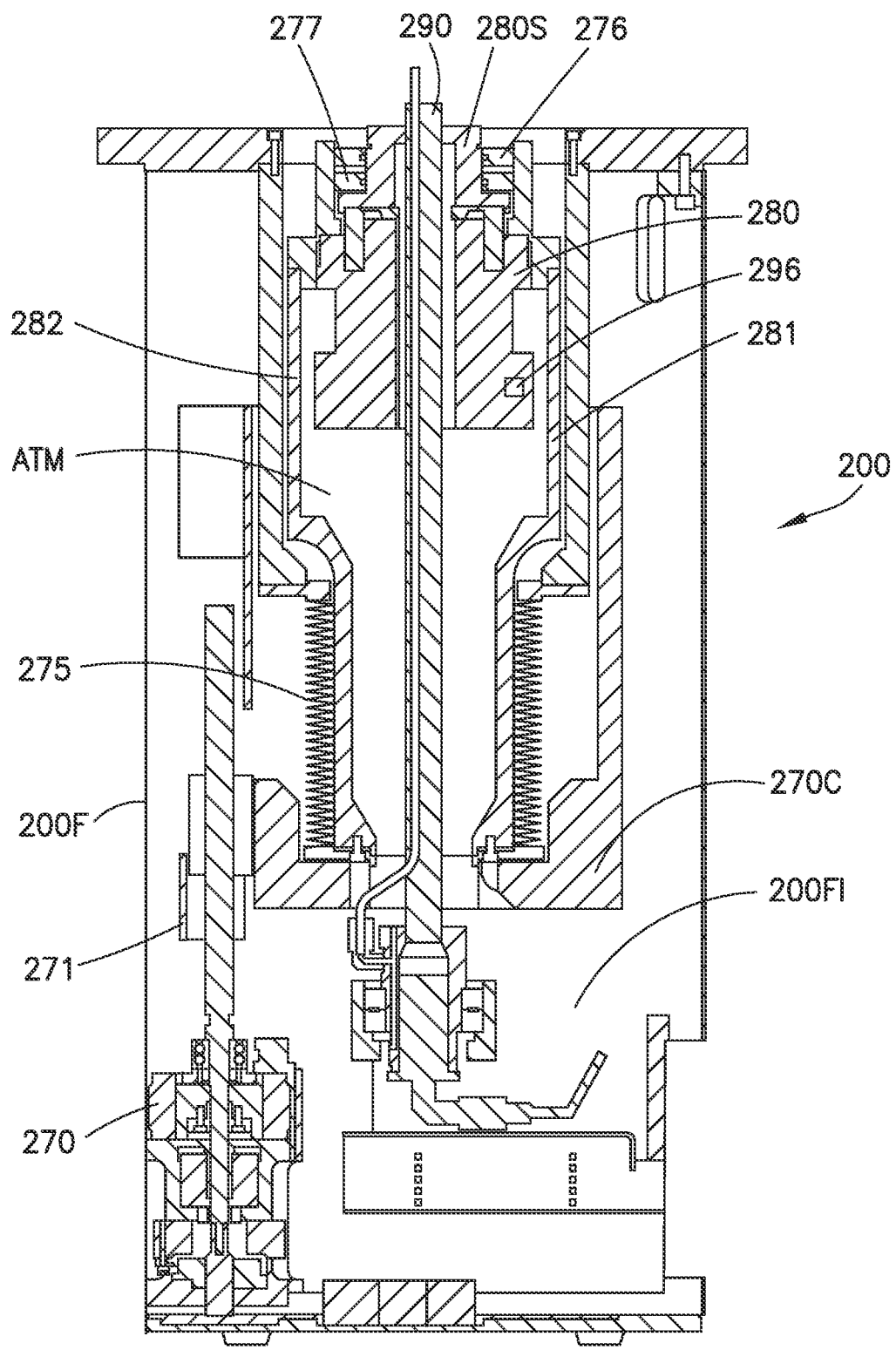
FIG. 2E is a schematic illustration of a drive section in accordance with aspects of the disclosed embodiment.

Referring now to FIGS. 2A-2D, in one aspect the transfer unit module 104 includes at least one drive section 200, 201 and at least one transfer arm 210, 211, 212, 213. The at least one drive section 200, 201 may include a common drive section 200 that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the at least one transfer arm 210, 211, 212, 213 along the Z axis. The Z axis drive is illustrated in FIG. 2E as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of harmonic drive motors 280. In one aspect the rotational drive section 282 shown in FIG. 2E includes one harmonic drive motor 280 for driving shaft 280S however, in other aspects the drive section may include any suitable number of harmonic drive motors corresponding to, for example, any suitable number of drive shafts in the coaxial drive system. The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R movements of the transfer unit module 104. It is noted that the ferrofluidic seal 276, 277 may include several parts that form a substantially concentric coaxial seal as will be described below. In this example the rotational drive section 282 includes a housing 281 that houses the drive motor 280 in a manner substantially similar to that described in U.S. Pat. Nos. 6,845,250; 5,899,658; 5,813,823; and 5,720,590, the disclosures of which are incorporated by reference herein in their entireties. The ferrofluidic seal 276, 277 can be toleranced to seal each drive shaft 280S in the drive shaft assembly. It is noted that drive shaft 280S may also have a hollow construction (e.g. has a hole running longitudinally along a center of the drive shaft) to allow for the passage of wires 290 or any other suitable items through the drive assembly for connection to, for example, another drive section (e.g. such as drive section 201) and/or the at least one transfer arm 210, 211, 212, 213, mounted to the drive 200.

In one aspect the housing 281 may be mounted to a carriage 270C which is coupled to the Z axis drive 270 such that the Z axis drive moves the carriage (and the housing 281 located thereon) along the Z axis. As may be realized, to seal the controlled atmosphere in which the at least one transfer arm 210, 211, 212, 213 operates from an interior of the drive 200 (which may operate in an atmospheric pressure ATM environment) may include one or more of the ferrofluidic seal 276, 277 described above and a bellows seal 275. The bellows seal 275 may have one end coupled to the carriage 270C and another end coupled to any suitable portion of the frame 200FI so that the interior 200FI of the frame 200F is isolated from the controlled atmosphere in which the at least one transfer arm 210, 211, 212, 213 operates.

In this aspect the drive shaft 280S may be coupled to the drive section 201 for rotating the drive section 201 in the direction of arrow T about a common axis CAX that may be common to each of the at least one transfer arm 210, 211, 212, 213. Here the drive section 201 may include a base member 250 and at least one drive portion 251, 252. In this aspect there are two drive portions 251, 252 but in other aspects any suitable number of drive portions may be provided. The base member 250 includes a frame that forms an interior chamber 250P. Each drive portion 251, 252 also includes a frame 251F, 252F that forms an interior chamber 300P that is in sealed communication with the interior chamber 250P of the base member 250. As may be realized, each drive portion 251, 252 may include any suitable access opening that may be sealed by, for example, any suitable cover 250C. As can be seen in FIG. 2B the base member 250 may include a first and second ends such that a drive portion 251, 252 is sealingly coupled to a respective one of the ends. The drive portions may be arranged at any suitable angle β relative to one another so that an extension/retraction axis of the arm(s) mounted thereon are capable of extending through ports of the transfer chambers 125A, 125B, 125C, 125D in which the arm(s) are located. For example, in one aspect the angle β (which may correspond to an angle between the extension/retraction axes of the drive portions 251, 252) may be substantially the same as or equal to the angle α of the facets 100F1-100F8 of transfer chamber 125A (FIG. 1A). In other aspects the angle β may be about 0 so that the axes of extension/retraction of the drive portions (and the arm(s) mounted thereon) are substantially parallel to one another for extending through the side-by-side ports of, e.g., transfer chambers 125B (FIG. 1B), 125C (FIG. 1C) and 125D (FIG. 1D). In still other aspects the angle β may be adjustable (either manually or through automation, as will be described below) so that the axes of extension/retraction of the drive portion 251, 252 may have any suitable angle β relative to one another. For example, the angle β may be adjusted between an angle of 0 and θ for extending through ports of the transfer chamber 125C (FIG. 1C) and/or for automatic workpiece centering as will be described below. In yet other aspects the angle β and/or spacing between the drive portions may be fixed such that the arms of the transfer unit module 104 may extend through the ports of the transfer modules having angled facets through a rotation of the common drive axes CAX and independent extension or operation of each drive portion 251, 252. The base member 250 may have any suitable length L1 so that the axes of extension and retraction R1, R2 of each drive portion 251, 252 are a fixed distance apart where the fixed distance may correspond or otherwise match requirements (e.g. the distance between ports of a module in which the transfer unit module 104 is located) imposed by the system tool configuration.

Referring also to FIGS. 3A-3G drive portion 251, 252 will be described with respect to drive portion 251. It should be understood that drive portion 252 may be substantially similar to drive portion 251. As noted above, drive portion 251 includes a frame 251F that may be constructed of a first frame member 251F1 and a second frame member 251F2 that are sealingly coupled to each other in any suitable manner. In other aspects the frame may have any suitable configuration and be composed of any suitable number of frame members. The frame 251F may include an aperture or opening 251M configured for mounting the frame 251F to the base member 250 in any suitable manner so that an interior chamber 300P of the drive portion 251 is in sealed communication with an interior chamber 250P of the base member 250 so that a common atmospheric environment is shared between the interior chambers 250P, 300P and the interior of housing 281 of drive section 200. In this aspect the drive portion 251 may be configured to support and drive two transfer arms 212, 213 but in other aspects the drive portion 251 may be configured to support and drive any suitable number of transfer arms. The drive portion 251 may include a first linear rail or slide 310A, 310B (generally linear rail or slide 310) and a second linear rail or slide 311A, 311B (generally linear rail or slide 311) configured to define a degree of freedom for the independent drive axis that extends and retracts each of the respective transfer arms 212, 213. In this aspect the drive portion includes a first drive motor 320 and a second drive motor 321 for driving a respective arm 212, 213 through, for example, a band and pulley drive transmission. While the motors are illustrated as rotary motors in other aspects any suitable motor(s) and/or suitable drive transmission(s) may be used such as, for example, a direct drive linear motor, linear piezo electric motors, linear inductance motors, linear synchronous motors, brushed or brushless linear motors, linear stepper motors, linear servo motors, reluctance motors, etc. Examples of suitable linear motors are described in, for example, U.S. patent application Ser. No. 13/286,186 entitled "Linear Vacuum Robot with Z Motion and Articulated Arm" filed on Oct. 31, 2011; Ser. No. 13/159,034 entitled "Substrate Processing Apparatus" filed on Jun. 13, 2011 and U.S. Pat. No. 7,901,539 entitled "Apparatus and Methods for Transporting and Processing Substrates" issued Mar. 8, 2011; U.S. Pat. No. 8,293,066 entitled "Apparatus and Methods for Transporting and Processing Substrates" issued Oct. 23, 2012; U.S. Pat. No. 8,419,341 entitled "Linear Vacuum Robot with Z Motion and Articulated Arm" issued Apr. 16, 2013; U.S. Pat. No. 7,575,406 entitled "Substrate Processing Apparatus" issued Aug. 18, 2009; and U.S. Pat. No. 7,959,395 entitled "Substrate Processing Apparatus" issued Jun. 14, 2011, the disclosures of which are incorporated herein by reference in their entireties.

The first and second drive motors 320, 321 may be harmonic drives substantially similar to drive motor 280 while in other aspects the drive motors 320, 321 may be any suitable drive motors. Each drive motor 320, 321 may have a respective seal 320S, 321S, such as a ferrofluidic seal for sealing an aperture in the frame 251 through which a drive shaft 370 of the motor 320, 321 extends for coupling, in any suitable manner, to a respective drive pulley 332B, 333A. The drive pulley 332B, 333A may be coupled to a respective driven pulley 332A, 333B in any suitable manner such as by one or more bands. For example, drive pulley 332B may be coupled to driven pulley 332A by bands 330A, 330B. Drive pulley 333A may be coupled to driven pulley 333B by bands 331A, 333B. The bands 330A, 330B, 331A, 331B may be any suitable bands such as, for example, those described in, for example, U.S. provisional patent application No. 61/869, 870 entitled "Substrate Transport Apparatus" and filed on Aug. 26, 2013 the disclosure of which is incorporated herein by reference in its entirety. As may be realized, the drive axes described herein may have any suitable encoders, such as encoders 371, 296, 371 for detecting a position of a respective drive motor and sending one or more signals to any suitable controller such as, for example, controller 110 for controlling the transfer unit module 104. As may also be realized, the sealed interior of the drive portions 251, 252 and base member 250 allow the drive motors 320, 321 of each drive portion 251, 252 to be located in an atmospheric environment separated or otherwise sealed from an environment in which the transfer arms 210-213 operate. The sealed interior of the drive portions 251, 252 and base member 250 also may allow for wire or hose routing from the drive section 200 to the drive section 201.

Referring to again to FIGS. 2A-2D and 4A-4B the transfer arms 210-213 will be described with respect to drive portion 252 in accordance with aspects of the disclosed embodiment. In this aspect the transfer arms 210-213 have a telescoping configuration but in other aspects the transfer arms 210-213 may have any suitable configuration. Also in this aspect each drive portion 251, 252 includes two telescoping arms 210-213 but in other aspects any suitable number of transfer arms may be provided on each drive portion 251, 252. In this aspect each transfer arm 210-213 includes a base member 210B, 211B and an end effector 210E, 211E movably coupled to a respective base member 210B, 211B. Each base member 210B, 211B may have an interior in which any suitable transmission may be disposed for driving the end effector along the axis of extension/retraction. The interior of the base members may be exposed to the environment in which the transfer arms operate but may include any suitable seals, such as labyrinth seals, for preventing any particles from entering the environment or contacting the workpieces transported within the environment. It is noted that each end effector described herein includes an end effector seating plane SP (FIG. 2D) in which a substrate is located when being held by the end effector. Base member 210B may be movably coupled to the drive portion 252 through the linear rails 310A, 310B of the so as to be movable relative to the drive portion 252. Base member 211B may be coupled to the drive portion 252 through the linear rails 311A, 311B so as to be movable relative to the drive portion 252. Each arm 210, 211 has a degree of freedom defined by the respective rails such that the degrees of freedom for each of the transfer arms 210 and 211 defined by the linear rails are parallel to one another (e.g. the transfer plane of the end effectors are located one above the other). As may be realized, transfer arms 212, 213 have similar parallel degrees of freedom. As may also be realized, the degree of freedom defined by the linear rails for arm 211 may be coplanar with the degree of freedom defined by the linear rails for transfer arm 212 (e.g. the end effectors of each transfer arm 211, 212 are located in the same plane) while the degree of freedom defined by the linear rails for arm 210 may be coplanar with the degree of freedom defined by the linear rails for transfer arm 213 (e.g. the end effectors of each transfer arm 210, 213 are located in the same plane).

The base members 210B, 211B may be disposed side-by-side on the drive portion 252 so that base member 210B is coupled to at least one of the bands 330A, 330B so that as the bands 330A, 330B are driven by the motor 320 the base member 210B moves with at least one of the bands 330A, 330B in the direction of extension/retraction R. Base member 211B is coupled to at least one of the bands 331A, 331B so that as the bands 331A, 331B are driven by the motor 321 the base member 211B moves with at least one of the bands 331A, 331B in the direction of extension/retraction R. In other aspects the base members may have any suitable spatial arrangement relative to each other.

Base member 210B may include a linear rail or slide 410A, 410B disposed at least partly within the interior of the base member to which the end effector 210E is movably mounted for relative rotation to the base member 210B and the drive portion 252. Pulleys 410, 411, 420, 421 may be rotatably mounted at the ends or at any other suitable location within the interior of a respective base member 210B, 211B. One or more bands (similar to those described above), a single continuous loop band/belt or any other suitable transmission member 412, 422 may couple respective ones of the pulleys 410, 411, 420, 421 to each other. In one aspect each transmission member 412, 422 may be grounded to frame 252F of the drive portion 252 so that relative movement between the base member 210B, 211B and the frame 252F drives a respective transmission member 412, 422. The end effector 211E may be coupled to the transmission member 412 so that as the base member 211B moves in the direction of arrow R the end effector also moves in the direction of arrow R relative to the base member 211B by any suitable drive ratio defined by, for example, the pulleys 410, 411. Similarly, the end effector 210E may be coupled to the transmission member 412 so that as the base member 210B moves in the direction of arrow R the end effector also moves in the direction of arrow R relative to the base member 210B by any suitable drive ratio defined by, for example, the pulleys 420, 421. As may be realized, a bridge member 400 may be provided on one of the end effectors, such as end effectors, 211E, 212E so that the end effector 211E, 212E can be positioned above the other end effector 210E, 213E of a respective drive portion 251, 252 while allowing the end effectors to pass over/under one another.

Figure 2F:
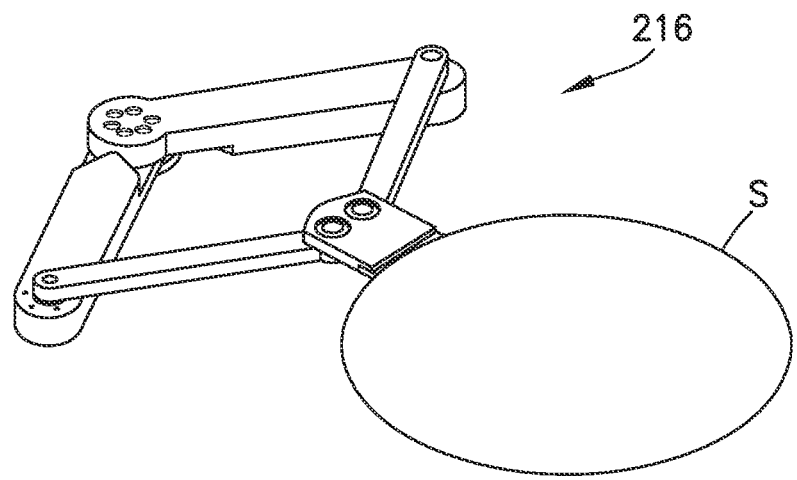
FIGS. 2F-2J are schematic illustrations of transport arms in accordance with aspects of the disclosed embodiment.
Figure 2G:
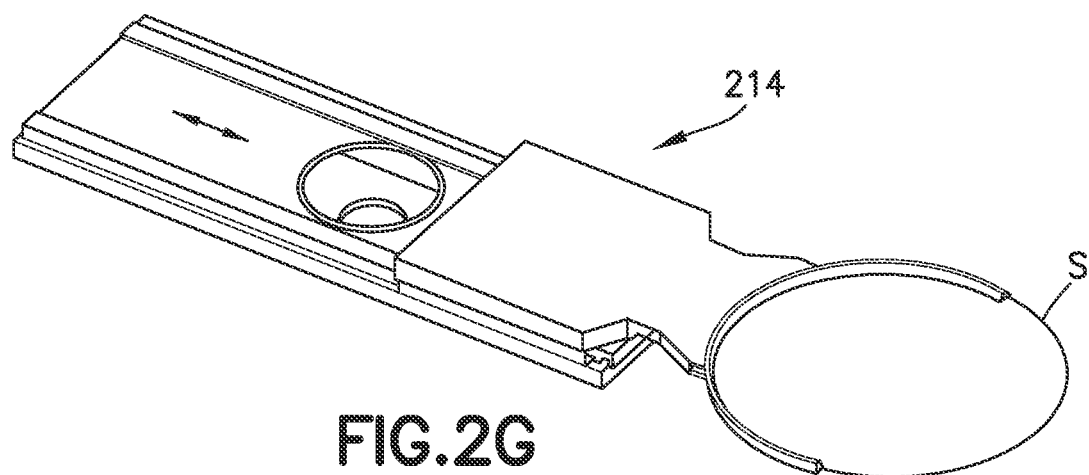
Figure 2H:
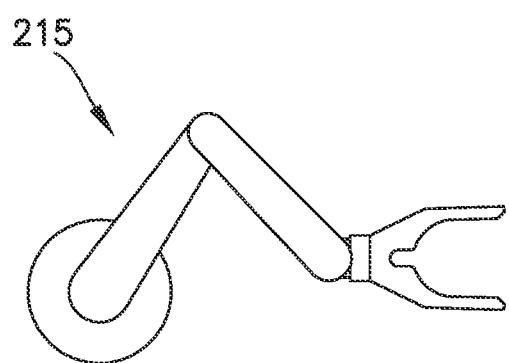
Figure 2I:
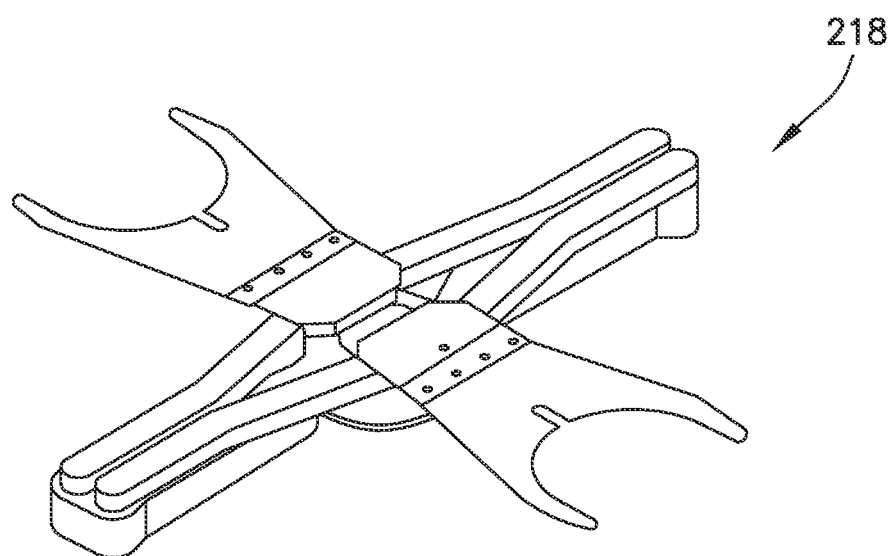
Figure 2J:
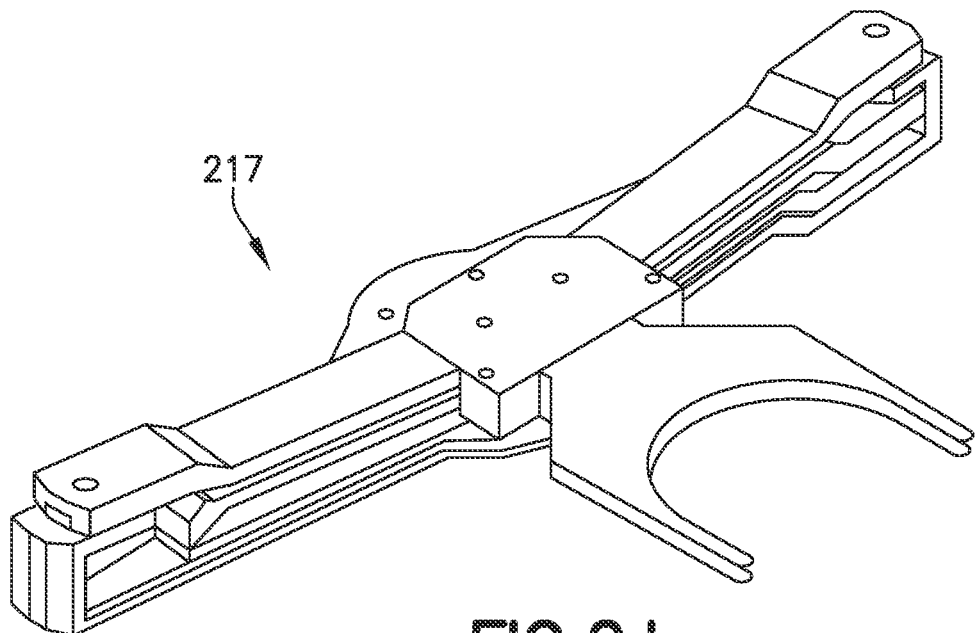
Figure 3A:
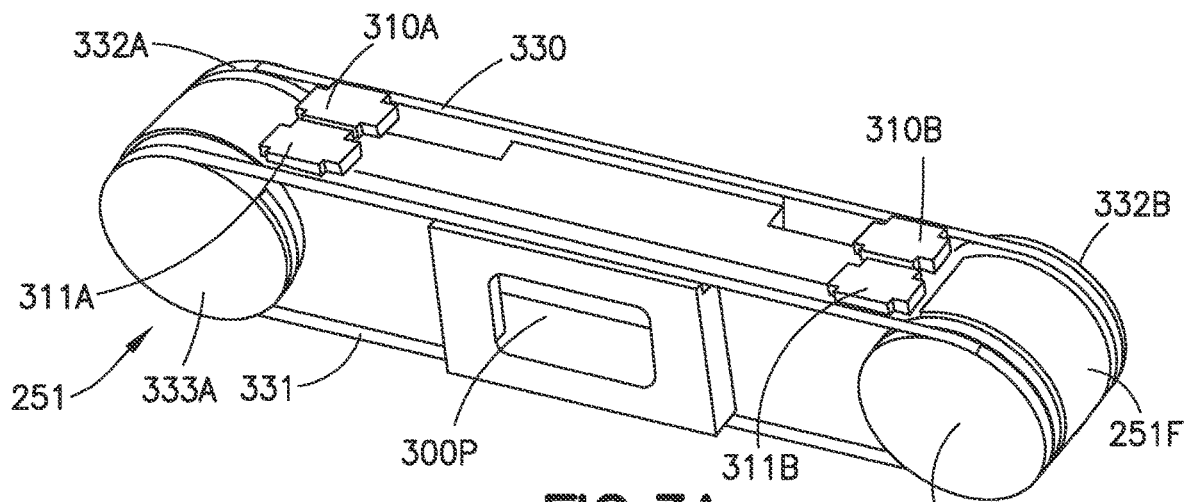
FIGS. 3A-3E are schematic illustrations of a portion of the substrate transport apparatus illustrated in FIGS. 2A-2D in accordance with aspects of the disclosed embodiment.
Figure 3B:
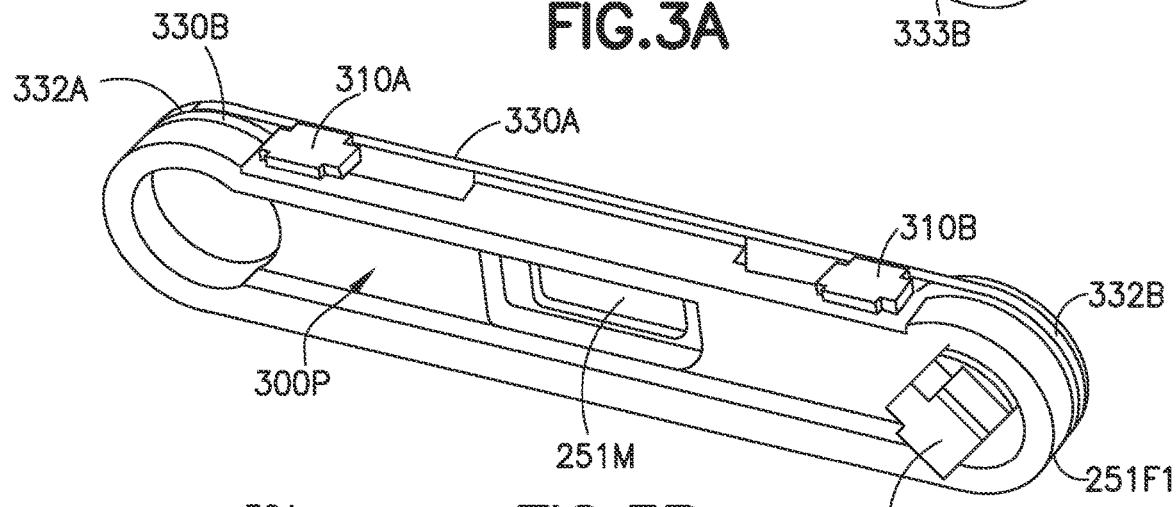
Figure 3C:
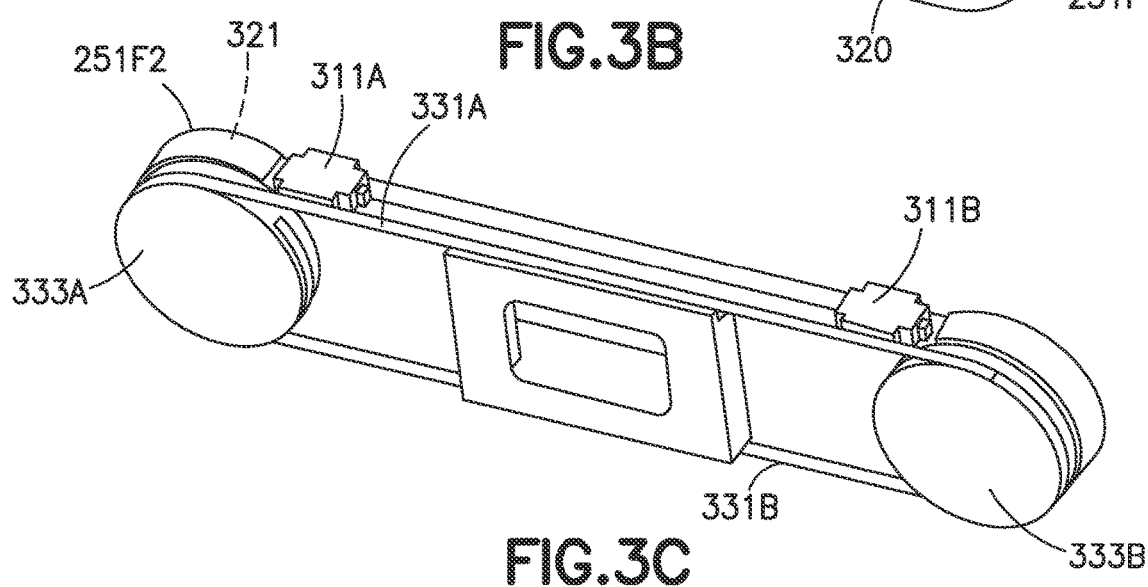
Figure 3D:
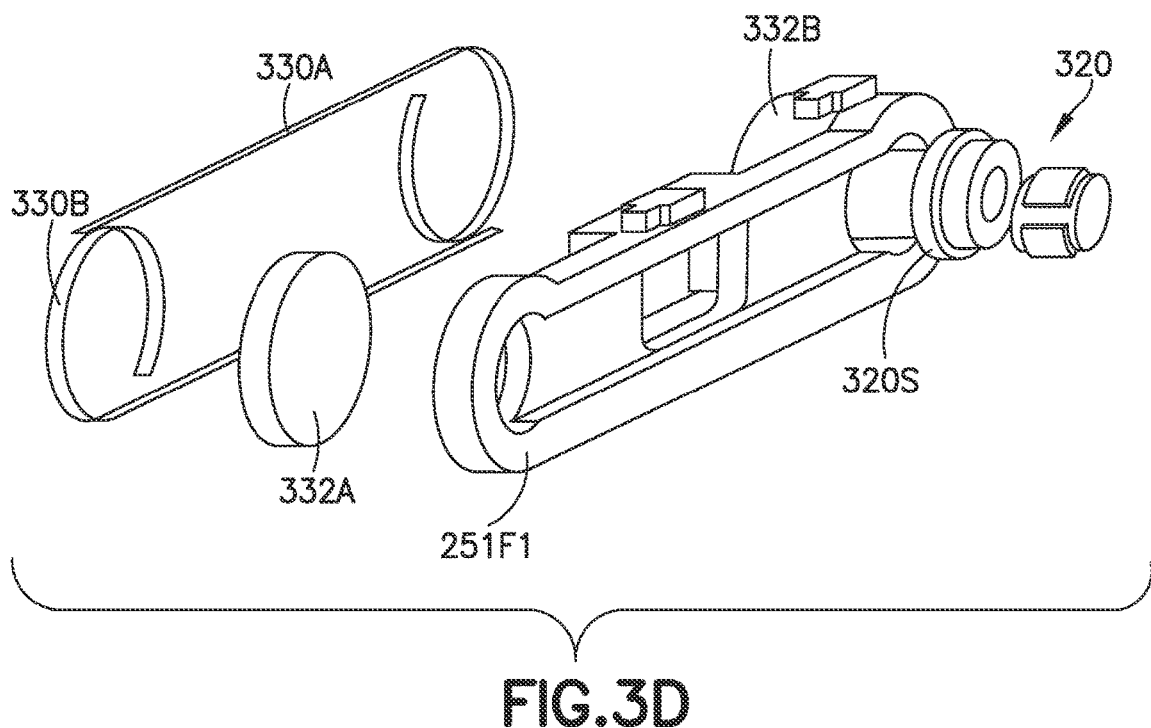
Figure 3E:
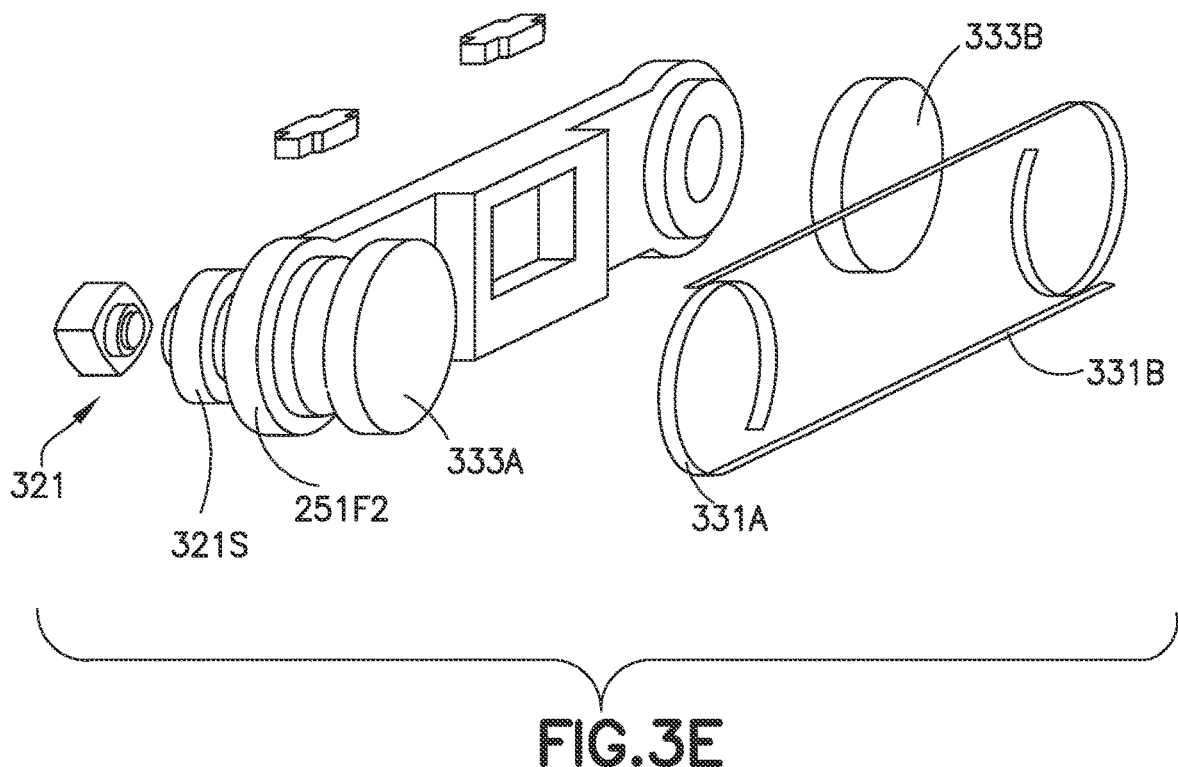
Figure 3G:
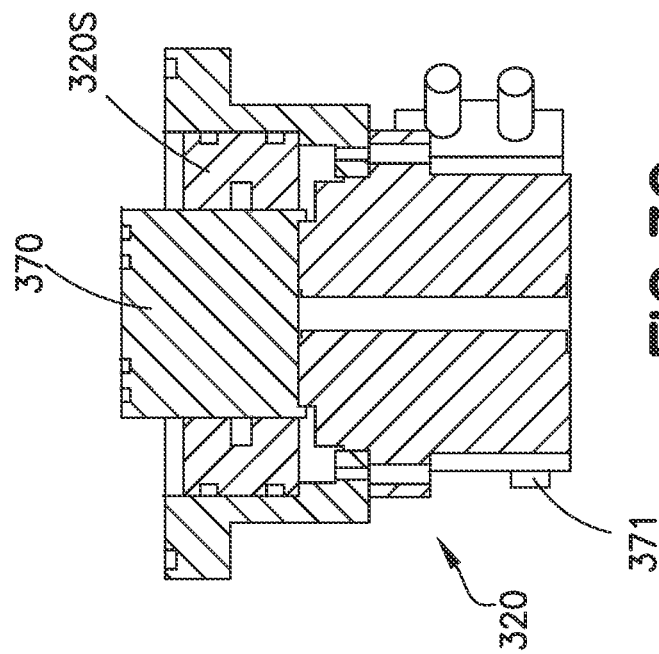
FIGS. 3F and 3G are schematic illustrations of a drive section in accordance with aspects of the disclosed embodiment.
Figure 3F:
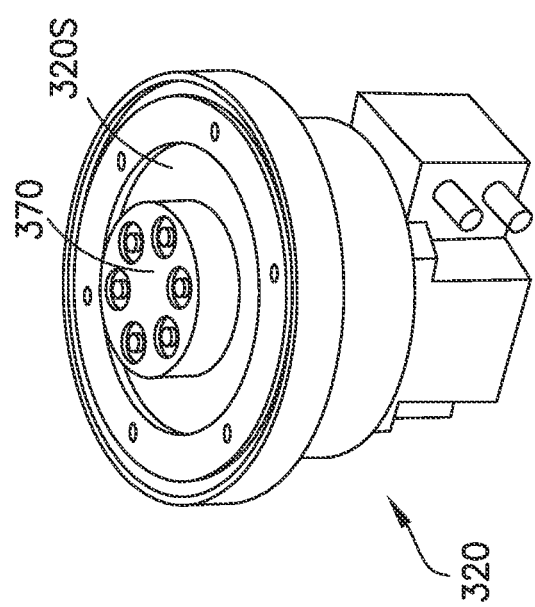
Figure 4A:
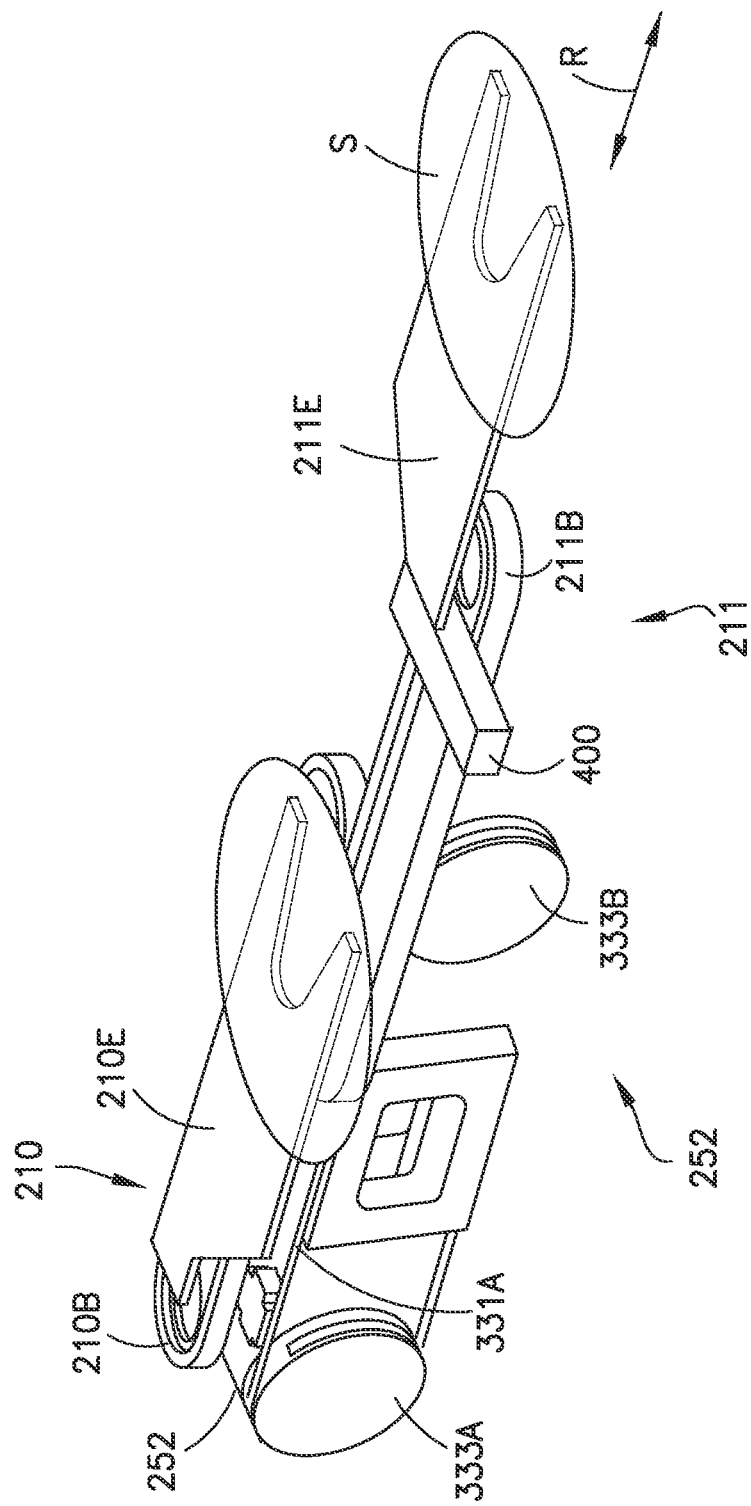
FIGS. 4A-4B are schematic illustrations of a portion of the substrate transport apparatus illustrated in FIGS. 2A-2D in accordance with aspects of the disclosed embodiment.
Figure 4B:
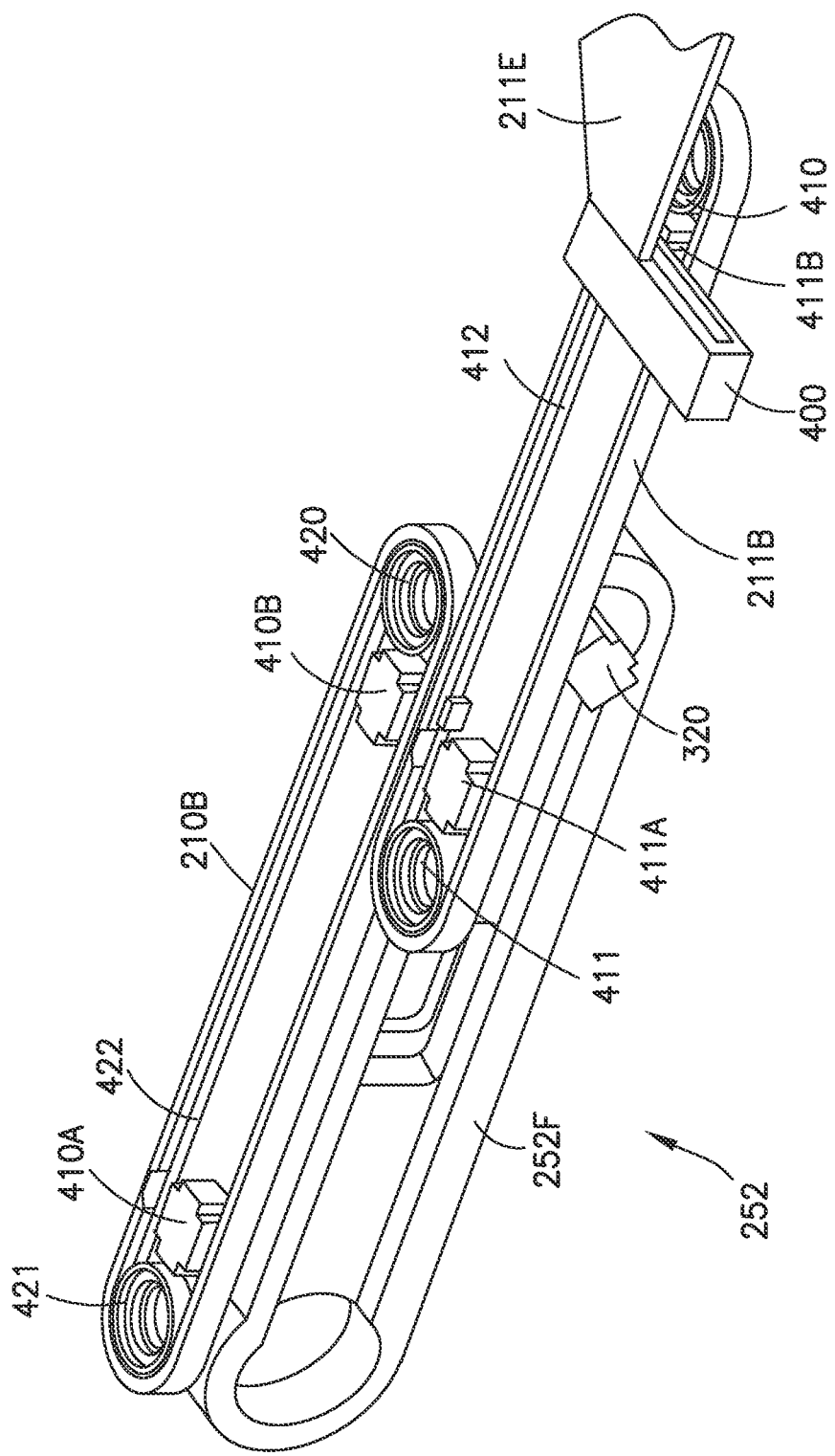
Figure 5A:
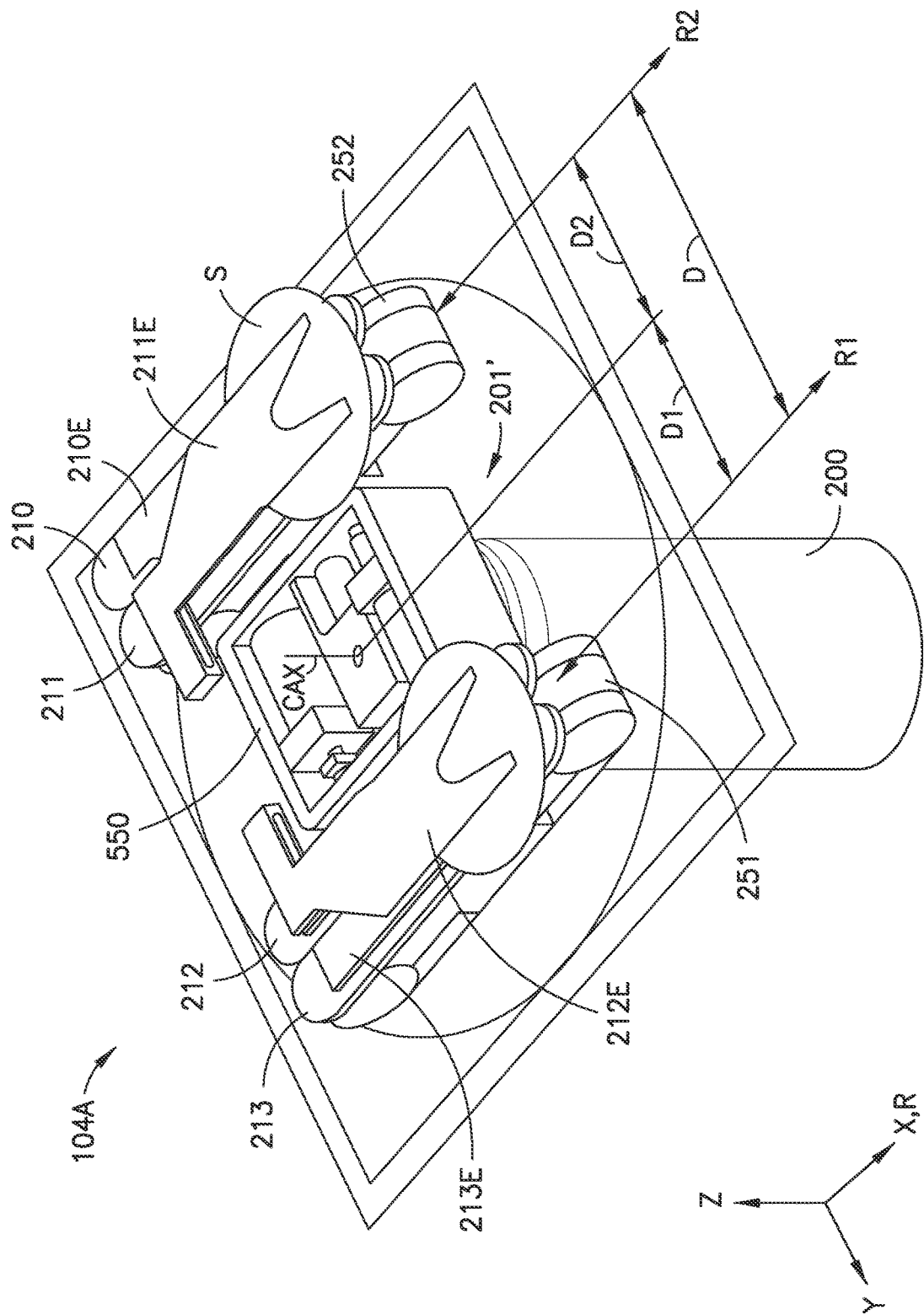
FIGS. 5A-5C are schematic illustrations of a substrate transport apparatus in accordance with aspects of the disclosed embodiment.
Figure 5B:
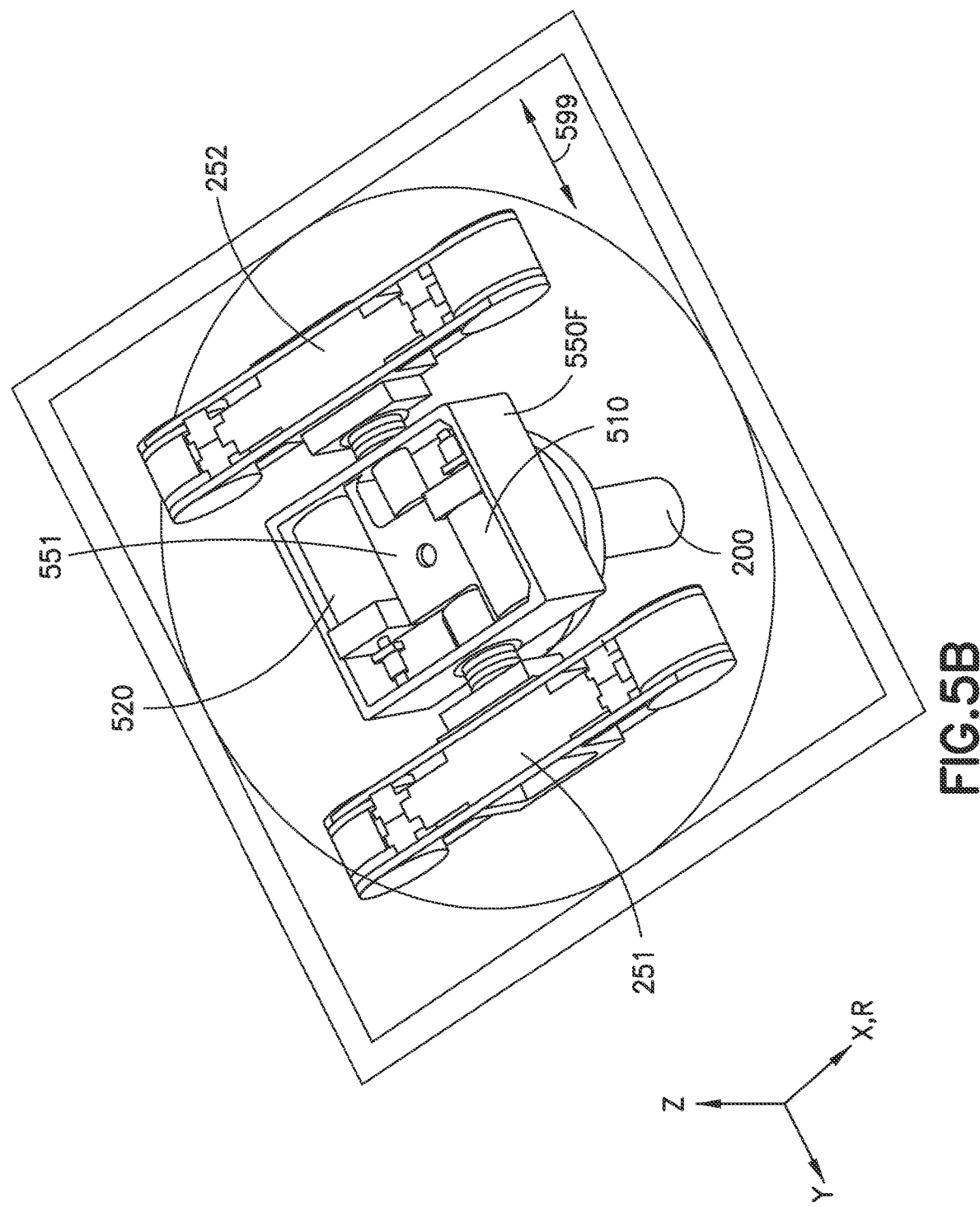
Figure 5C:
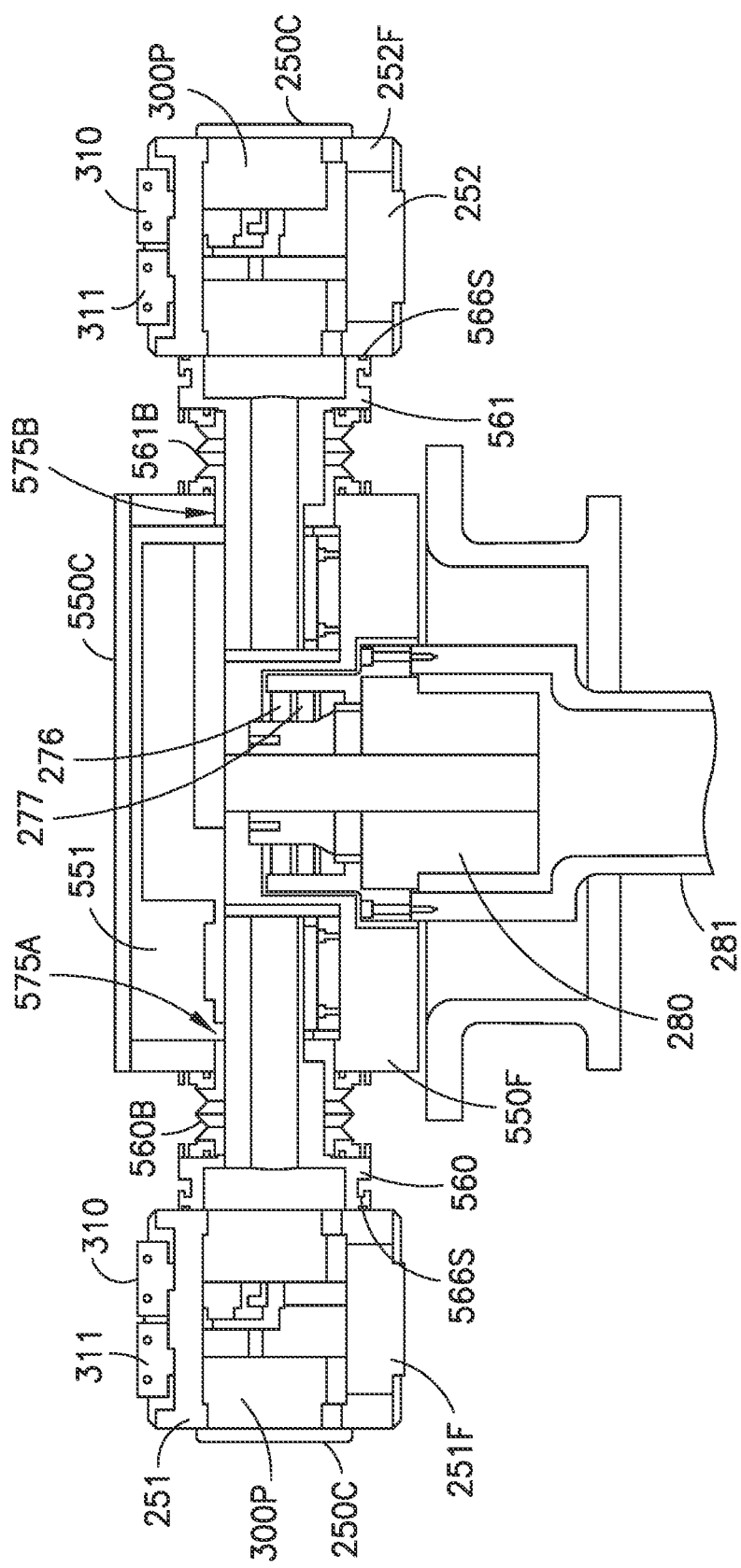
Figure 5E:
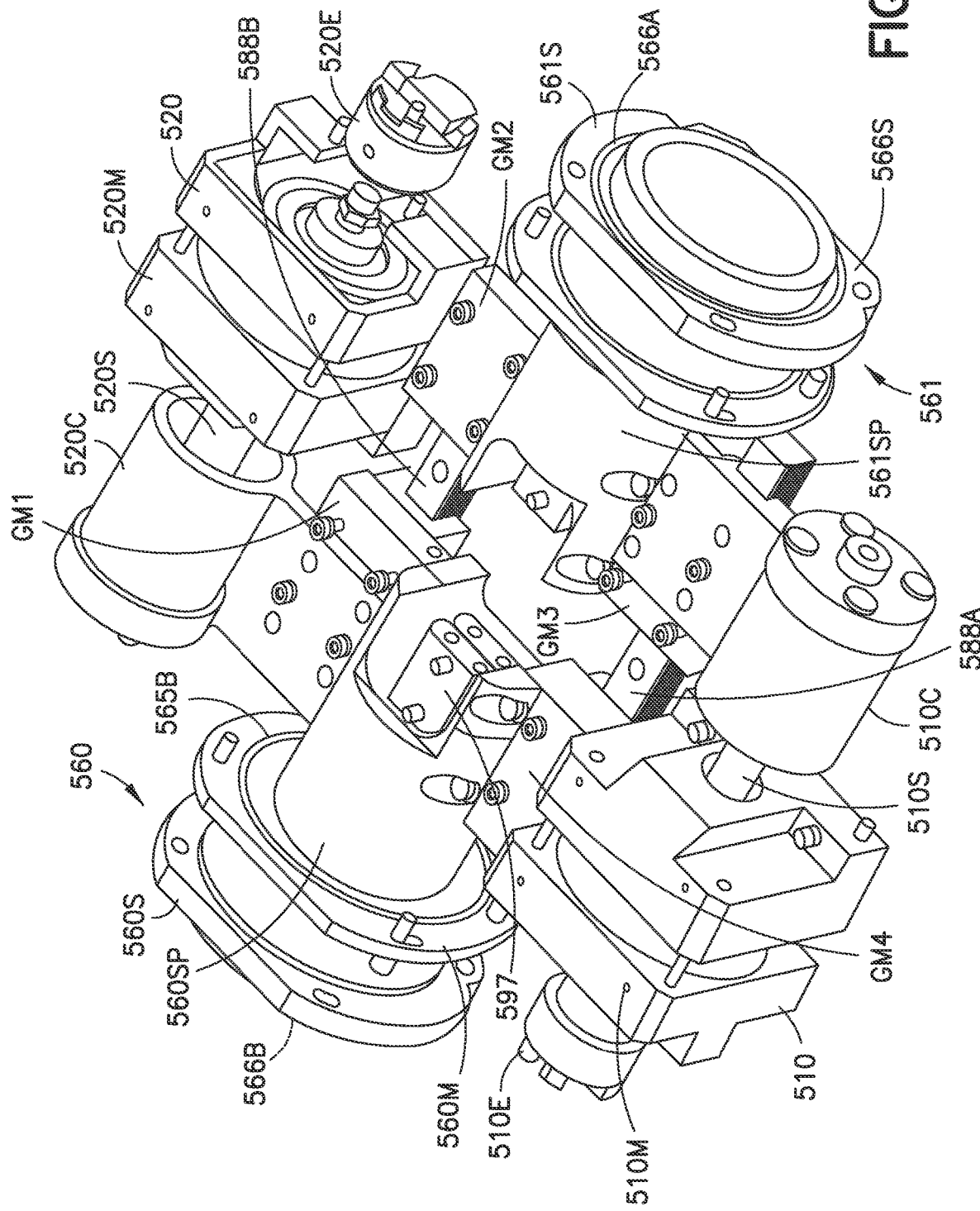

As noted above, the transfer arms described herein are illustrated as telescoping arms (or sliding arms as described below) for exemplary purposes only. However, in other aspects the transfer arms may be any suitable transfer arm such as, for a linearly sliding arm 214 as shown in FIG. 2G. In other aspects the arms may be a SCARA arm 215 (FIG. 2H) or other suitable arm having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm may be derived from a conventional SCARA (selective compliant articulated robot arm) type design, which includes an upper arm, a band-driven forearm and a band-constrained end-effector, or from a telescoping arm or any other suitable arm design. Suitable examples of transfer arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2F) configuration, a leap frog arm 217 (FIG. 2J) configuration, a bi-symmetric arm 218 (FIG. 2I) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

Referring now to FIGS. 5A-5E a transport unit module 104A is illustrated in accordance with an aspect of the disclosed embodiment. The transport unit module 104A is substantially similar to transport unit module 104 described and includes drive sections 200, 201'. Here the drive section 201' includes a base member 550 that has a frame 550F forming an interior chamber 551. In one aspect the interior chamber 551 may include a removable cover 550C and any suitable sealing member 550CS for sealing the interface between the cover 550C and the frame 550F when the cover 550C is mated with the frame 550F. The interior chamber may be in communication with the interior of the drive section 200 in a manner substantially similar to that described above. In this aspect the drive portions 251, 252 may be movably mounted to the base member 550 of drive section 201' in any suitable manner to provide the arms of the drive portions 251, 252 with a degree of freedom that is angled with respect to an axis of extension/retraction R of the arms.

In one aspect the drive section may include bellows or sealed support members 560, 561 for movably supporting a respective one of the drive portion 251, 252. Each of the bellows members 560, 561 may include a standoff member 560S, 561S that is movably connected to a mounting member 560M, 561M in any suitable manner such as by a bellows seal 560B, 561B. The mounting member 560M, 561M is configured for coupling to the frame 550F in any suitable manner so that the standoff member 560S, 561S is inserted at least partly into the interior chamber 551 through a respective aperture or opening 575A, 575B. In one aspect any suitable sealing member 565A, 565B may be disposed between the mounting member 560M, 561M and the frame 550F for maintaining the sealed environment with in the interior chamber 551. In one aspect the bellows seal 560B, 561B may be constructed of any suitable material and have any suitable configuration to provide axial support in, for example, the X and Z directions for the standoff member 560S, 561S. In other aspects the standoff member 560S, 561S may be axially supported in any suitable manner such as by linear rails, bushing, bearings, etc. located at least partly within the interior chamber 551 and sealed from the environment in which the arms operate. For example, the frame 550F may include one or more linear rails 588A, 588B (FIG. 5E) that are disposed within the interior chamber 551. Each standoff member 560S, 561S may be fixedly mounted to or include one or more rail guide members GM1, GM2, GM3, GM4 configured so that the standoff members 560S, 561S are linearly movable along the linear rails in the direction of arrow 599 and supported in the X and Z directions by the linear rails 588A, 588B.

Each standoff member 560S, 561S includes an interface 566A, 566B configured to couple the standoff member 560S, 561S with a respective drive portion 251, 252 in any suitable manner so that an interior passage IP of the standoff member 560S, 561S facilitates atmospheric communication between the interior chamber 551 and the interior chamber 300P of a respective drive portion 251, 252 while allowing passage of, for example, wires, hoses, etc. between the base member 550 and the respective drive portion 251, 252. As may be realized, any suitable tide downs or retention members 597 may be provided within the interior chamber 551 for holding or otherwise securing the moving side of any wires, hoses, etc. that pass through the interior passage IP of the standoff members 560S, 561S. In one aspect any suitable seal member 566S may be disposed between the interface 566A, 566B and respective frame 251F, 252F so that the interior atmosphere of the interior chambers 551, 300P may be sealed from the environment in which the transfer arms operate.

Each standoff member 560S, 561S may include a shaft portion 560SP, 561SP that forms the interior passage IP and extends through the aperture 575A, 575B at least partly into the interior chamber 551 of the base member 550. One or more drives 510, 520 may be disposed within the base member 550 in any suitable manner for imparting linear motion (e.g. along the Y axis in the direction of arrow 599) to at least one standoff member 560S, 561S and the drive portion 251, 252 coupled thereto. As may be realized, movement of the drive portions 251, 252 in the direction of arrow 599 also provides movement of the transfer arms 210-213 mounted to the drive portions 251, 252. In one aspect the drives 510, 520 may be any suitable linear drives such as ball screw drives having a motor 510M, 520M, a ball screw 510S, 520S driven by the motor and a ball nut that rides along the ball screw. The ball nut may be integral to or otherwise coupled to a ball nut adapter or coupler 510C, 520C. The coupler 510C, 520C is fixedly connected to a respective standoff member 560S, 561S and includes the ball nut for engaging the ball screw so that the standoff members 560S, 561S are coupled to a respective drive 510, 520. In one aspect the coupler 510C, 520C is coupled to, for example, one or more rail guide members GM1-GM4 of a respective standoff member 560S, 561S while in other aspects the coupler 510C, 520C may be coupled substantially directly to or be integral with a shaft portion 560SP, 561SP of a respective standoff member 560S, 561S. Here the drive axis of each drive 510, 520 is arranged substantially along the Y axis (e.g. substantially parallel to the direction of movement 599 of the standoff members 560S, 561S) so that as the ball screw rotates the coupler 510C, 520C moves along the ball screw in the direction of arrow 599 moving the respective standoff member 560S, 561S in the direction of arrow 599. While the drives 510, 520 are illustrated as linear ball screw drives in other aspects the drives may be direct drive linear motors, linear piezo electric motors, linear inductance motors, linear synchronous motors, brushed or brushless linear motors, linear stepper motors, linear servo motors, reluctance motors or any other suitable linear drive. In still other aspects rotary motors may be provided for driving the standoff member 560S, 561S (and the arms located thereon) in the direction of arrow 599 through any suitable transmission member(s).

While the drive section 201' is illustrated in FIGS. 5A-5E as having two linear drives 510, 520 for moving the transfer arms 210-213 along the Y axis in the direction of arrow 599 relative to each other and/or the base member 550, in other aspects the drive section 201' may be configured with one linear drive so that only one drive portion 251, 252 is movable along the Y axis relative to the base member 550 and/or other drive portion 251, 252. As may be realized, movement of one or more drive portion 251, 252 provides for changing a distance D between the axes of extension/retraction R1, R2 of the drive portions 251, 252 or a distance D1, D2 between the respective axis of extension/retraction R1, R2 and the common axis of rotation CAX. The displacement of one or more axis of extension/retraction R1, R2 may allow for automatic workpiece centering and/or independent workpiece placement adjustment for workpiece holding station location variations between the facets of the, for example, the transfer modules 125A, 125B, 125C, 125D when the transfer arms 210-213 are picking or placing workpieces to processing stations 130. For example, referring to FIG. 1B drive section 200 may rotate the base member 550 so that the axes of extension/retraction R1, R2 are facing processing stations 130T1, 130T2. One or more of the axis of extension/retraction R1, R2 may be displaced along the Y axis in the direction of arrow 599 for aligning the axis of extension/retraction with a workpiece holding station within one or more of the processing stations 130T1, 130T2 according to any suitable automatic workpiece centering procedure or algorithm. For example, one or more sensor 123A, 123B may be disposed adjacent a respective processing station 130T1, 130T2 for detecting one or more features of a workpiece carried an arm 210-213. The one or more sensor 123A, 13B may send any suitable signals to, for example, any suitable controller such as controller 110 for determining a center of the workpiece S. The controller 110 may control one or more drives of the transport unit module 104A so that the respective axis of extension/retraction R1, R2 is displaced so that the center of the workpiece S is aligned with a predetermined location of the workpiece holding station within the processing station 130T1, 130T2. In one aspect both axes of extension/retraction may be displaced for automatic workpiece centering and/or independent workpiece placement adjustment for workpiece holding station location variations between the facets of the, for example, the transfer modules 125A, 125B, 125C, 125D. In another aspect linear motor 520 may operate to move drive portion 251 so that only axis of extension/retraction R1 is displaced so that a center of the workpiece S aligned with the predetermined position of the workpiece holding station within the processing station 130T1. In still another aspect, the linear motor 510 may operate to move drive portion 252 so that only axis of extension/retraction R2 is aligned with a workpiece holding station within the processing station 130T2. Suitable examples of automatic workpiece centering can be found in, for example, U.S. patent application Ser. No. 13/617,333 entitled "Wafer Center Finding with Kalman Filter" filed on Sep. 14, 2012 and U.S. Pat. No. 7,925,378 entitled "Process Apparatus with On-The-Fly Workpiece Centering" issued on Apr. 12, 2011; U.S. Pat. No. 7,859,685 entitled "Wafer Center Finding with Charge-Coupled Devices" issued on Dec. 28, 2010; U.S. Pat. No. 8,270,702 entitled "Wafer Center Finding with a Kalman Filter" issued on Sep. 18, 2012; U.S. Pat. No. 7,792,350 entitled "Wafer Center Finding" issued on Sep. 7, 2010; U.S. Pat. No. 7,894,657 entitled "Wafer Center Finding" issued Feb. 22, 2011; U.S. Pat. No. 8,125,652 entitled "Wafer Center Finding with Charge-Coupled Devices" issued Feb. 28, 2012; and U.S. Pat. No. 8,253,945 entitled "Wafer Center Finding with Charge-Coupled Devices" issued Aug. 28, 2012 the disclosures of which are incorporated herein by reference in their entireties. As may be realized, one or more encoders 510E, 520E, substantially similar to those described above may be provided to detect a position of the drive motors 510, 520 and/or displacement of the arms 210-213 (and workpieces held thereon) along the Y axis for effecting the automatic workpiece centering and/or independent workpiece placement adjustment for workpiece holding station location variations between the facets.

Figure 6A:
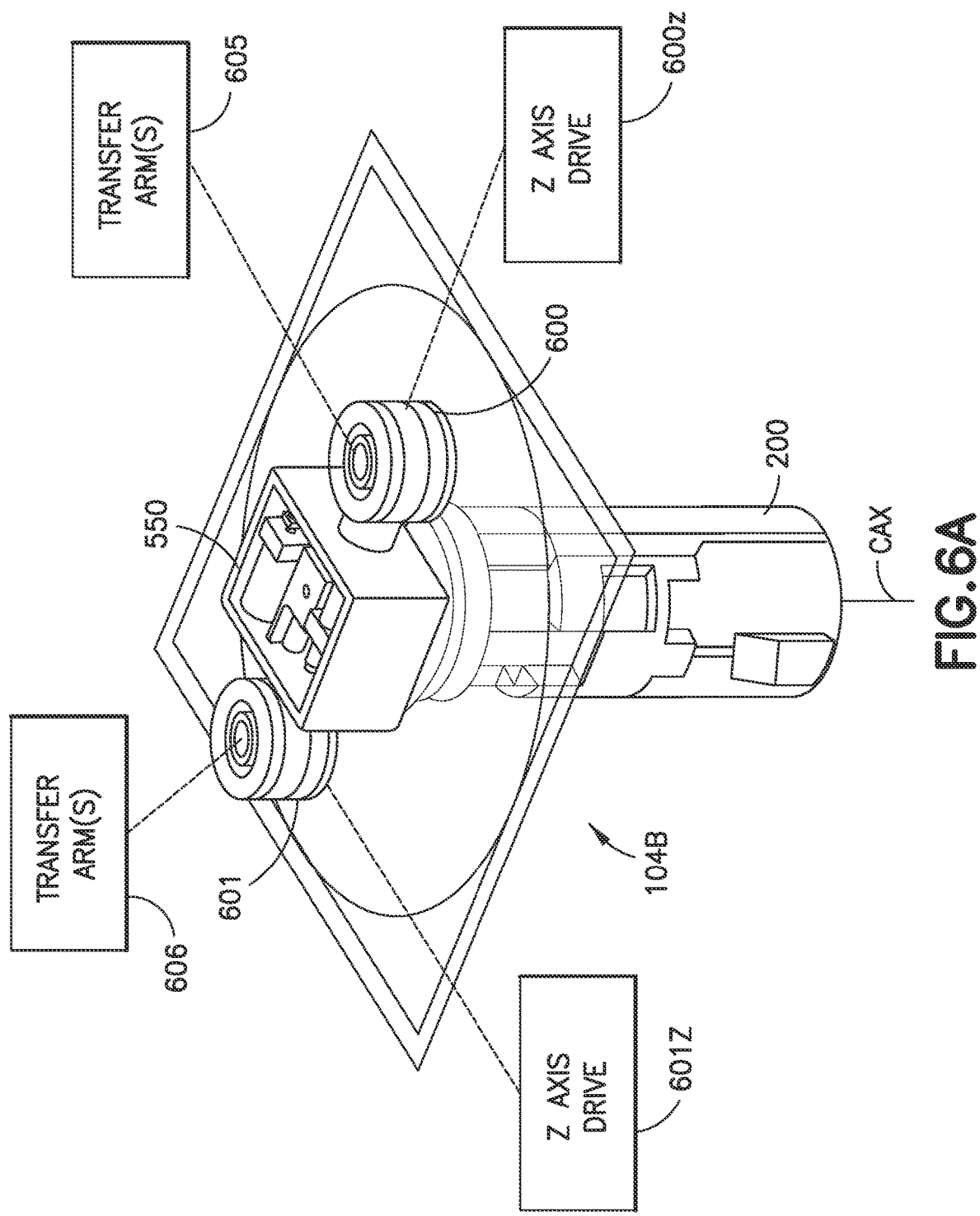
FIGS. 6A-6B are schematic illustrations of a substrate transport apparatus in accordance with aspects of the disclosed embodiment.
Figure 6B:
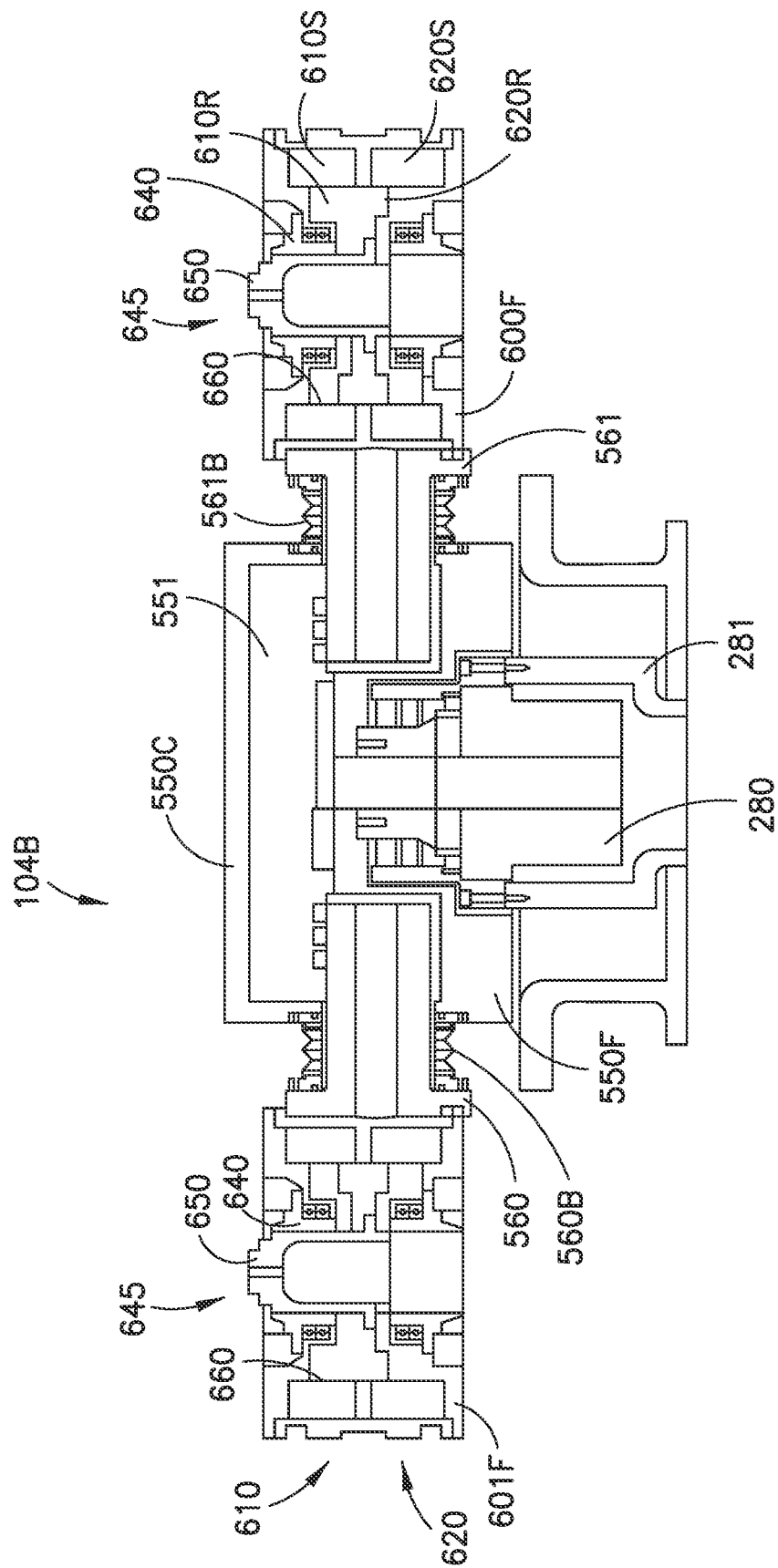

Referring now to FIGS. 6A and 6B a transfer unit module 104B is illustrated in accordance with aspects of the disclosed embodiment. The transfer unit module 104B may be substantially similar to transfer unit module 104A described above. In this aspect rotary drive portions 600, 601 are coupled to the bellows members 560, 561 in a manner substantially similar to that described above with respect to drive portions 251, 252. One or more suitable transfer arm 605, 606 (such as those described above with respect to FIGS. 2F-2J or any other suitable transfer arm capable of being driven by a rotary motor) may be drivingly mounted to each rotary drive portion 600, 601 in any suitable manner. Each of the rotary drive portions 600, 601 in this aspect includes a frame or housing 600F, 601F, a first drive motor 610 and a second drive motor 620 mounted to the frame 600F, 601F in any suitable manner. The motor arrangement may be a coaxial motor arrangement as shown or in other aspects the motors may be arranged side by side. The drive motors may be any suitable motors such as for example, piezo electric motors, inductance motors, synchronous motors, brushed or brushless motors, linear stepper motors, servo motors, reluctance motors, harmonic drive motors, etc. The first motor 610 may include a stator 610S and a rotor 610R. The second motor 620 may include a stator 620S and a rotor 620R. In this aspect a coaxial drive shaft assembly 645 is rotatably supported at least partly within the frame 600F, 601F in any suitable manner, such as for example, substantially without contact (e.g. such as with a self-bearing motor) or with any suitable bearings. The coaxial drive shaft assembly 645 includes an outer drive shaft 640 and an inner drive shaft 650. The rotor 610R may be coupled to the outer drive shaft 640 in any suitable manner so that as the rotor 610R rotates the drive shaft 640 rotates with it. In other aspects any suitable number of drive motors may be provided in each of the rotary drive portions 600, 601 for driving any suitable number of drive shafts. In one aspect the rotors 610R, 620R and drive shaft assembly 645 may be disposed within the environment in which the transfer arms 605, 606 operate. Any suitable seal 660, such as a can seal, may be disposed between stators 610S, 620S and their respective rotors 610R, 620R so that the stators are isolated or sealed from the environment in which the transfer arms 605, 606 operate and are disposed within an atmospheric environment that is common with the interior of drive section 200 and base member 550. In other aspects one or more ferrofluidic seal may be provided around each drive shaft 640, 650 for scaling the rotors 210R, 220R and stators 210S, 220S from the environment in which the transfer arms 605, 606 operate. Suitable examples of rotary drive portions can be found in, for example, U.S. patent application Ser. No. 13/270,844 entitled "Coaxial Drive Vacuum Robot" filed on Oct. 11, 2011; Ser. No. 13/646,282 entitled "Robot Drive with Magnetic Spindle Bearings" filed Oct. 5, 2012 and U.S. Pat. No. 5,720,590 entitled "Articulated Arm Transfer Device" issued Feb. 24, 1998; U.S. Pat. No. 5,899,658 entitled "Articulated Arm Transfer Device" issued May 4, 1999; U.S. Pat. No. 5,813,823 entitled "Articulated Arm Transfer Device" issued Sep. 29, 1998; and U.S. Pat. No. 8,283,813 entitled "Robot Drive with Magnetic Spindle Bearings" issued Oct. 9, 2012, the disclosures of which are incorporated herein by reference in their entireties. In other aspects one or more of the drive portions 600, 601 (or any of the other drive portions described herein 251, 252, 251', 252', 850, 851) may also include a Z-axis drive 600Z, 601Z configured to move the one or more of the arms attached thereto relative to the arms of the other drive portion 600, 601.

Figure 7B:
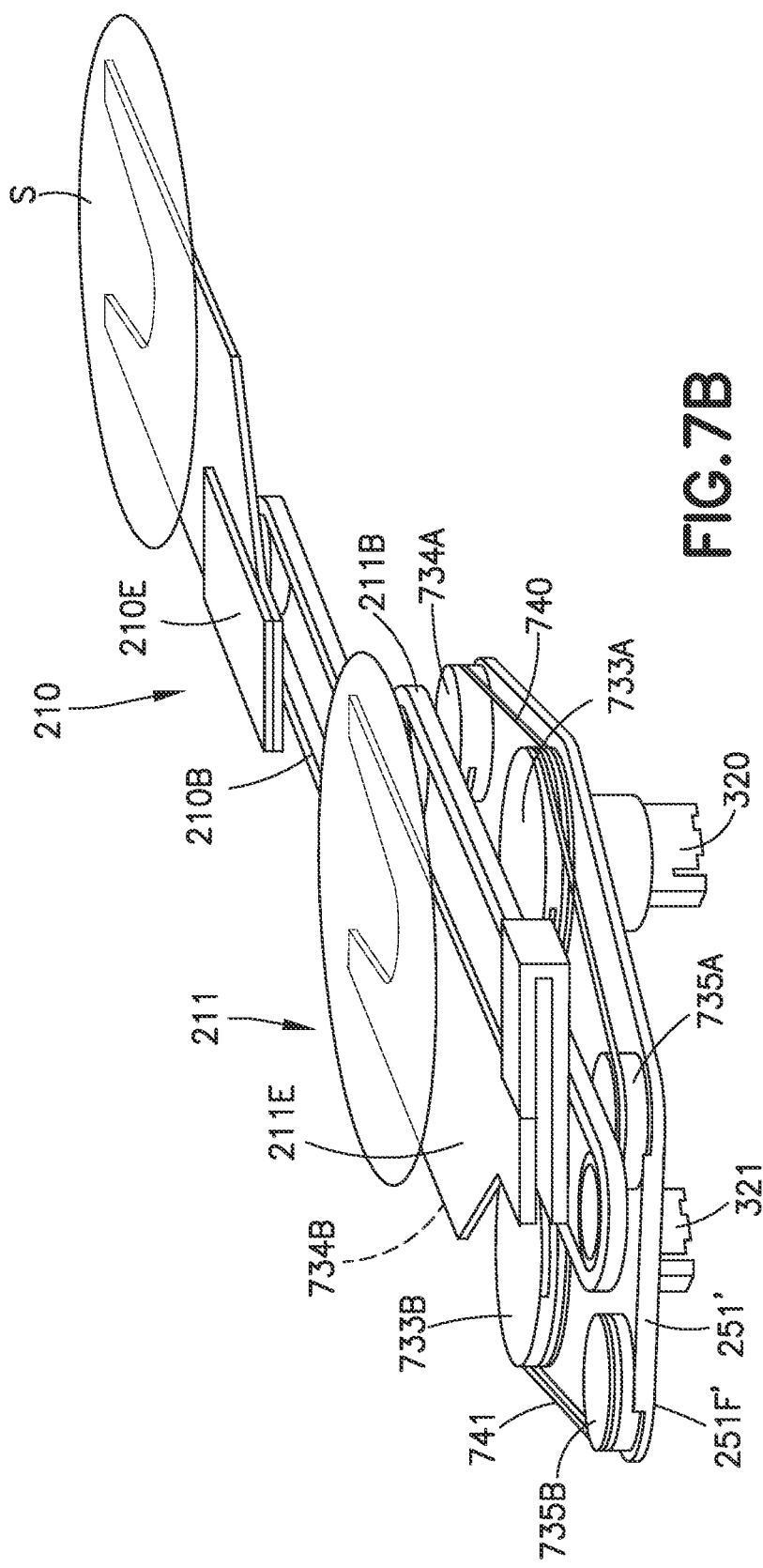

Referring now to FIGS. 7A-7C a transfer unit module 104C is illustrated in accordance with aspects of the disclosed embodiment. The transfer unit module 104C may be substantially similar to transfer unit module 104 described above. In this aspect drive portions 251', 252' may include a drive system having pulleys that are substantially parallel with a seating plane of the end effector 210E-213E while the drive motor 320, 321 for each arm 210-213 is located within the base member 201'. Referring to FIG. 7A drive portion 251' will be described however, it should be understood that drive portion 252' is substantially similar to drive portion 251'. The drive portion 251' includes a frame 251F' that may have any suitable size, shape and/or configuration. While the frame 251F' is illustrated as a flat plate for exemplary purposes, in other aspects the frame 251F' may include any suitable covers for housing the drive transmissions such that the covers are configured to substantially prevent any particles generated by the drive transmission from entering the environment in which the arms operate. The frame 251F' may include any suitable rail or guide members similar to those described above with respect to transfer unit module 104, 104A on which the respective base member 210B, 211B is movably mounted. Each drive motor 320, 321 may include a drive shaft that is coupled to a respective drive pulley 733A, 733B for driving a respective belt or band 740, 741 which may be substantially similar to those described above. As may be realized, any suitable idler pulleys 734A, 734B, 735A, 735B may be provided and mounted to the frame 251F' for directing the belt or band 740, 741 adjacent a respective base member 210B, 211B so that the belt or band may be fixedly coupled or anchored to the base member for driving the respective arm 210, 211 in the manner described above. As may also be realized, the base member 201' may be suitable sealed, such as with covers 250C so that the motors are located in a common atmospheric environment with the drive section 200. While two drive portions are shown as being mounted to the base member 201' in FIG. 7A in other aspects more or less than two drive portions may be mounted to the base member 201'. For example, FIG. 7C illustrates a single drive portion having two arms mounted to the base portion 201'. As may be realized, the single drive portion illustrated in FIG. 7C may be a three axis drive substantially similar to that described above. In one aspect one drive axis of the three axis drive may be coupled to the pulleys for driving extension/retraction of arm 210, one axis of the three axis drive may be coupled to the frame 251F' for rotating the arms 210, 211 as a unit and one axis of the three axis drive may be coupled to pulleys for driving extension/retraction of arm 211.

Figure 8A:
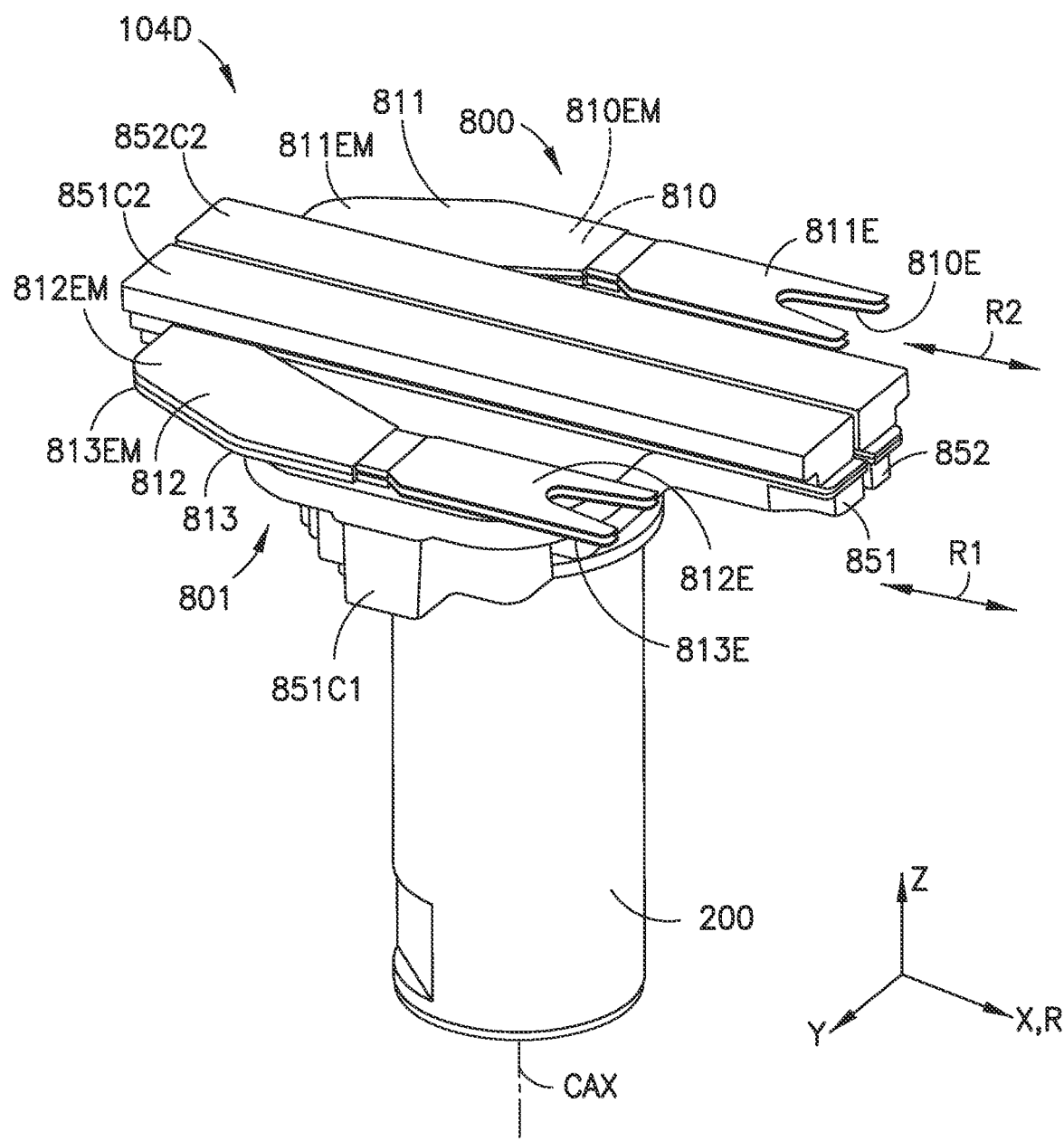
FIGS. 8A-8B are schematic illustrations of a substrate transport apparatus in accordance with aspects of the disclosed embodiment.
Figure 8B:
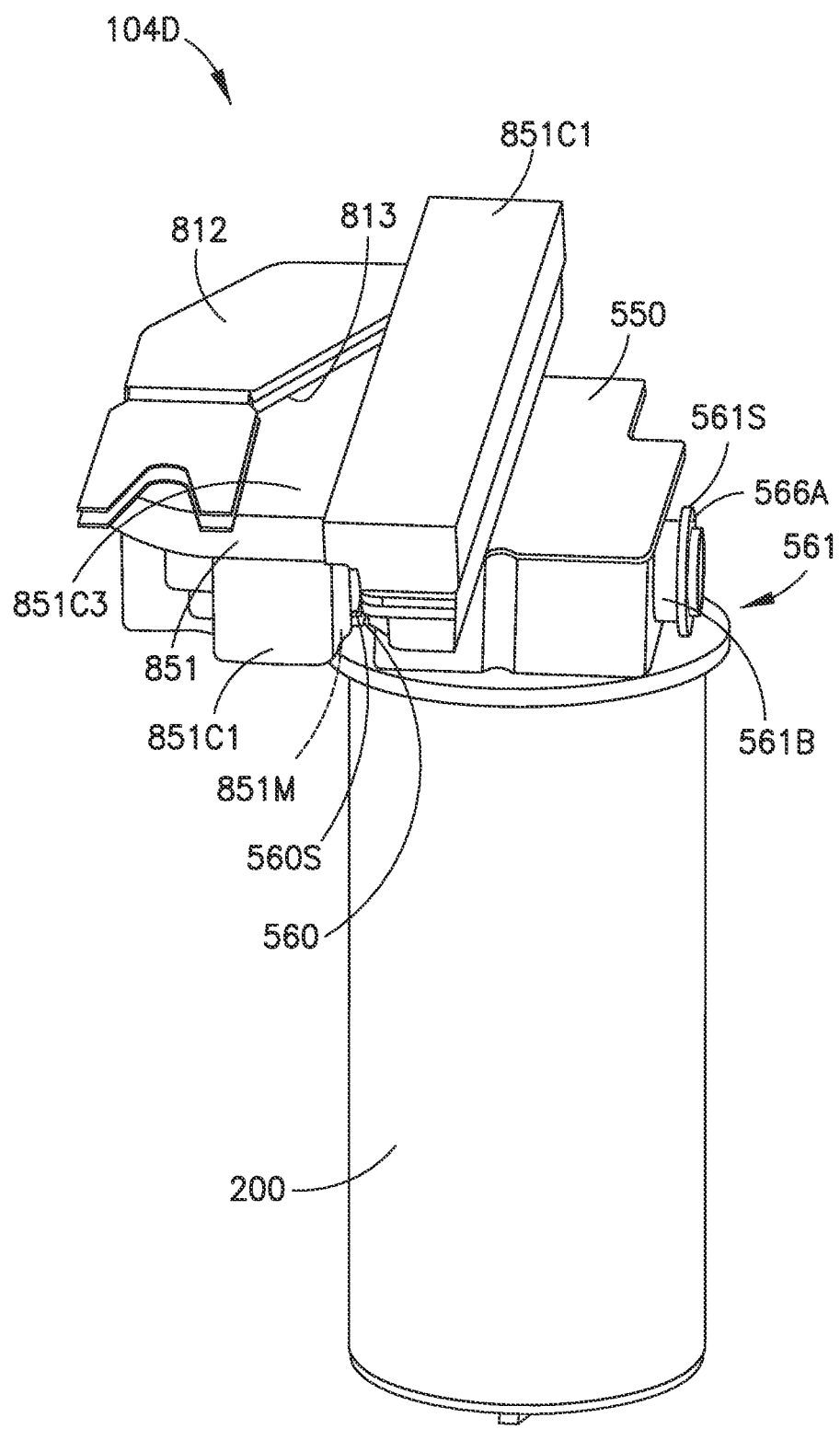

Referring now to FIGS. 8A-9D a transfer unit module 104D is illustrated in accordance with aspects of the disclosed embodiment. The transfer unit module 104D may be substantially similar to transfer unit module 104 described above. In this aspect the drive portions 800, 801 are configured with single stage linearly sliding arms 810-813. In this aspect each drive portion 800, 801 includes a frame 851, 852 having a sealed motor section 860 and a transmission section 853. The drive portions 800, 801 will be described with respect to drive portion 801 but is should be understood that drive portion 800 is substantially similar and may be opposite in hand as shown in FIG. 8A. The sealed motor section 860 may include housing or cover 851C1 that is fixedly mounted to the frame 851 and configured to house the motors 320, 321. The housing 851C1 may be sealed to the frame with any suitable seal member 860S so that the motors 320, 321 are disposed within an atmospheric environment that is common to the atmospheric environment within drive section 200. In a manner substantially similar to that described above, the housing 851C1 may include an aperture or opening 851M configured to mount the housing 851C1 to the sealed support member 560 in any suitable manner, such as that described above. As may be realized the housing 851C1 may be constructed of any suitable material and be configured to support (e.g. when coupled to the sealed support member 560) the frame 851, drive components, the arms 812, 813 and any workpieces carried by the arms 812, 813. The motors 320, 321 may be mounted to the frame 251 in any suitable manner so that, for example, the ferrofluidic seal 320S of the respective motors 320, 321 seals the respective openings 973, 974 in the frame 851 through which the drive shafts 370 extend for maintaining the sealed atmosphere within the sealed motor section 860.

Figure 9A:
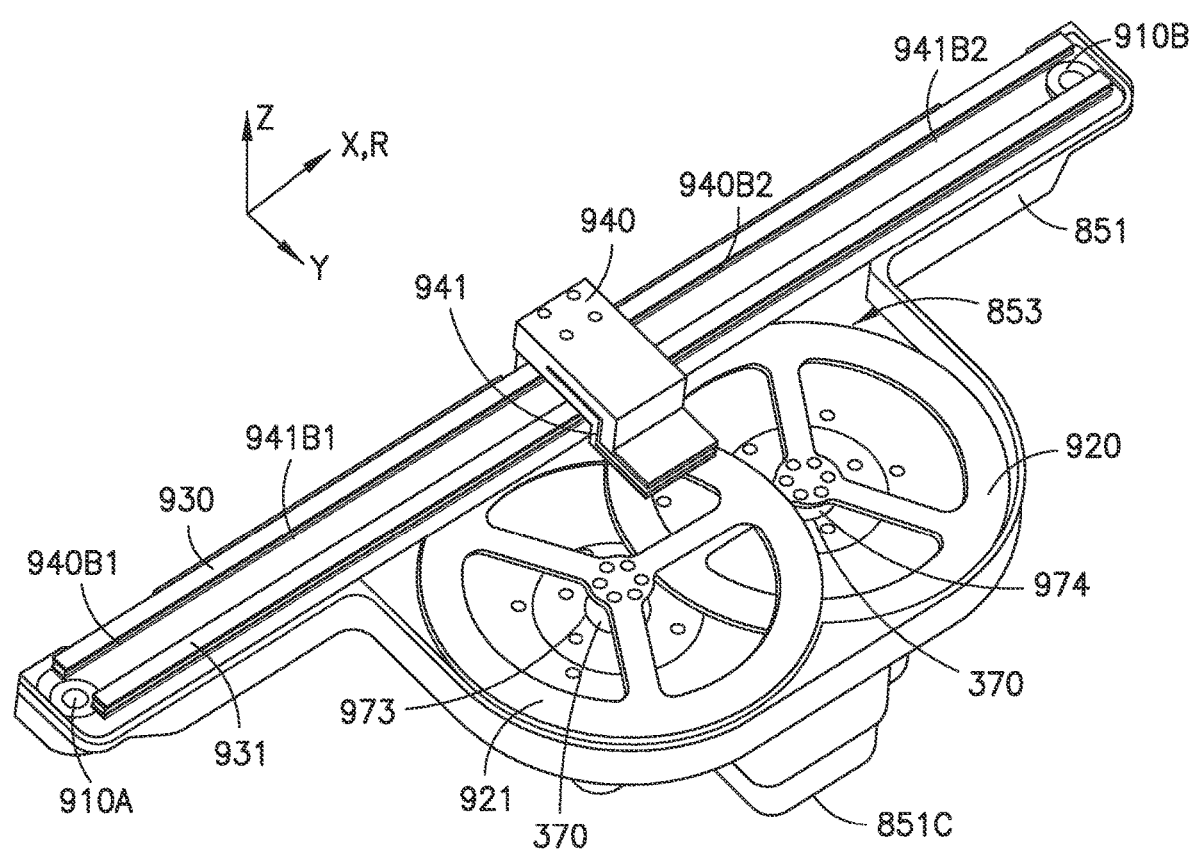
FIGS. 9A-9F are schematic illustrations of a portion of the substrate transport apparatus illustrated in FIGS. 8A-8B in accordance with aspects of the disclosed embodiment.
Figure 9B:
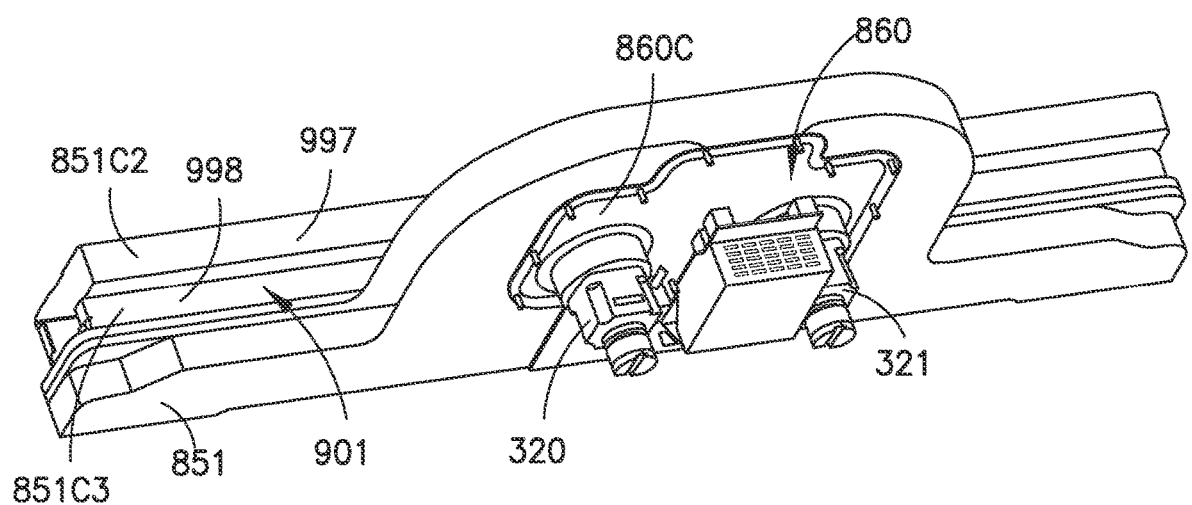
Figure 9C:
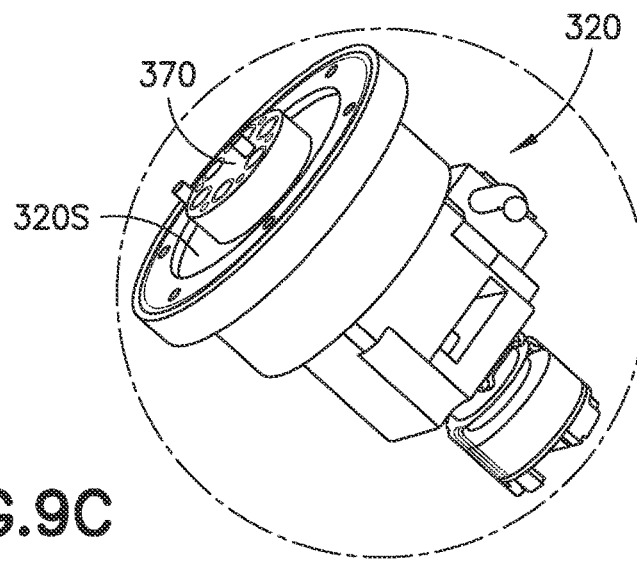
Figure 9E:
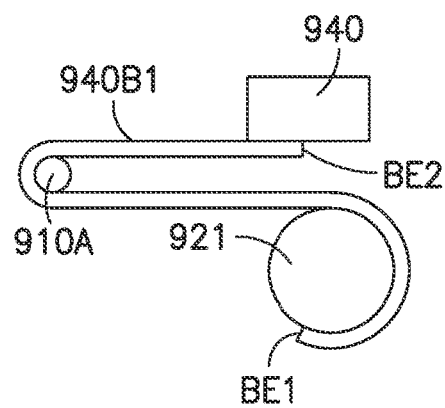
Figure 9F:
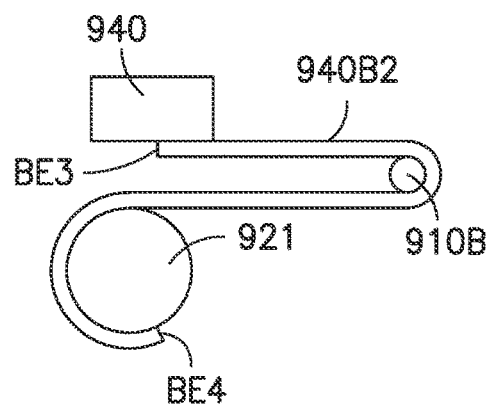
Figure 9D:
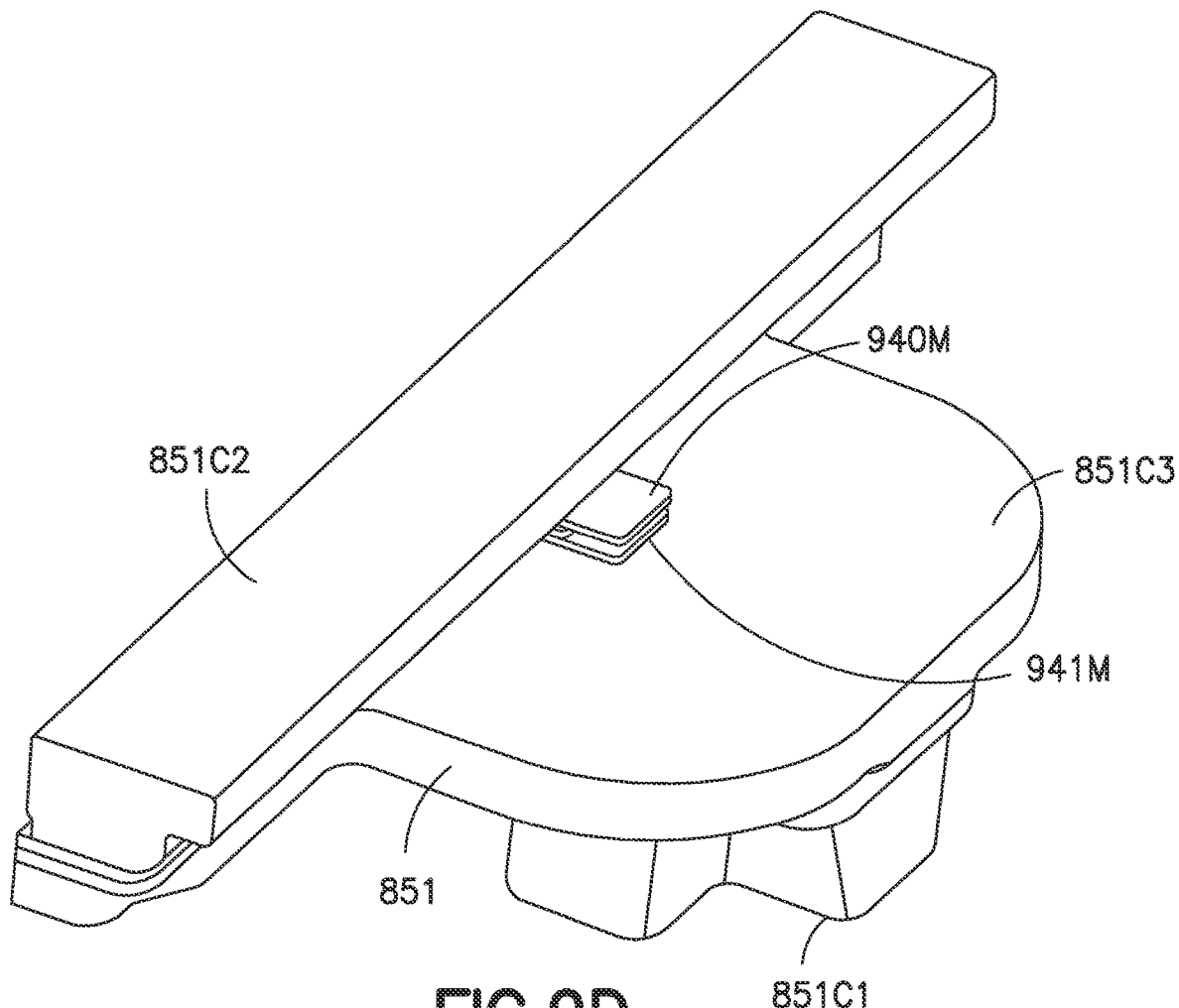

One or more linear rails or guide members 930, 931 may be mounted to the frame 851 within the transmission section 853 in any suitable manner so as to define a degree of freedom for an independent drive axis of at least one arm 812, 813. In this aspect there are two guide rails 930, 931 disposed along the X axis or axis of extension/retraction R of the arms 812, 813 however, in other aspects any suitable number of rails may be provided for guiding any suitable number of arms. A carrier or arm support 940, 941 may be mounted to a respective rail so as to be supported by the rail and movable along the X axis (e.g. along axis of extension/retraction R). In this aspect carrier 940 is movably mounted to guide rail 930 and carrier 941 is movably mounted to guide rail 931. Each carrier may include an arm mounting portion 940M, 941M to which a respective arm 812, 813 is fixedly attached. The carriers 940, 941 may be configured in any suitable manner so that one carrier 940, 941 is allowed to pass by another one of the carriers 940, 941 along the axis of extension/retraction R. Carrier 940 may be coupled to motor 320 and carrier 941 may be coupled to motor 321 (or vice versa) through any suitable drive transmissions. In one aspect, drive pulley 921 may be coupled to shaft 370 of motor 320 so that as shaft 370 rotates the drive pulley 921 rotates with it. Idler pulleys 910A, 910B may be disposed substantially at opposite ends of the guide rails 930, 931 and be configured so that one or more belts or bands may be at least partially wrapped around the idler pulleys 910A, 910B. Referring also to FIGS. 9E and 9F, one or more belts or bands 940B1, 940B2 (e.g. substantially similar to those described above) may couple the drive pulleys 920, 921 to the respective carriers 940, 941. For example, referring to drive pulley 921 and carrier 940 a first band/belt 940B1 may be fixedly coupled to pulley 921 at one end BE1 of the band/belt 940B1. The band/belt 940B1 may at least partially wrap around idler pulley 910A and extend to the carrier 940 such that the other opposite end BE2 of the band/belt 940B1 is fixedly coupled to the carrier 940. A second band/belt 940B2 may be fixedly coupled to pulley 921 at one end BE3 of the band/belt 940B2. The band/belt 940B2 may at least partially wrap around idler pulley 910B and extend to the carrier 940 (e.g. from a direction opposite that of the first band/belt 940B1 so that one of the first and second band/belt 940B1, 940B2 pulls on the carrier while the other band/belt 940B1, 940B2 pushes on the carrier) such that the other opposite end BE4 of the band/belt 940B2 is fixedly coupled to the carrier 940. Similarly, with respect to carrier 941, a first band/belt 941B1 may be fixedly coupled to pulley 920 at one end of the band/belt 941B1. The band/belt 941B1 may at least partially wrap around idler pulley 910A and extend to the carrier 941 such that the other opposite end of the band/belt 941B1 is fixedly coupled to the carrier 941. A second band/belt 941B2 may be fixedly coupled to pulley 920 at one end of the band/belt 941B2. The band/belt 941B2 may at least partially wrap around idler pulley 910B and extend to the carrier 941 (e.g. from a direction opposite that of the first band/belt 941B1 so that one of the first and second band/belt 941B1, 941B2 pulls on the carrier while the other band/belt 941B1, 941B2 pushes on the carrier) such that the other opposite end of the band/belt 941B2 is fixedly coupled to the carrier 941.

In one aspect the transmission section 853 may be exposed to an atmosphere in which the arms 812, 813 operate but may include one or move covers to substantially prevent any particles generated by the belts/bands, pulleys, and or carriers/rails from entering the environment and contacting workpieces held by the arms 812, 813. In one aspect a cover 851C3 may be placed over at least a portion of the transmission section 853, such as over the at least a portion of the drive pulleys 920, 921. The cover 851C3 may include a seal portion 998 disposed adjacent the guide rails 930, 931. A cover 851C2 may also be placed over the guide rails 930, 931 and be configured to allow the carriers 940, 941 to traverse their respective guide rails 930, 931. The cover 851C2 may include a seal portion 997 such that the seal portions 997 and 998 extend towards each other. In one aspect a space or opening 901 may be provided between the seal portions 997, 998 so that the arm mounting portions 940M, 941M of the carriers 940, 941 may extend through the space or opening 901 for connection to the respective arms 812, 813 and so that the respective arms 812, 813 are disposed one above the other. The seal portion 997, 998 may form a labyrinth seal to substantially contain any particles within the covers 851C2, 851C3 while allowing extension/retraction of the arms 812, 813.

In other aspects the one or more of the carriers may be substantially directly driven by any suitable linear motor such as those described above. For example, in one aspect the transmission section 853 may be sealed from the atmosphere in which the arms 812, 813 such that a common atmospheric environment is shared between the transmission section 853 and the drive section 200 in a manner substantially similar to that described above with respect to the sealed motor section 860. The guide rails 930, 931 may be disposed outside the transmission section and include the carriers 940, 941 and covers including seal portions 997, 998. Each carrier may have a magnetic follower attached thereto that is magnetically driven by a magnetic driver through, e.g., a wall or cover of the transmission section 853 via a magnetic coupling between the magnetic follower and magnetic driver in a manner substantially similar to that described in, for example, U.S. Pat. Nos. 7,901,539; 8,293,066; 8,419,341 and U.S. patent application Ser. No. 13/286,186 all of which have been previously incorporated by reference herein in their entireties. In another aspect, each of the carriers 940, 941 may include a magnetic platen that is driven a linear array of motor windings disposed within the sealed atmospheric environment of the transmission section 853 in a manner substantially similar to that described in, for example, U.S. Pat. Nos. 7,575,406; 7,959,395 and U.S. patent application Ser. No. 13/159,034 all of which have been previously incorporated by reference herein in their entireties.

In one aspect, each arm 810-813 includes an end effector 810E-813E that is coupled to a respective carrier 940, 941 by a substantially rigid arm section or end effector extension member 810EM-813EM. For example, the substantially rigid arm section 810EM-813EM may be fixedly coupled to a respective arm mounting portion 940M, 941M of a respective carrier 940, 941 in any suitable manner such as by mechanical fasteners. The end effector 810E-813E may be fixedly coupled to a respective substantially rigid arm section 810EM-813EM in any suitable manner such as by mechanical fasteners. In other aspects, the substantially rigid arm section 810EM-813EM and the respective end effector 810E-813E may have a unitary one piece construction. In still other aspects the substantially rigid arm section 810EM-813EM, the respective end effector 810E-813E and the respective carrier 940, 941 may have a unitary one piece construction.

As can be seen from the above-description each end effector 810E-813E is independently extendable/retractable along a respective axis of extension/retraction R1, R2. As can also be seen from the above description, each drive portion 800, 801 may be independently movable along the Y axis independent of another one of the drive portions 800, 801 so as to change a distance D between axes of extension/retraction R1, R2 relative to each other or to change a distance D1, D2 of one or more axis of extension/retraction relative to the common axis of rotation CAX (see FIG. 5A) for automatic workpiece centering and/or independent workpiece placement adjustment for workpiece holding station location variations between the facets of the, for example, the transfer modules 125A, 125B, 125C, 125D in a manner substantially similar to that described above. Referring to FIGS. 10A and 10B, in one aspect one of the drive portions 800, 801 may be movable along the Y axis relative to the other drive portion 800, 801 and/or common axis CAX while the other drive portion 800, 801 has a fixed distance D1, D2 relative to the common axis CAX and is not movable along the Y axis. For example, drive portion 800 may be movably mounted to the base member 550 by sealed support member 560 so as to be movable along the Y axis by drive 510 disposed within the base member 550. Drive portion 801 may be fixedly mounted to the base member 550 by a fixed support member 1000 where the fixed support member is configured to allow atmospheric communication between at least the sealed motor section 860 and the drive section 200.

Figure 11A:
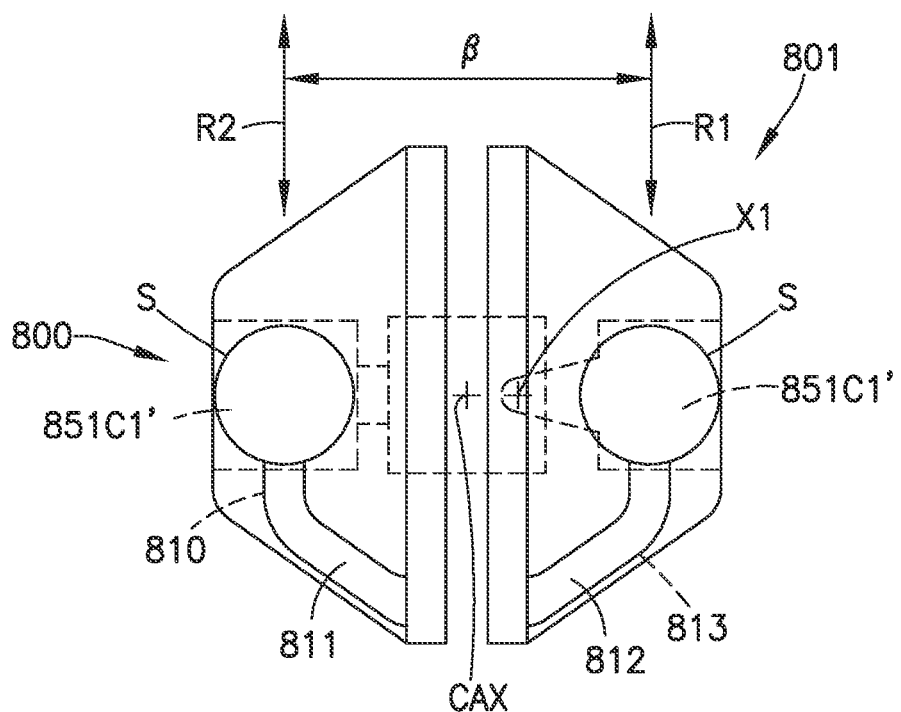
FIGS. 11A-11D are schematic illustrations of a substrate transport apparatus in accordance with aspects of the disclosed embodiment.
Figure 11B:
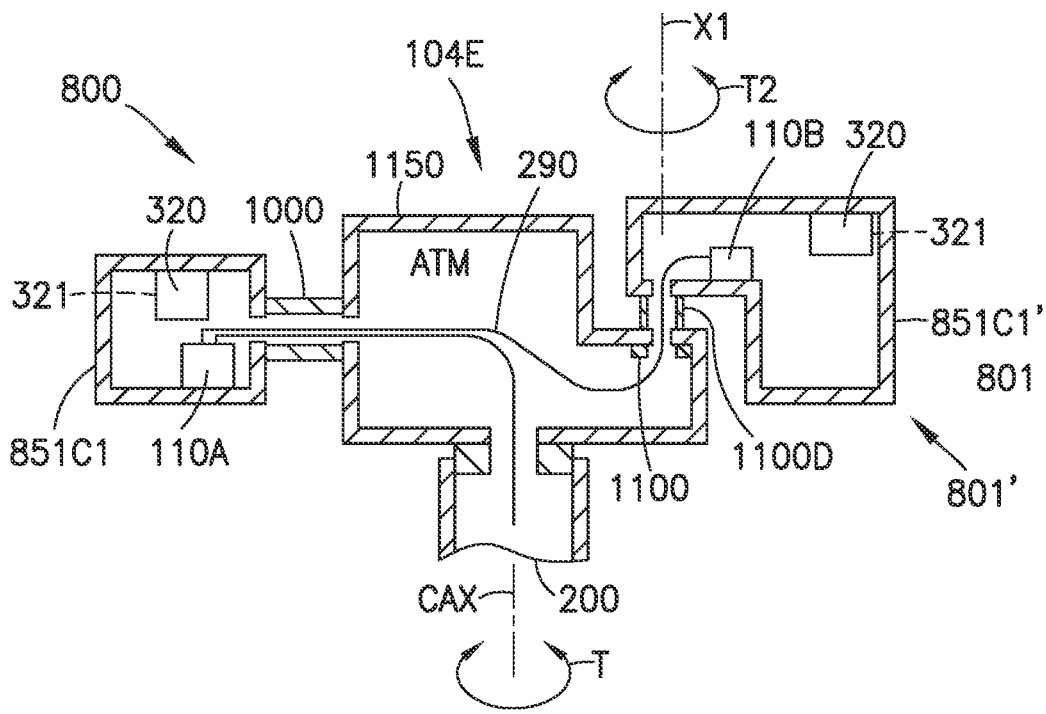

Referring now to FIGS. 11A and 11B one or more of the drive portions 800, 801' may be pivotable relative to another one of the drive portions 800, 801' for changing the angle β between the axes of extension/retraction R1, R2 and for allowing automatic workpiece centering and/or independent workpiece placement adjustment for workpiece holding station location variations between the facets of the, for example, the transfer modules 125A, 125B, 125C, 125D. For example, the transfer unit module 104E, which may be substantially similar to one or more transfer unit modules described above, may include a base member 1150 substantially similar to base member 550. In this aspect the base member 1150 may be configured for coupling to drive portion 800 in any suitable manner such as, for example, by fixed support member 1000. The base member 1150 may also be configured for coupling with drive portion 801' (which may be substantially similar to drive portion 801 described above). Here the base member may include any suitable drive 1100 (which may be substantially similar to one or more of drive 280, 320, 321, 610, 620 described above). A drive shaft 1100D may extend through a wall of the base member 1150 for coupling to the housing 851C1' (which may be substantially similar to housing 851C1 described above) so that the drive portion 801 and arms 812, 813 are pivotable about common axis X1 in the direction of arrow T2 for changing the angle β. As may be realized, one or more workpiece held by drive portion 800 may be centered by, for example, rotating both the drive portions as a unit about axis CAX while one or more workpieces held by drive portion 801' may be centered by rotating drive portion 800' about axis X1.

Figure 11C:
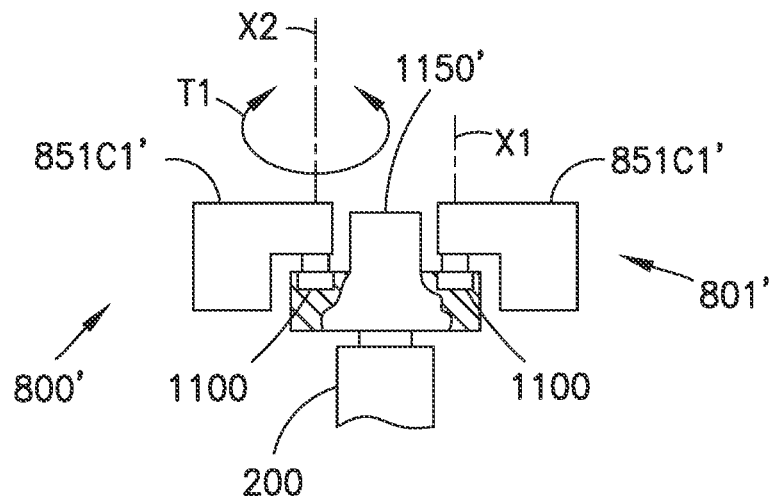

In other aspects, as can be seen in FIG. 11C both drive portions 800' (which may be substantially similar to drive portion 801') and drive portion 801' may be pivotally mounted to the base member 1150' (which may be substantially similar to base member 1150 such that each drive portion is configured to pivot about a respective axis X1, X2 in a respective direction T1, T2 by a respective drive 1100 to change the angle β. Here automatic workpiece centering and/or independent workpiece placement adjustment for workpiece holding station location variations between the facets of the, for example, the transfer modules 125A, 125B, 125C, 125D may be performed by rotating each drive portion 800', 801' by any predetermined amount. In one aspect both drive portions may be rotated as a unit about axis CAX while one or more workpieces held by drive portions 800', 801' may be centered by rotating one or more drive portion 800', 801' about a respective axis X1, X2.

Figure 11D:
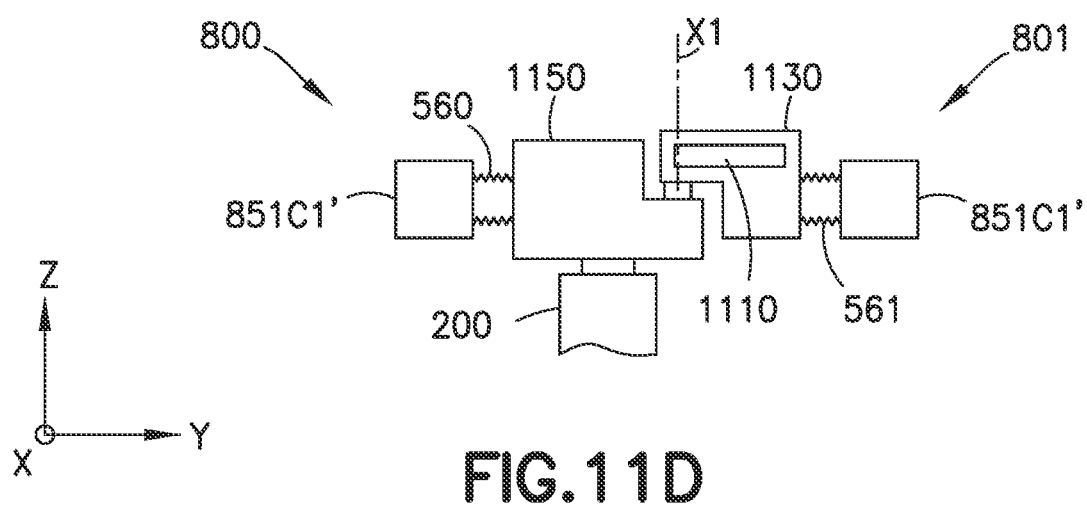

In still other aspects, movement of one or more arms 810-813 along the Y axis may also be provided in conjunction with rotation of one or more drive portions 800, 801. For example, referring to FIG. 11D the base member is configured to couple with housing 851C1 through sealed support member 560 so as to be movable along the Y axis. In other aspects housing 851C1 may be coupled to the base member 1150 by fixed support member 1000. Pivot housing 1130 (which may be substantially similar to housing 851C1') may be pivotally coupled to base member 1150 in a manner substantially similar to that described above with respect to FIGS. 11A-11C. Housing 1130 may have an aperture to which sealed support member 561 is coupled and may include a linear drive motor 1110 in a manner substantially similar to that described above with respect to base member 550. Drive portion 801 may be coupled to the scaled support member 861 by housing 851C1 in a manner substantially similar to that described above. In other aspects both of the drive portions 800, 801 may be mounted to a pivot housing 1130 in any suitable manner.

Referring now to FIGS. 12A and 12B, in one aspect one or more of the sealed drive section housings 1250, 1251 of drive portions 800, 801 may be configured to be rotatably coupled to drive section 200 about common axis CAX so that one or more drive portion 800, 801 may be pivoted about common axis CAX for changing the angle β and to allow automatic workpiece centering and/or independent workpiece placement adjustment for workpiece holding station location variations between the facets of the, for example, the transfer modules 125A, 125B, 125C, 125D. For example, housing 1251 (which maybe be substantially similar to housing 851C1 described above) may be substantially directly coupled to a drive shaft 280S of drive section 200 so that as drive shaft 280S rotates the housing 1251 rotates with the drive shaft 280S. The housing 1250 (which may be substantially similar to housing 851C1 described above) may be rotatably mounted to housing 1251 about common axis CAX. For example, any suitable drive 1200 (such as 280, 320, 321, 610, 620 described above) may be disposed within the housing 1251. The housing 1251 may include an aperture through which a drive shaft 1200S extends and housing 1250 may include an aperture to which the drive shaft 1200S is coupled. As may be realized any suitable seals (such as those described above) may be disposed around the drive shaft, between drive 1200 and housing 1251 and between drive shaft 1200S and housing 1250 for maintaining a sealed atmospheric environment within the housings 1250, 1251 and drive section 200. In one aspect any suitable bearings 1200B may also be provided between housings 1250, 1251 while in other aspects the bearing may not be included such that housing 1250 is supported by the drive shaft 1200S and the coupling between the drive 1200 and the housing 1251. Here, drives 280 and 1200 may be independently operable so that the drive portions may be pivoted relative to one another in any suitable manner about common axis CAX for changing the angle β. In other aspects one or more of the drive portions 800, 801 may be movable along the Y axis. For example, referring to FIG. 12C a pivot housing 1220 (which may be substantially similar to pivot housing 1130) may be provided such that the housing 851C1 of drive portion 800, 801 is coupled to the pivot housing 1220 by sealed support member 560 in a manner substantially similar to that described above with respect to FIG. 11D. Here rotation of the pivot housing(s) 1220 and/or housing 1250, 1251 allows for adjustment of angle β while movement of one or more drive portions 800, 801 along the Y axis allows a distance D1, D2 between an the axis of extension/retraction R1, R2 and the common axis CAX to be adjusted for automatic workpiece centering and/or independent workpiece placement adjustment for workpiece holding station location variations between the facets of the, for example, the transfer modules 125A, 125B, 125C, 125D.

In one aspect, referring to FIGS. 11A-12C, any suitable number of controllers 110A, 110B may be disposed within the transfer unit modules described herein. In one aspect there may be a controller for one or more drives within the transfer unit modules. These controllers 110A, 110B may be connected to controller 110 or any other suitable controller. As described above, in one aspect the controllers 110A, 110B may be part of a clustered control architecture, while in other aspects the controllers may have any suitable architecture. It should be understood that any one or more of the transfer unit modules described herein, in one aspect, includes any suitable number of controllers within the transfer unit modules for effecting one or more of linear and rotation movement of the end effector(s).

Figure 13:
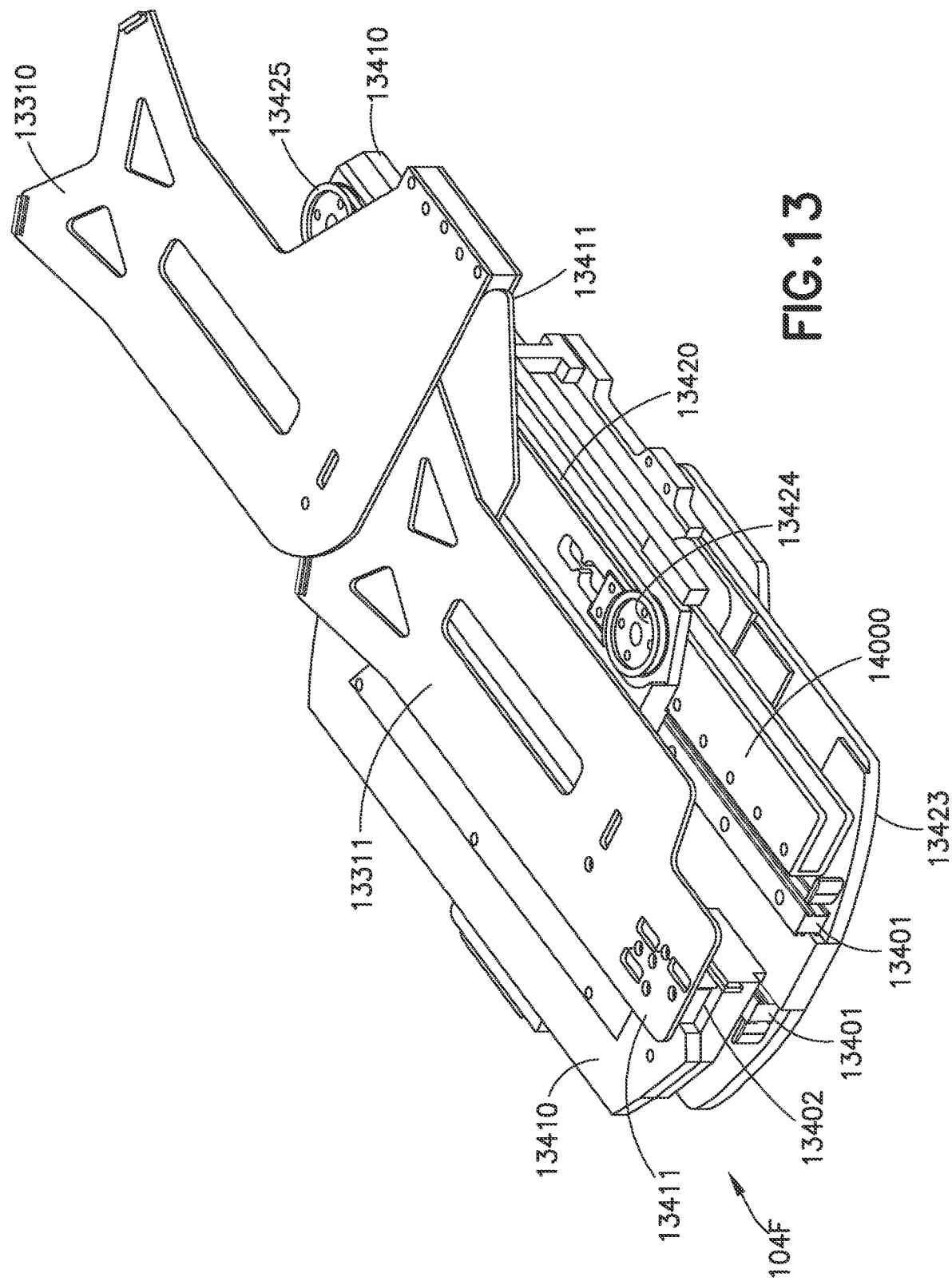
FIGS. 13, 14 and 15 are schematic illustrations of portions of a substrate transport apparatus in accordance with aspects of the disclosed embodiment.

Referring to FIG. 13 a transfer unit module is 104F is illustrated in accordance with aspects of the disclosed embodiment. The transfer unit module 104F may be substantially similar to transfer unit module 104 described above. In this aspect dual wafer extensions or end effectors 13310, 13311 are located inside of linear drive chamber, such as the transport chambers 125A, 125B, 125C, 125D, 125E described herein, where the drive section 200 (which in one aspect includes a frame 200F that houses one or more of a Z axis drive 270 and a rotational drive section 282 as described above) is positioned outside of the transfer chamber 301 for the reason discussed above.

Figure 14:
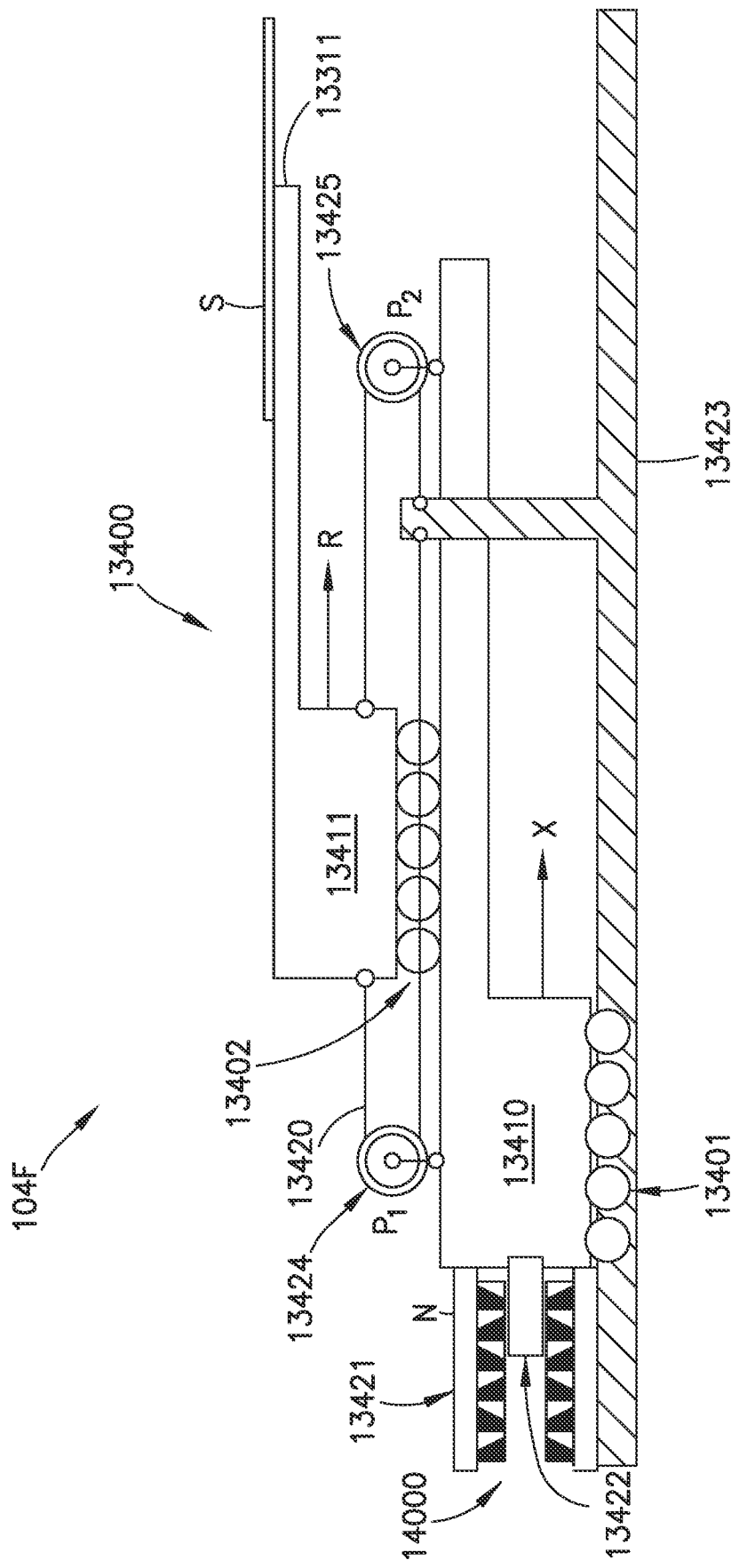
Figure 15:
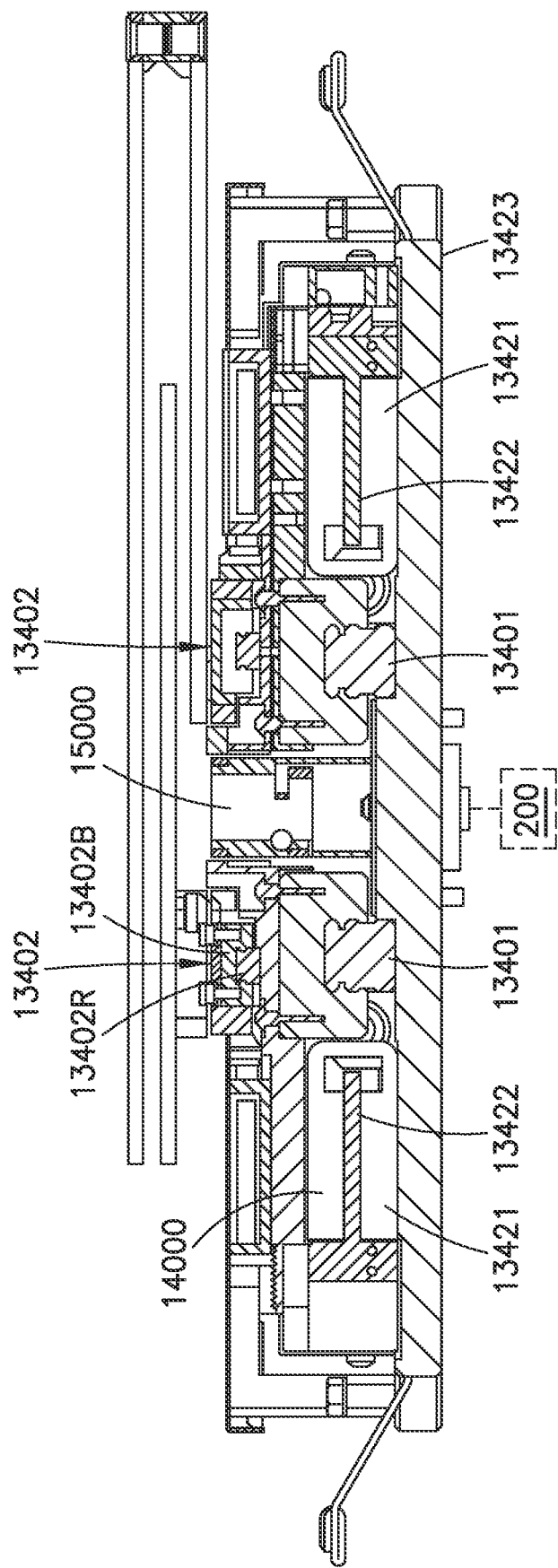

Referring also to FIG. 14 a schematic diagram of an exemplary single linear drive 13400, according to an aspect of the disclosed embodiment is shown. In one aspect, the upper end effector 13310 and the lower end effector 13311 of arm 104E are each driven by a respective single linear drive 13400 to effect independent extension and retraction of each end effector 13310, 13311. In other aspects the end effectors 13310, 13311 are extended and retracted by any suitable drive, such as those described herein, in any suitable manner. As can be seen in FIG. 14, each end effector is connected to an end effector stage 13411 that supports the end effector 13310, 13311 in any suitable manner. In one aspect the end effector stage 13411 forms a respective portion of end effector 13310, 13311 where the end effector stage is integrally formed with the end effector while in other aspects, the end effector stage is coupled to the end effector 13310, 13311 in any suitable manner. In one aspect, the single linear drive 13400 is an articulated mechanism (e.g. where a duplex linear extension of both the end effector stage and intermediate stage is effected by a single or one degree of freedom drive), whereby the motion of the end effector stage 13411 is amplified, by any suitable transmission, two times that of the intermediate stage 13410, where the intermediate stage 13410 connects the end effector stage 13411 (and hence the end effector 13310, 13311) to the table plate or arm base member 13423 as will be described below. As may be realized, in other aspects the motion of the end effector stage is amplified relative to the intermediate stage 13410 by any suitable amount (e.g. more than two times) or is extended on a 1:1 ratio. In one aspect, the amplification is achieved by moving the intermediate stage 13410 via the belt 13420 which is stretched between two pulleys 13424, 13425 mounted to, for example, opposite ends of the intermediate stage 13410 in any suitable manner. In other aspects, the pulleys 13424, 13425 are mounted at any suitable respective locations of the intermediate stage 13410. This articulation design effects a 1:2 extension/retraction ratio between the motions of the intermediate stage 13410 and the end-effector stage 13411, represented by X and R coordinates respectively. In one aspect, the intermediate stage 13410 is driven by any suitable linear motor 14000. For example, the linear motor 14000 includes a drive portion or stator 13421 and a driven portion 13422. At least the driven portion 13422 of the linear motor 14000 is mounted on the intermediate stage 13410, and hence moves with the intermediate stage 13410. The intermediate stage 13410 glides along the table plate 13423 on, for example, any suitable linear bearing such as, for example, intermediate linear bearing 13401 which is mounted to the table plate 13423. An end effector linear bearing 13402, which is mounted to the intermediate stage 13410, imparts the articulated motion to the end effector stage 13411. The end effector bearing 13402 includes one or more bearing blocks 13402B and a rail 13402R where the one or more bearing blocks 13402B ride along the rail 13402R. In one aspect, the end effector bearing 13402 includes two bearing blocks 13402B while in other aspects the end effector bearing 13402 includes more than two bearing blocks 13402B. As may be realized, the end effector bearing 13402 is substantially similar to the intermediate linear bearing 13401. Any suitable number of linear encoders 15000 is attached to one or more of the intermediate stage 13410 and the end effector stage 13411 to provide position feedback for the motion control of the end effector extension/retraction.

Figure 16A:
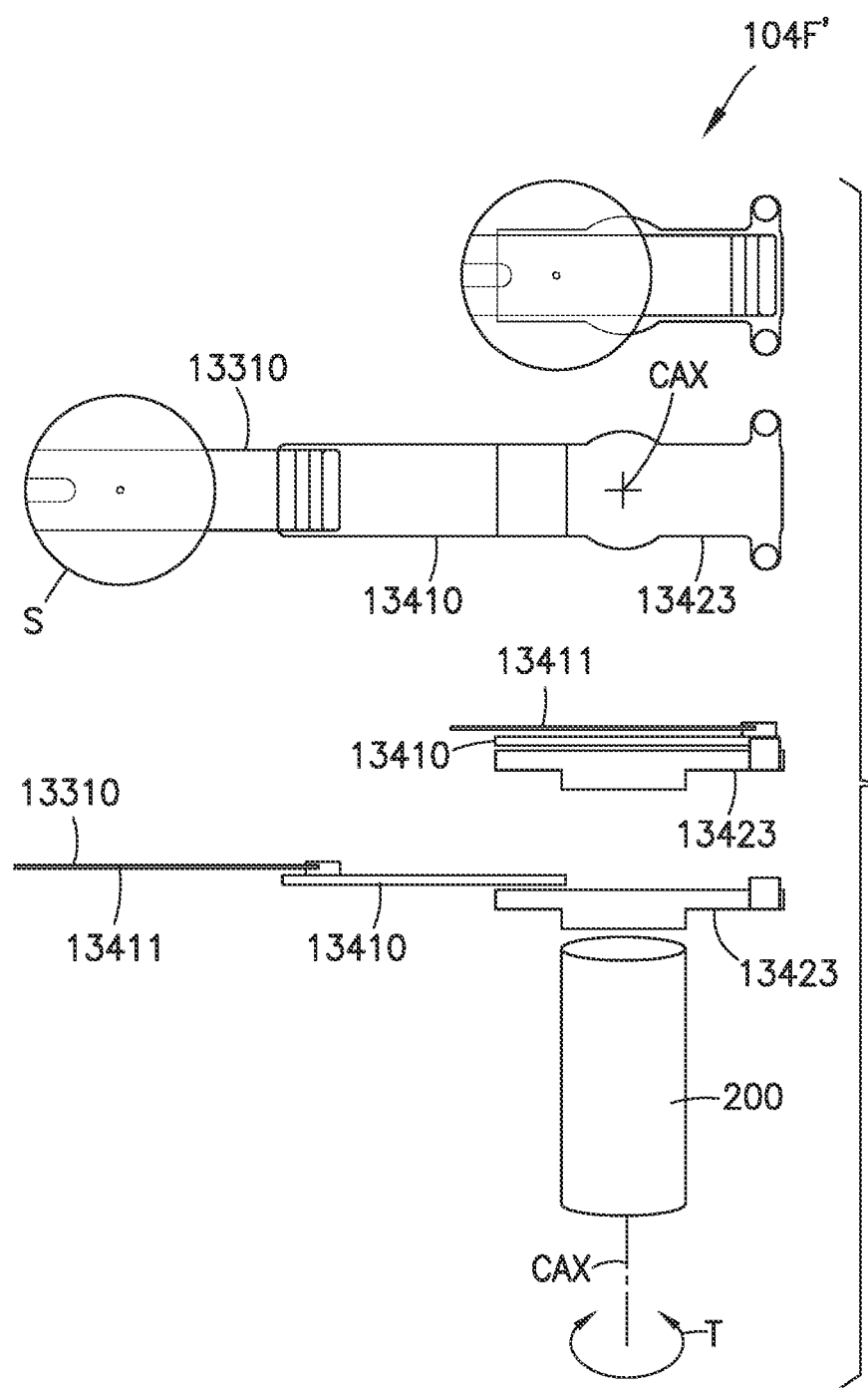
FIGS. 16A-16C are schematic illustrations of a substrate transport apparatus in accordance with aspects of the disclosed embodiment.
Figure 16C:
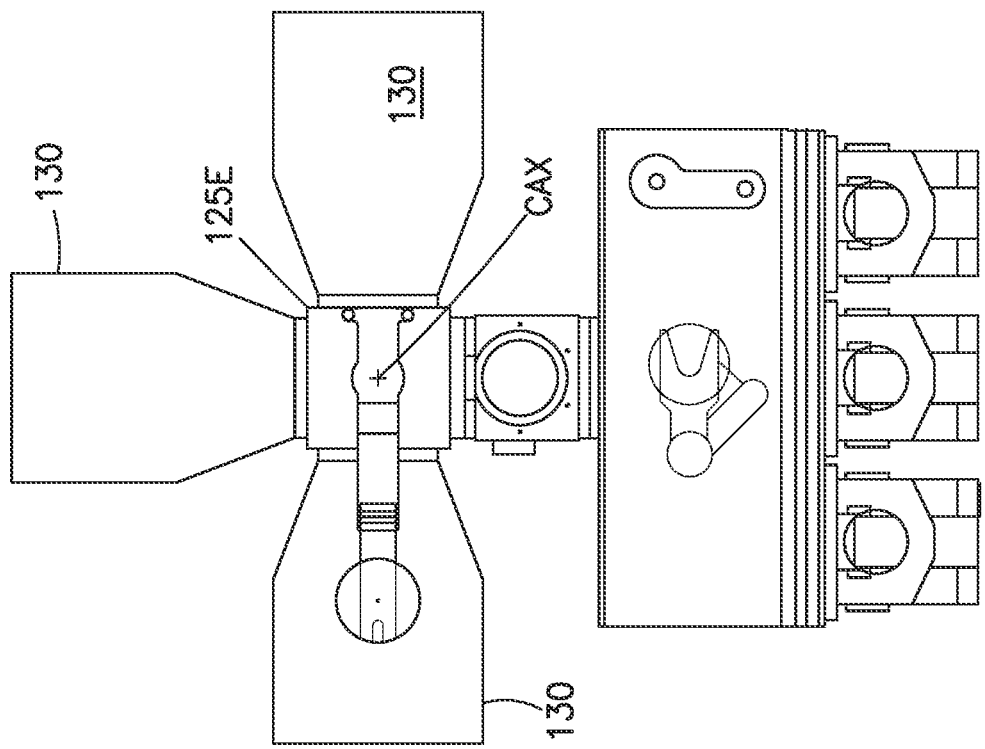
Figure 16B:
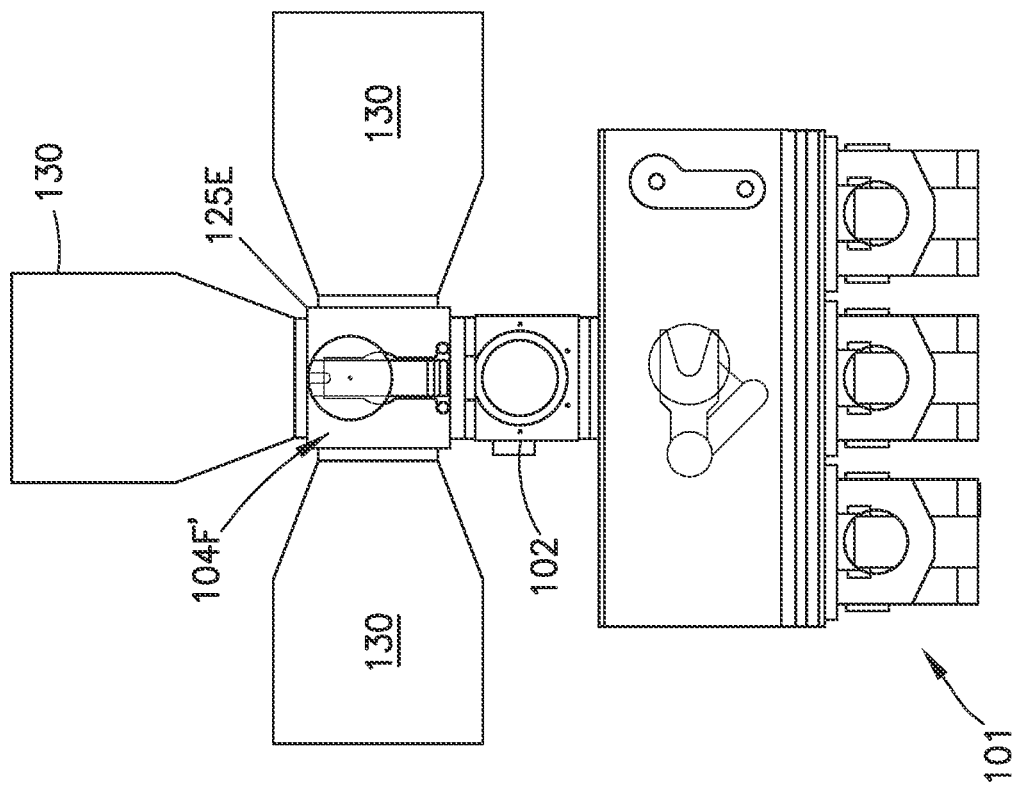

Referring now to FIGS. 16A-16C a transfer unit module 104F' is illustrated in extended and retracted configurations in accordance with aspects of the disclosed embodiment. The transfer unit module 104F' is substantially similar to transfer unit modules 104F described above and is employed in any one or more of the transport chambers 125A, 125B, 125C, 125D, 125E described herein in a manner substantially similar to that described with respect to transfer unit modules 104. Here one end effector 13310 is illustrated for exemplary purposes only and it should be understood that, in other aspects, the transfer unit module 104F' includes any suitable number of end effectors, such as end effectors 13310, 13311. In one aspect, the end effector stage 13411 and end effector 13310 (referred to herein for explanation purposes as the end effector 13310) have a combined length that is greater than the length of the intermediate stage 13410 to form an extension arm having unequal length links or members. In another aspect, the end effector 13310 has a length that is substantially equal to the length of the intermediate stage 13410 to form an extension arm having equal length links or members. In this aspect the center of rotation of the transfer unit module 104F' is substantially coincident with axis CAX, which in one aspect is an axis of rotation of drive section 200, such that the axis CAX is located substantially at a midpoint of the table plate 13423.

Figure 17C:
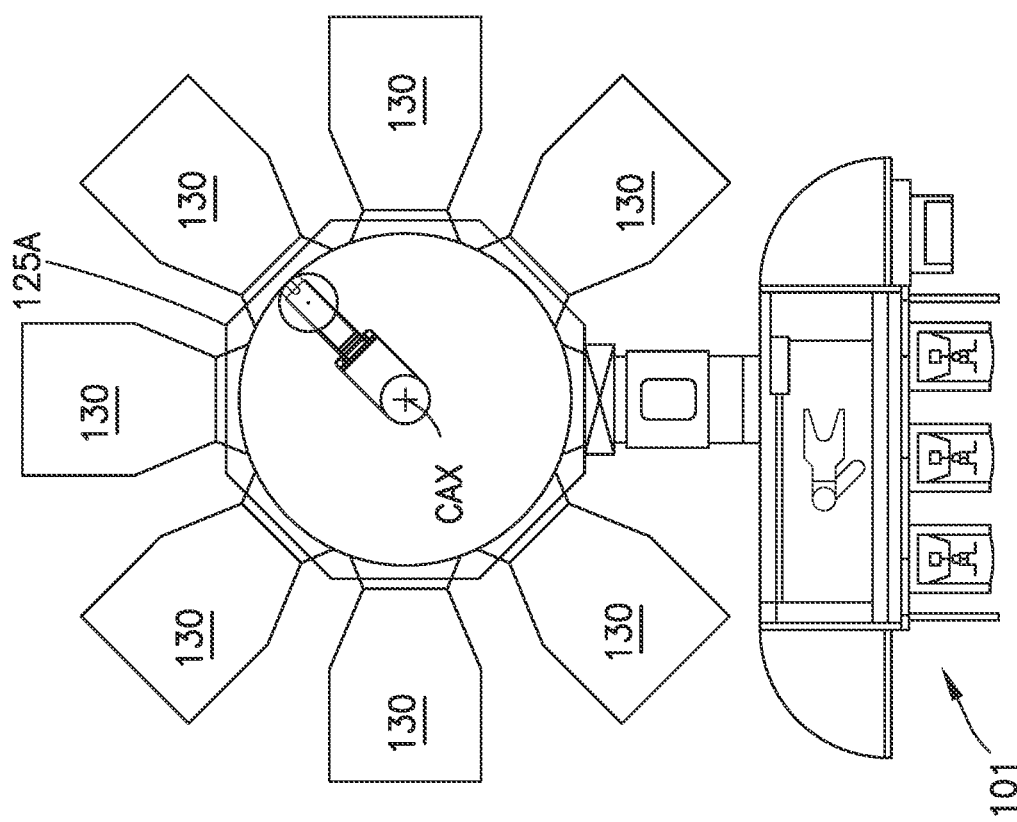
Figure 17B:
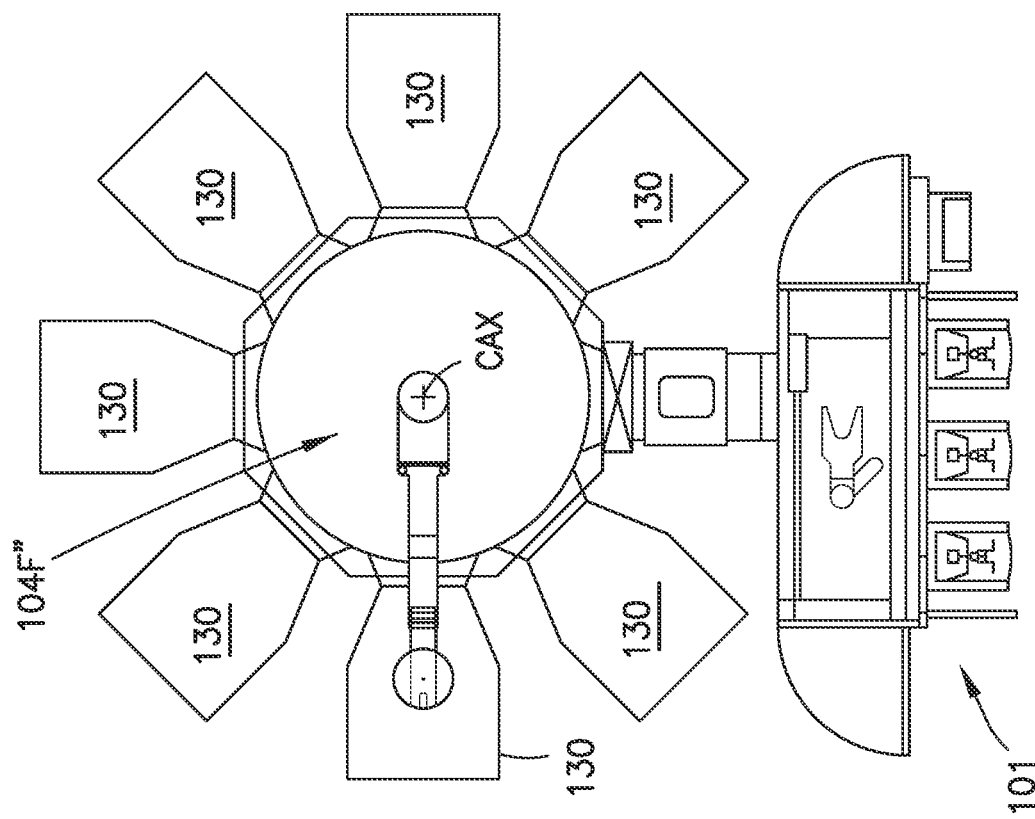

Referring now to FIGS. 17A-17C a transfer unit module 104F" is illustrated in extended and retracted configurations in accordance with aspects of the disclosed embodiment. The transfer unit module 104F" is substantially similar to transfer unit modules 104F described above and is employed in any one or more of the transport chambers 125A, 125B, 125C, 125D, 125E described herein in a manner substantially similar to that described with respect to transfer unit modules 104. Here one end effector 13310 is illustrated for exemplary purposes only and it should be understood that, in other aspects, the transfer unit module 104F' includes any suitable number of end effectors, such as end effectors 13310, 13311. In one aspect, the end effector stage 13411 and end effector 13310 (referred to herein for explanation purposes as the end effector 13310) have a combined length that is greater than the length of the intermediate stage 13410 to form an extension arm having unequal length links or members. In another aspect, the end effector 13310 has a length that is substantially equal to the length of the intermediate stage 13410 to form an extension arm having equal length links or members. In this aspect the center of rotation of the transfer unit module 104F' is substantially coincident with axis CAX, which in one aspect is an axis of rotation of drive section 200, such that the axis CAX is located at an end of the table plate 13423 (e.g. the axis CAX is offset from a midpoint of the table plate 13423).

Figure 18:
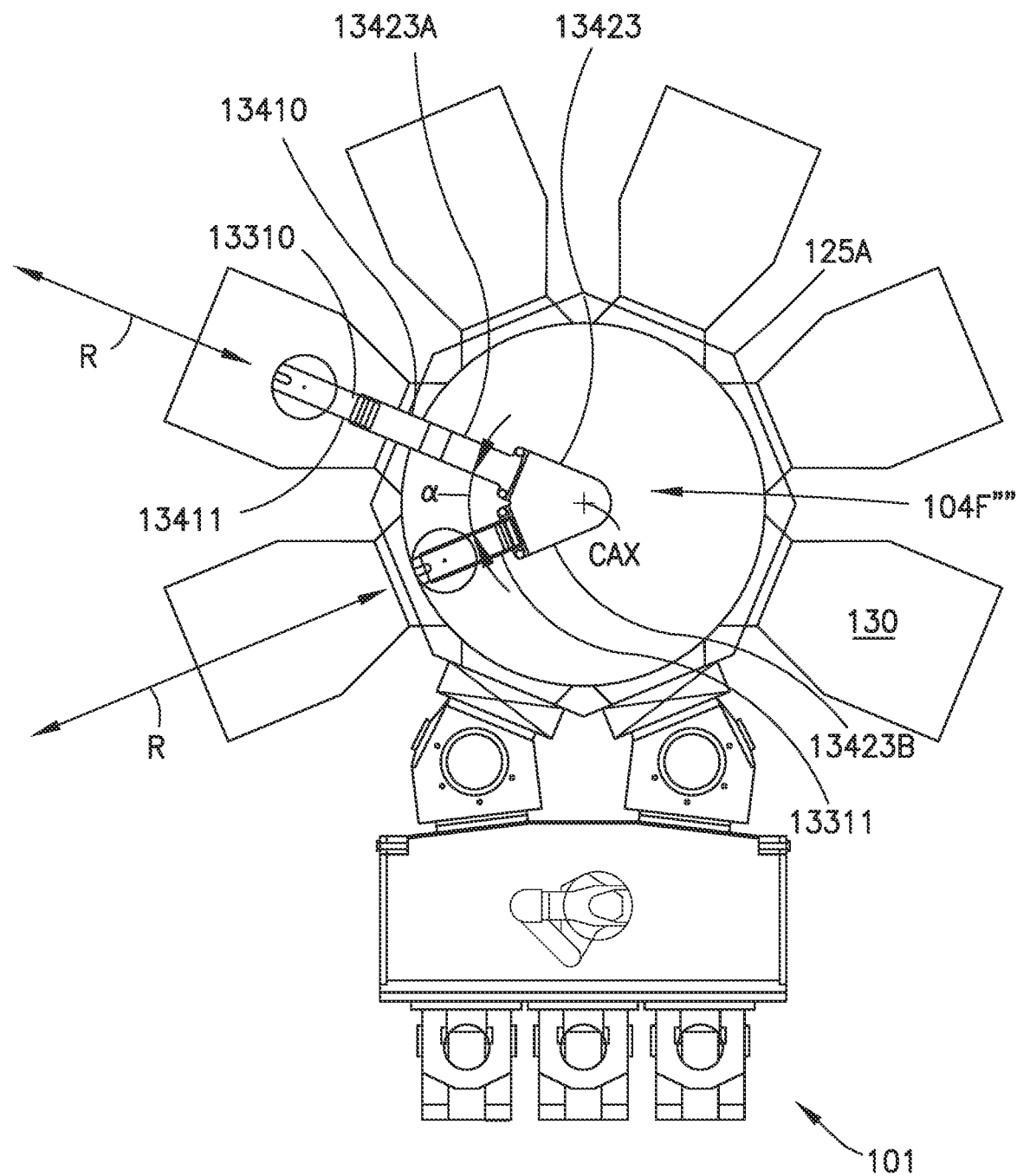
FIG. 18 is a schematic illustration of a substrate transport apparatus in accordance with aspects of the disclosed embodiment.

Referring now to FIG. 18 a transfer unit module 104F''' is illustrated in extended and retracted configurations in accordance with aspects of the disclosed embodiment. The transfer unit module 104F''' is substantially similar to transfer unit modules 104F described above and is employed in for example, transport chamber 125A described herein (or any other suitable transfer chamber where facets of the chamber have a polygonal arrangement) in a manner substantially similar to that described with respect to transfer unit modules 104. Here the table plate 13423 is a substantially rigid link having a substantially "U" or "V" shape that extends away from a main shoulder axis of rotation (e.g. axis CAX) of the transfer unit module 104F''' so that an axis of extension and retraction of at least two of the multiple arms disposed on the table plate 13423 are angled relative to one another and end effector seating plane SP of the at least two of the multiple arms are substantially coplanar. In one aspect at least one arm is mounted substantially at each opposite end of the arm base member. In this aspect, the table plate 13423 includes a first portion 13423A and a second portion 13423B that are angled relative to each other about the axis CAX by any suitable angle α that allows the end effectors 13310, 13311 mounted to the first and second portions 13423A, 13423B access to adjacent process modules 130 (e.g. the axes of extension/retraction R of the end effector(s) mounted on the first portion and axes of extension/retraction R of the end effector(s) mounted on the second portion are angled relative to each other by the angle α). In one aspect, the angle α between the first and second portions 13423A, 13423B is adjustable while in other aspects the angle α is fixed and cannot be changed. Here end effector 13310 illustrated as being mounted to portion 13423A while end effector 13311 is mounted to portion 13423B for exemplary purposes only and it should be understood that, in other aspects, the transfer unit module 104F'''' includes any suitable number of end effectors stacked one over the other on each of the first and second portions 13423A, 13423B. In one aspect, the end effectors 13310, 13311 have a length that is greater than the length of the intermediate stage 13410 to form an extension arm having unequal length links or members. In another aspect, the end effector 13310 has a length that is substantially equal to the length of the intermediate stage 13410 to form an extension arm having equal length links or members.

Figure 19:
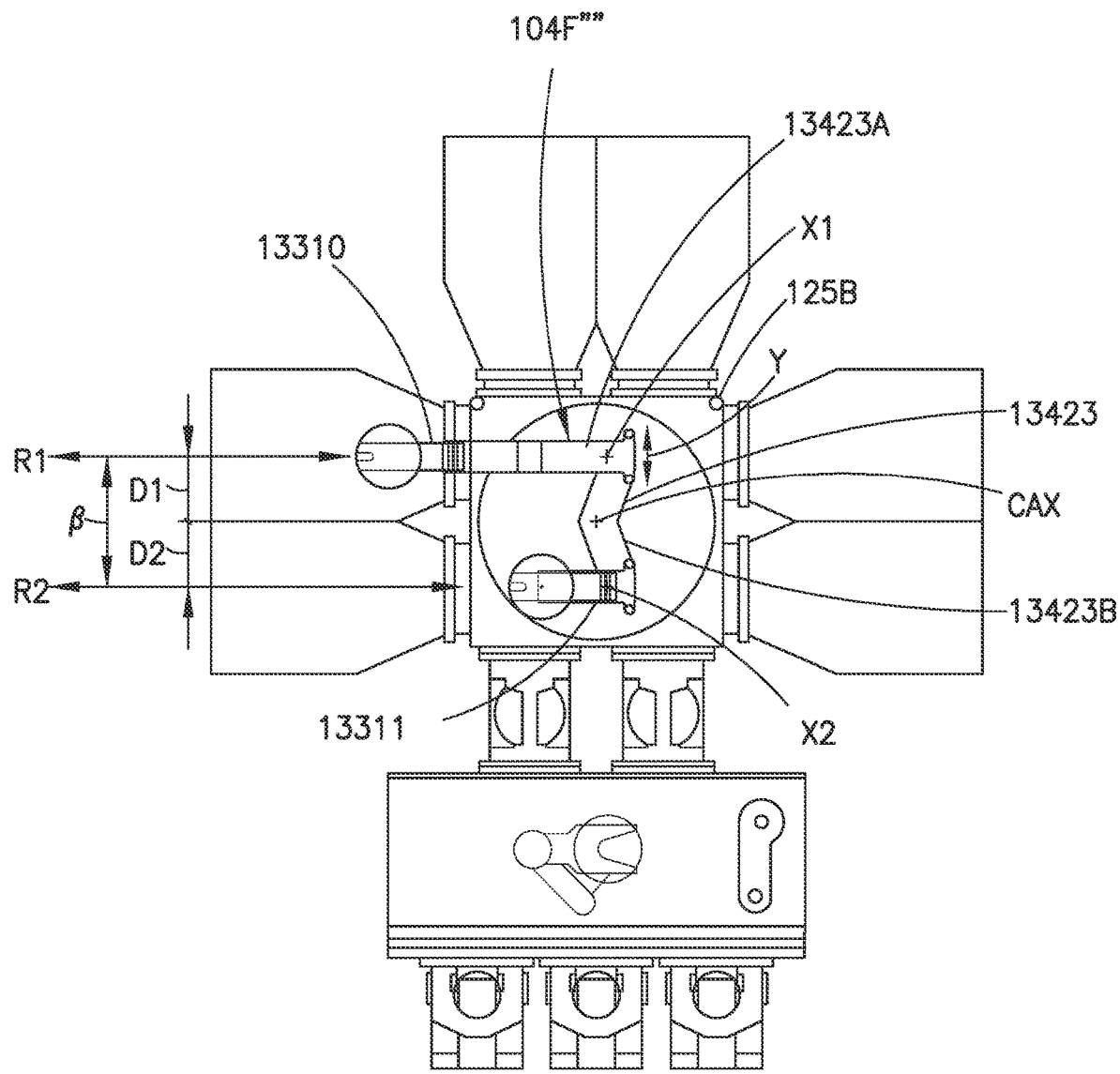
FIG. 19 is a schematic illustration of a substrate transport apparatus in accordance with aspects of the disclosed embodiment.

Referring now to FIG. 19 a transfer unit module 104F'''' is illustrated and is substantially similar to transfer unit module 104F''' described above. However, in this aspect, the table plate 13423 is arranged so that the end effectors 13310, 13311 mounted to the first and second portions 13423A, 13423B (at opposite ends of the table plate 13423) access adjacent process modules 130 such that the axes of extension/retraction R of the end effector(s) mounted on the first portion and axes of extension/retraction R1, R2 of the end effector(s) mounted on the second portion are substantially parallel with each other. In one aspect an end effector seating plane SP of at least one arm on the first portion 13423A is substantially coplanar with an end effector seating plane SP of at least one arm on the second portion 13423B. Here the axes R1, R2 are disposed respective distances D1, D2 from the axis CAX (and are located a distance β from each other). In one aspect one or more of the distances D1, D2 (and hence the distance β) is adjustable in a manner substantially similar to that described above. In other aspects one or more of the end effectors 13310, 13311 mounted to the first and second portions 13423A, 13423B is rotatable relative to the table plate 13423 about respective axes X1, X2 in a manner substantially similar to that described above. In still other aspects, one or more of the distances D1, D2 are adjustable and one or more of the end effectors 13310, 13311 mounted to the first and second portions 13423A, 13423B is rotatable relative to the table plate 13423 in a manner substantially similar to that described above.

Figure 20:
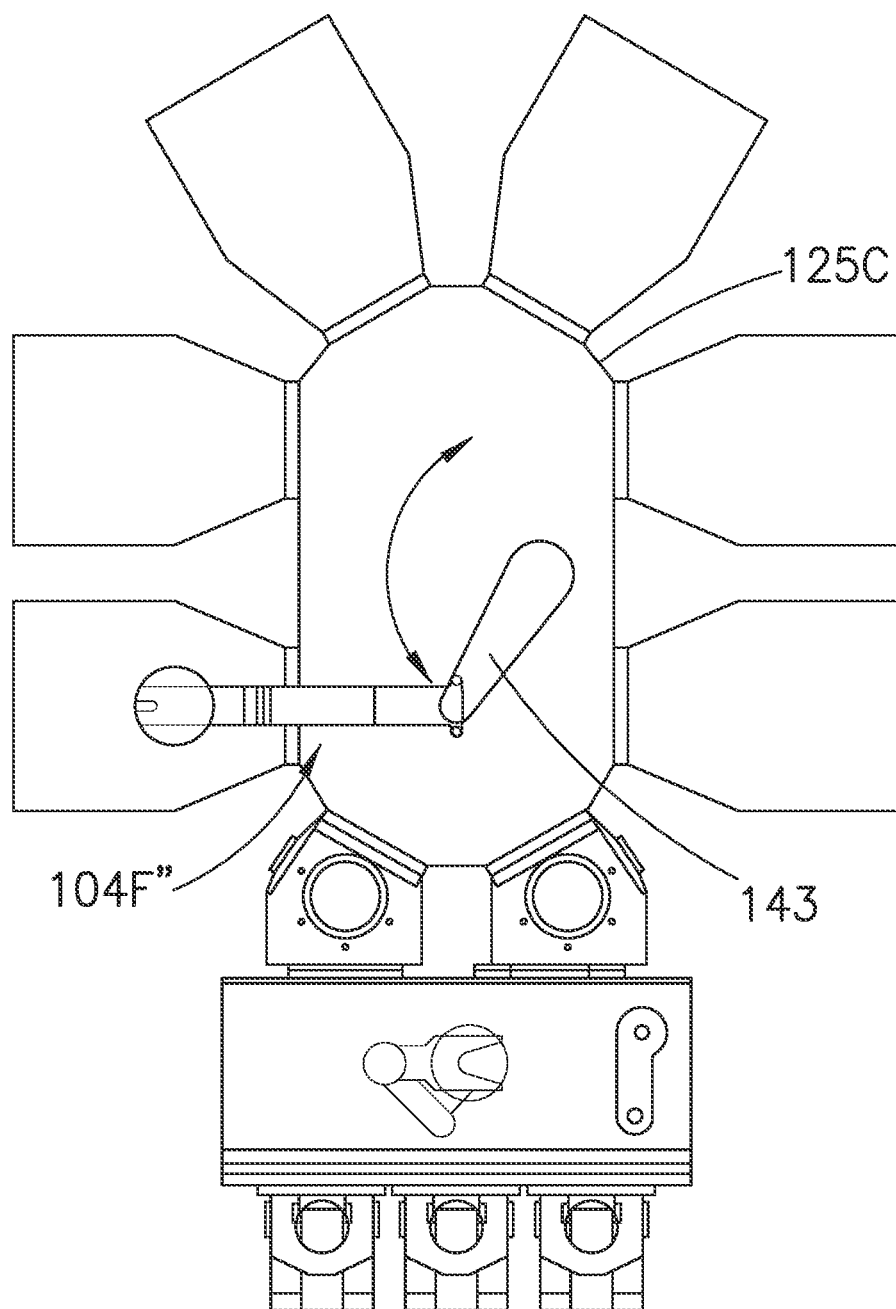
FIG. 20 is a schematic illustration of a substrate transport apparatus in accordance with aspects of the disclosed embodiment.
Figure 21:
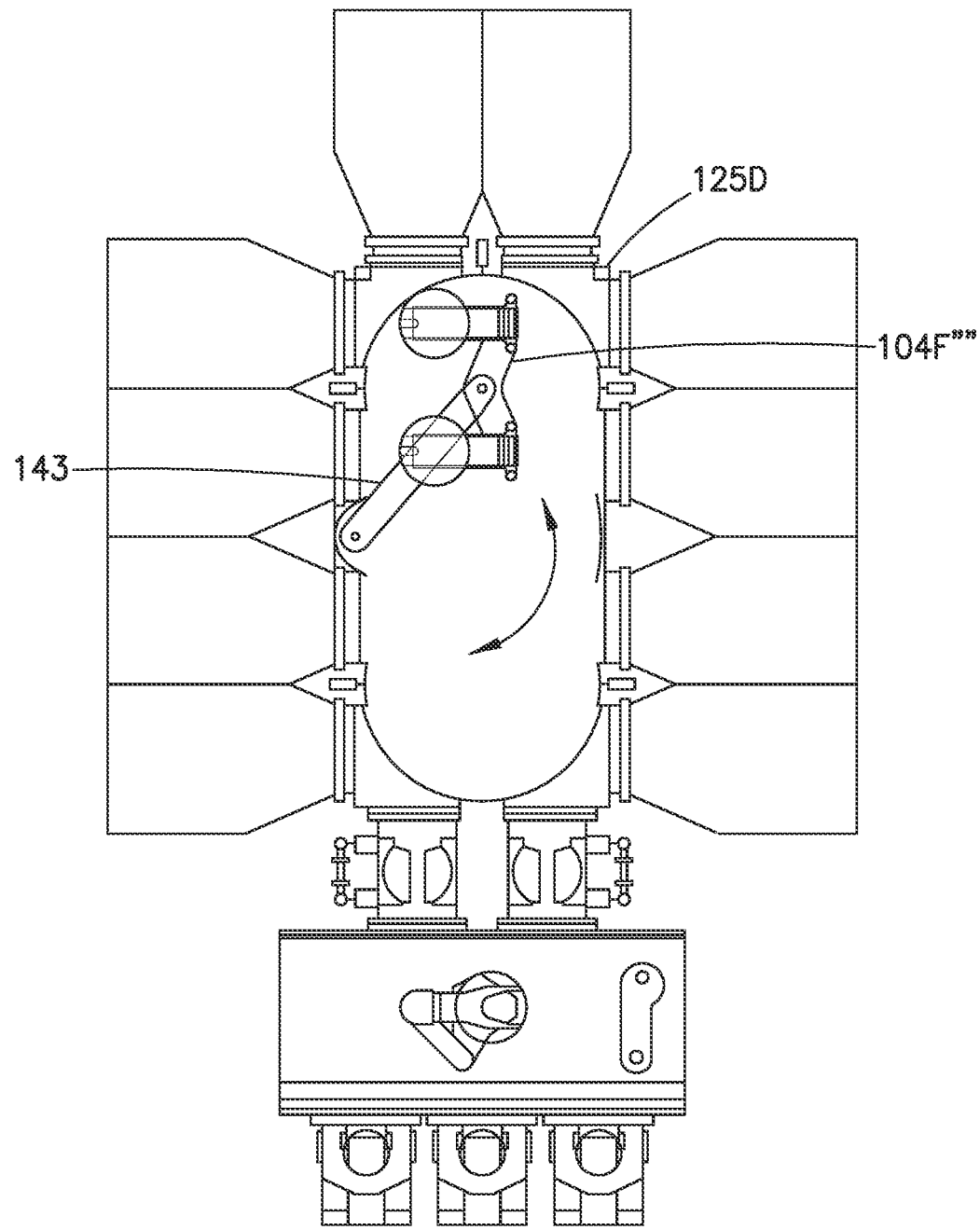
FIG. 21 is a schematic illustration of a substrate transport apparatus in accordance with aspects of the disclosed embodiment.

FIGS. 20 and 21 illustrate examples of how the transfer unit modules 104F, 104F', 104F'', 104F''', 104F'''' are mounted to a boom arm 143. For example, each of the transfer unit modules 104F, 104F', 104F'', 104F''', 104F'''' are mounted to the boom arm 143 in a manner substantially similar to that described above with respect to transfer unit module 104.

In accordance with one or more aspects of the disclosed embodiment a transfer apparatus includes a frame; multiple arms connected to the frame, each arm having an end effector and an independent drive axis for extension and retraction of the respective arm with respect to other ones of the multiple arms; a linear rail defining a degree of freedom for the independent drive axis for extension and retraction of at least one arm; and a common drive axis shared by each arm and configured to pivot the multiple arms about a common pivot axis; wherein at least one of the multiple arms having another drive axis defining an independent degree of freedom with respect to other ones of the multiple arms.

In accordance with one or more aspects of the disclosed embodiment the other drive axis defining the independent degree of freedom is angled with respect to the axis for extension and retraction.

In accordance with one or more aspects of the disclosed embodiment the other drive axis defining the independent degree of freedom is arranged so that the independent degree of freedom is coplanar with a seating plane of the end effector.

In accordance with one or more aspects of the disclosed embodiment the other drive axis defining the independent degree of freedom is arranged so that the independent degree of freedom is angled with respect to other independent degrees of freedom.

In accordance with one or more aspects of the disclosed embodiment the other drive axis defining the independent degree of freedom is arranged so that the independent degree of freedom is parallel with respect to other independent degrees of freedom.

In accordance with one or more aspects of the disclosed embodiment the transfer apparatus further includes a second common drive axis configured to move the multiple arms in unison about a common axis.

In accordance with one or more aspects of the disclosed embodiment the other drive axis effects automatic workpiece centering.

In accordance with one or more aspects of the disclosed embodiment the other drive axis effects independent workpiece placement adjustment for workpiece holding station location variations.

In accordance with one or more aspects of the disclosed embodiment the multiple arms are telescoping arms.

In accordance with one or more aspects of the disclosed embodiment the transfer apparatus includes an arm base member connected to the frame, each of the multiple arms being mounted to the arm base member so that an axis of extension and retraction of at least two of the multiple arms are spaced apart from one another.

In accordance with one or more aspects of the disclosed embodiment a spacing between the at least two of the multiple arms is adjustable.

In accordance with one or more aspects of the disclosed embodiment the transfer apparatus includes an arm base member connected to the frame, each of the multiple arms being mounted to the arm base member so that an axis of extension and retraction of at least two of the multiple arms are angled relative to one another.

In accordance with one or more aspects of the disclosed embodiment the arm base member has a substantial U shape or a substantial V shape having at least one of the multiple arms mounted substantially at each opposite end of the arm base member.

In accordance with one or more aspects of the disclosed embodiment an angle between the at least two of the multiple arms is adjustable.

In accordance with one or more aspects of the disclosed embodiment a transfer apparatus includes a frame; multiple arms connected to the frame, each arm having an end effector and an independent drive axis for extension and retraction of the respective arm to transport a workpiece into and out of a transport chamber; a linear drive axis defining another degree of freedom, for at least one arm, that is coplanar with a seating plane of the end effector; and a common drive axis shared by each arm and configured to pivot the multiple arms about a common pivot axis; wherein at least one of the multiple arms having another drive axis defining an independent degree of freedom with respect to other ones of the multiple arms.

In accordance with one or more aspects of the disclosed embodiment the other drive axis defining the independent degree of freedom is angled with respect to the axis for extension and retraction.

In accordance with one or more aspects of the disclosed embodiment the other drive axis defining the independent degree of freedom is arranged so that the independent degree of freedom is coplanar with a seating plane of the end effector.

In accordance with one or more aspects of the disclosed embodiment the other drive axis defining the independent degree of freedom is arranged so that the independent degree of freedom is angled with respect to other independent degrees of freedom.

In accordance with one or more aspects of the disclosed embodiment the other drive axis defining the independent degree of freedom is arranged so that the independent degree of freedom is parallel with respect to other independent degrees of freedom.

In accordance with one or more aspects of the disclosed embodiment the transfer apparatus further includes a second common drive axis configured to move the multiple arms in unison about a common axis.

In accordance with one or more aspects of the disclosed embodiment the independent degree of freedom effects automatic workpiece centering.

In accordance with one or more aspects of the disclosed embodiment the independent degree of freedom effects independent workpiece placement adjustment for workpiece holding station location variations.

In accordance with one or more aspects of the disclosed embodiment the multiple arms are telescoping arms.

In accordance with one or more aspects of the disclosed embodiment the transfer apparatus includes an arm base member connected to the frame, each of the multiple arms being mounted to the arm base member so that an axis of extension and retraction of at least two of the multiple arms are spaced apart from one another.

In accordance with one or more aspects of the disclosed embodiment a spacing between the at least two of the multiple arms is adjustable.

In accordance with one or more aspects of the disclosed embodiment the transfer apparatus includes an arm base member connected to the frame, each of the multiple arms being mounted to the arm base member so that an axis of extension and retraction of at least two of the multiple arms are angled relative to one another.

In accordance with one or more aspects of the disclosed embodiment the arm base member has a substantial U shape or a substantial V shape having at least one of the multiple arms mounted substantially at each opposite end of the arm base member.

In accordance with one or more aspects of the disclosed embodiment an angle between the at least two of the multiple arms is adjustable.

In accordance with one or more aspects of the disclosed embodiment a transfer apparatus includes a frame forming a sealed chamber having a chamber atmosphere; multiple arms connected to the frame and disposed within the sealed chamber, each arm having an independent drive axis for extending and retracting the respective arm; a first drive section disposed outside the sealed chamber and connected to the multiple arms for moving the multiple arms about a common axis; and a second drive section disposed inside the sealed chamber, the second drive section including a sealed housing configured to hold a sealed atmosphere different than the chamber atmosphere; wherein the sealed housing has a first sealed portion including a first drive axis for a first degree of freedom for at least one arm and a second sealed portion in sealed communication with the first sealed portion and including a second drive axis for a second degree of freedom of at least one arm.

In accordance with one or more aspects of the disclosed embodiment at least one of the multiple arms includes a second degree of freedom independent of the drive axis for extending and retracting the respective arm.

In accordance with one or more aspects of the disclosed embodiment the second degree of freedom effects automatic workpiece centering.

In accordance with one or more aspects of the disclosed embodiment the second degree of freedom effects independent workpiece placement adjustment for workpiece holding station location variations.

In accordance with one or more aspects of the disclosed embodiment the sealed housing includes an opening in the sealed housing through which the second sealed portion communicates with the first sealed portion.

In accordance with one or more aspects of the disclosed embodiment at least one of the first and second degree of freedom is angled with respect to an axis of extension and retraction of a respective arm.

In accordance with one or more aspects of the disclosed embodiment at least one of the first and second degree of freedom is coplanar with a seating plane of the end effector.

In accordance with one or more aspects of the disclosed embodiment at least one of the first and second degree of freedom is angled with respect to other independent degrees of freedom.

In accordance with one or more aspects of the disclosed embodiment at least one of the first and second degree of freedom is parallel with respect to other independent degrees of freedom.

In accordance with one or more aspects of the disclosed embodiment the first drive section includes a common rotational drive axis configured to rotate the multiple arms in unison about a common axis of rotation.

In accordance with one or more aspects of the disclosed embodiment the multiple arms are telescoping arms.

In accordance with one or more aspects of the disclosed embodiment the transfer apparatus includes an arm base member connected to the frame, each of the multiple arms being mounted to the arm base member so that an axis of extension and retraction of at least two of the multiple arms are spaced apart from one another.

In accordance with one or more aspects of the disclosed embodiment a spacing between the at least two of the multiple arms is adjustable.

In accordance with one or more aspects of the disclosed embodiment the transfer apparatus includes an arm base member connected to the frame, each of the multiple arms being mounted to the arm base member so that an axis of extension and retraction of at least two of the multiple arms are angled relative to one another.

In accordance with one or more aspects of the disclosed embodiment the arm base member has a substantial U shape or a substantial V shape having at least one of the multiple arms mounted substantially at each opposite end of the arm base member.

In accordance with one or more aspects of the disclosed embodiment an angle between the at least two of the multiple arms is adjustable.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

The invention claimed is:

1. A transfer apparatus comprising:
a frame forming a sealed chamber having a chamber atmosphere;
multiple arms connected to the frame and disposed within the sealed chamber, each arm being a multi-link arm and having an independent drive axis for extending and retracting the respective arm so that a first multi-link arm has a first independent drive axis, and a second multi-link arm has a second independent drive axis different than the first independent drive axis;
an outside drive section located outside the sealed chamber and connected to the multiple arms for moving the multiple arms about a common axis; and
an inside drive section located inside the sealed chamber, the inside drive section including a sealed housing configured to hold a sealed atmosphere different than the chamber atmosphere;
wherein the sealed housing has different sealed motors distributed in the sealed chamber, including: a first sealed rotary motor for a first drive axis that describes the first independent drive axis of at least the first multi-link arm, and a second sealed rotary motor, sealed apart from the first sealed rotary motor, and providing a second drive axis that is different than the first drive axis, where the second drive axis describes the second independent drive axis of the at least second multi-link arm,
wherein the first independent drive axis, and second independent drive axis are each independent of each other and outside the sealed housing.

2. The transfer apparatus of claim 1, wherein the first sealed rotary motor has a first drive shaft that corresponds to the first drive axis, and the second sealed rotary motor has a second drive shaft that corresponds to the second drive axis.

3. The transfer apparatus of claim 2, wherein the first drive shaft and second drive shaft extend outside the sealed housing, the first drive shaft and second drive shaft impart impetus of the corresponding first drive axis and second drive axis outside the sealed housing so as to respectively describe the first independent drive axis and second independent drive axis.

4. The transfer apparatus of claim 1, wherein the first sealed rotary motor is configured for more than one drive axis that includes the first drive axis, and another drive axis projecting from the sealed housing and defining a different degree of freedom, of the first multilink arm, than the first drive axis describing the first independent drive axis of the first multilink arm.

5. The transfer apparatus of claim 4, wherein the different drive axis effects automatic workpiece centering.

6. The transfer apparatus of claim 4, wherein the different drive axis effects independent workpiece placement adjustment for workpiece holding station location variations.

7. The transfer apparatus of claim 1, wherein the sealed housing includes an opening in the sealed housing through which the second sealed rotary motor communicates with the first sealed rotary motor.

8. The transfer apparatus of claim 1, wherein the outside drive section includes a drive shaft that forms a rotational drive axis that is common to the multiple arms, the outside drive section is configured to rotate the multiple arms in unison with the drive shaft about the rotational drive axis common to the multiple arms.

9. The transfer apparatus of claim 1, wherein the multiple arms are telescoping arms.

10. A method comprising:
providing a transfer apparatus comprising:
a frame forming a sealed chamber having a chamber atmosphere,
multiple arms connected to the frame and disposed within the sealed chamber, each arm being a multi-link arm and having an independent drive axis for extending and retracting the respective arm so that a first multi-link arm has a first independent drive axis, and a second multi-link arm has a second independent drive axis different than the first independent drive axis,
an outside drive section located outside the sealed chamber and connected to the multiple arms, and
an inside drive section located inside the sealed chamber, the inside drive section including a sealed housing configured to hold a sealed atmosphere different than the chamber atmosphere, where the sealed housing has different sealed motors distributed in the sealed chamber, comprising:
a first sealed rotary motor for a first drive axis describing the first independent drive axis of at least the first multi-link arm, and
a second sealed rotary motor sealed apart from the first sealed rotary motor, and providing a second drive axis that is different than the first drive axis, the second drive axis describing the second independent drive axis of the at least second multi-link arm; and
moving, with the outside drive section, the multiple arms about a common axis;
wherein the first independent drive axis and second independent drive axis are each independent of each other and outside the sealed housing.

11. The method of claim 10, wherein the first sealed rotary motor has a first drive shaft corresponding to the first drive axis, and the second sealed rotary motor has a second drive shaft corresponding to the second drive axis.

12. The method of claim 11, wherein the first drive shaft and second drive shaft extend outside the sealed housing, the first drive shaft and second drive shaft impart impetus of the corresponding first drive axis and second drive axis outside the sealed housing so as to respectively describe the first independent drive axis and second independent drive axis.

13. The method of claim 10, wherein the first sealed rotary motor is configured for more than one drive axis that includes the first drive axis, and another drive axis projecting from the sealed housing and defining a different degree of freedom, of the first multilink arm, than the first drive axis describing the first independent drive axis of the first multilink arm.

14. The method of claim 13, further comprising effecting, with the different drive axis, automatic workpiece centering.

15. The method of claim 13, further comprising effecting, with the different drive axis, independent workpiece placement adjustment for workpiece holding station location variations.

16. The method of claim 10, wherein the sealed housing includes an opening in the sealed housing through which the second sealed rotary motor communicates with the first sealed rotary motor.

17. The method of claim 10, wherein the outside drive section includes a drive shaft that forms a rotational drive axis that is common to the multiple arms, the outside drive section rotates the multiple arms in unison with the drive shaft about the rotational drive axis common to the multiple arms.

18. The method of claim 10, wherein the multiple arms are telescoping arms.

* * * * *